United States Patent
Oshima

(10) Patent No.: US 6,777,155 B2
(45) Date of Patent: Aug. 17, 2004

(54) PHOTOSENSITIVE LITHOGRAPHIC PRINTING PLATE

(75) Inventor: Yasuhito Oshima, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 104 days.

(21) Appl. No.: 09/985,872

(22) Filed: Nov. 6, 2001

(65) Prior Publication Data

US 2002/0136987 A1 Sep. 26, 2002

Related U.S. Application Data

(63) Continuation-in-part of application No. 09/967,920, filed on Oct. 2, 2001.

(30) Foreign Application Priority Data

Oct. 3, 2000 (JP) ........................................ 2000-303899
Nov. 6, 2000 (JP) ........................................ 2000-337688

(51) Int. Cl.$^7$ .............................. G03F 7/021; G03F 7/30
(52) U.S. Cl. .................... 430/157; 430/176; 430/281.1; 430/288.1; 430/302; 430/906
(58) Field of Search ................. 430/157, 176, 430/281.1, 288.1, 302, 906, 270.1

(56) References Cited

U.S. PATENT DOCUMENTS

| | | | | |
|---|---|---|---|---|
| 4,877,711 A | * | 10/1989 | Aoai et al. | 430/176 |
| 4,940,646 A | * | 7/1990 | Pawlowski | 430/175 |
| 4,950,582 A | * | 8/1990 | Aoai et al. | 430/175 |
| 4,983,491 A | | 1/1991 | Aoai et al. | |
| 5,053,310 A | * | 10/1991 | Platzer | 430/162 |
| 5,219,699 A | * | 6/1993 | Walls et al. | 430/156 |
| 5,238,772 A | * | 8/1993 | Mueller-Hess et al. | 430/175 |
| 5,242,779 A | * | 9/1993 | Mueller-Hess et al. | 430/175 |
| 5,262,270 A | * | 11/1993 | Walls | 430/156 |
| 5,275,907 A | * | 1/1994 | Walls | 430/157 |
| 5,534,381 A | * | 7/1996 | Ali et al. | 430/156 |
| 5,695,905 A | * | 12/1997 | Savariar-Hauck et al. | 430/162 |
| 5,698,360 A | * | 12/1997 | Timpe et al. | 430/175 |
| 5,700,619 A | * | 12/1997 | Baumann et al. | 430/175 |
| 6,270,938 B1 | * | 8/2001 | Gandini et al. | 430/157 |

FOREIGN PATENT DOCUMENTS

| | | |
|---|---|---|
| EP | 0 150 293 A1 | 8/1985 |
| EP | 0 211 406 A2 | 2/1987 |
| EP | 0 867 769 A1 | 9/1998 |
| EP | 0949540 | 10/1999 |
| JP | 58 134629 A | 8/1983 |
| JP | 04-204453 | 7/1992 |
| JP | 06 122713 A | 5/1994 |

* cited by examiner

*Primary Examiner*—John S. Chu
(74) *Attorney, Agent, or Firm*—Burns, Doane, Swecker & Mathis, L.L.P.

(57) ABSTRACT

A photosensitive lithographic printing plate comprising: a support; and a photosensitive layer, wherein the photosensitive layer comprises: a polyurethane resin binder comprising an aliphatic cyclic structure which has a carboxyl group as a substituent directly or indirectly attached to the structure; or a polyvinyl alcohol resin binder modified with an acetal skeleton comprising an aliphatic cyclic structure.

23 Claims, No Drawings

PHOTOSENSITIVE LITHOGRAPHIC PRINTING PLATE

This is a Continuation-In-Part application which claims priority under 35 U.S.C. §120 to application Ser. No. 09/967,920 filed in the United States on Oct. 2, 2001; the entire content of which is hereby incorporated by reference.

FIELD OF THE INVENTION

The present invention relates to a photosensitive lithographic printing plate, and in particular to such that is suited for imaging with a laser light.

BACKGROUND OF THE INVENTION

Conventionally, as the photosensitive lithographic printing plate, there have been widely used so-called PS plates comprising a hydrophilic support and an oleophilic photosensitive resin layer provided on the support. Plate making with such a plate has usually been carried out by a masked (planar) exposure with use of a lith film, followed by elimination of non-image areas by dissolution.

In recent years, digital technologies with which image information is electronically processed, stored and outputted with a computer is prevailing. To come with such digital technologies, a variety of image outputting processes have been developed for practical use. As a result, the computer-to-plate (CTP) technology that modulates a highly directional light such as a laser beam in accordance with digitized image information for scanning exposure to directly prepare a printing plate without using a lith film is eagerly demanded. Hence, the development of a photosensitive lithographic printing plate adapted to the CTP technology is a significant technical target.

For such photosensitive lithographic printing plates suited for scanning exposure, a structure comprising a hydrophilic support and provided thereon an oleophilic photosensitive resin layer (which will be referred to as a photosensitive layer hereinafter) capable of generating an active species such as a radical or Bronsted acid by laser exposure has been proposed, and is already available in the market. A negative or positive type lithographic printing plate can be obtained by exposing such a photosensitive lithographic printing plate to a scanning laser light modulated by digital information to generate such active species, causing a physical or chemical change in the photosensitive layer to make the layer insoluble or soluble by the action of the species, and subjecting the plate to a subsequent development processing.

In particular, the negative type photosensitive lithographic printing plate comprising a hydrophilic support and provided thereon a photo-polymerizable photosensitive layer containing a photo polymerization initiator excelling in photographic speed, an ethylenically unsaturated compound capable of addition polymerization, a polymer binder soluble in an alkaline developer, and an oxygen-shielding protective layer which may be provided according to need is endowed with a potential of becoming a plate having desirable printing characteristics due to its various advantageous features including an excellent productivity, simple processing, and a high resolution as well as a superior ink-receptivity.

Conventionally, in order to make a printing plate durable for long run lengths, urethane resins have been used as the binder as described in Japanese Patent Publication Nos. 120040/1995, 120041/1995, 120042/1995and 12424/1996, Japanese Patent Laid-Open Nos. 287944/1988, 287947/1988 and 271741/1989, etc. However, these patent specifications include no description on the imaging with laser scanning exposure at all. On the other hand, Japanese Patent Application No. 116232/1999 describes a lithographic printing plate comprising a urethane binder suited for laser scanning exposure, but this type of lithographic printing plate is not satisfactory in printing durability and productivity. Specifically, when the scanning speed is raised for a higher productivity, the amount of exposure energy per unit area correspondingly reduces to cause the discrimination between the exposed and the unexposed areas to reduce whereby the image area tends to be attacked by the alkaline ingredient in the developer, leading to insufficient printing durability.

As a polymer binder constituting a photosensitive layer there has also been used an alkali-developable organic high molecular polymer such as methacrylic acid copolymer, acrylic acid copolymer, itaconic acid copolymer, crotonic acid copolymer, maleic acid copolymer and partially esterified maleic acid copolymer as described in Japanese Patent Laid-Open No. 1984-44615, Japanese Patent Publication No. 1979-34327, Japanese Patent Publication No. 1383-12577, Japanese Patent Publication No. 1979-25957, Japanese Patent Laid-Open No. 1979-92-723, Japanese Patent Laid-Open No. 1984-53836, Japanese Patent Laid-Open No. 1984-71048, etc.

However, the conventional negative-working photosensitive lithographic printing plate comprising a photosensitive layer containing such a polymer binder is disadvantageous in that when the scanning speed is raised for a higher productivity, the amount of exposure energy per unit area correspondingly reduces, making it impossible to effect sufficient hardening even at the exposed area and hence causing the image area to be attacked by the alkaline ingredient in the developer and leading to insufficient printing durability. Thus, further improvement of productivity is made difficult.

SUMMARY OF THE INVENTION

The object of the invention is to provide a photosensitive lithographic printing plate which overcomes the above-mentioned shortcomings in the conventional technologies, is capable of forming a highly durable printing plate, suited for scanning exposure with laser, capable of high speed image recording, and provided with a high productivity.

As a result of an extensive investigation, the present inventors have found that the object cited above can be achieved by using, as the polymer binder for the photosensitive layer, a urethane resin which has an aliphatic cyclic structure having a carboxylic group as a substituent directly or indirectly attached to said structure as the component imparting a developability to said urethane resin.

Accordingly, the invention provides, as a first preferred embodiment, a photosensitive lithographic printing plate comprising a support and a photosensitive layer provided thereon, said photosensitive layer comprising a polyurethane resin binder having an aliphatic cyclic structure which has a carboxyl group as a substituent directly or indirectly attached to said structure.

In the first preferred embodiment, a feature of the photosensitive lithographic printing plate of the invention is to use such a urethane resin as a polymer binder as comprising an alicyclic structure having a carboxyl group directly or indirectly attached thereto as a substituent imparting an alkali-developability to said urethane resin. By the use of such a binder, the photosensitive lithographic printing plate of the invention is imparted with a sufficient printing durability as well as a high productivity even with exposure conditions of low irradiation energy per unit area.

Although the mechanism with which the advantageous feature of the invention is developed is not clarified yet, it is assumed that the introduction of a highly water-repellent cyclic hydrocarbon structure near the carboxylic acid group prevents the penetration of the developer, thus giving rise to a high printing durability, in contrast to the conventionally known urethane binders whereby the developer penetrates into the image area obtained by an exposure of a relatively small irradiation energy. Due to such a mechanism, printing plates with both of a high productivity and a high printing durability can be obtained.

The inventors made extensive studies of accomplishment of the foregoing object. As a result, it was found that the foregoing object of the invention can be accomplished by using as the polymer binder constituting the photosensitive layer a modified polyvinyl alcohol resin containing an alicyclic structure. The present invention has thus been worked out.

The present invention provides, as a second preferred embodiment, a photosensitive lithographic printing plate comprising a photosensitive layer containing a polyvinyl alcohol resin binder modified with an acetal skeleton having an alicyclic structure.

In the second preferred embodiment, a feature of the photosensitive lithographic printing plate of the invention is to use as a polymer binder a polyvinyl alcohol resin modified with an acetal skeleton having an alicyclic structure. In this arrangement, the photosensitive lithographic printing plate of the invention is imparted with a sufficient printing durability as well as a high productivity even with exposure conditions of low irradiation energy per unit area.

Although the mechanism with which the advantageous feature of the invention is developed is not clarified yet, it is assumed that the use of a polyvinyl alcohol resin modified with an acetal skeleton having a highly hydrophobic alicyclic structure prevents the penetration of the developer, thus giving rise to a high printing durability, in contrast to the conventionally known polymer binder whereby the developer penetrates into the image area obtained by an exposure of a relatively small irradiation energy. Due to such a mechanism, printing plates with both of a high productivity and a high printing durability can be obtained.

DETAILED DESCRIPTION OF THE INVENTION

In the following, the photosensitive layer of the photosensitive lithographic printing plate will be described in detail.

[Polymer Binder in the First Preferred Embodiment of the Invention]

The polymer binder for use in the photosensitive layer of the photosensitive lithographic printing plate of the invention comprises a polyurethane resin binder containing an alicyclic structure having a carboxyl group directly or indirectly attached thereto.

Preferable polyurethane resins in the invention can be obtained by the reaction of a compound containing an alicyclic structure and two groups selected from carboxyl, hydroxyl and —NHR$^1$ groups (wherein R$^1$ represents a hydrogen atom or a substituted or unsubstituted monovalent hydrocarbon group of 1 to 20 carbon atoms) with a diisocyanate compound.

As the compound containing an alicyclic structure and two groups selected from carboxyl, hydroxyl and —NHR$^1$ group (wherein R$^1$ represents a hydrogen atom or a substituted or unsubstituted monovalent hydrocarbon group of 1 to 20 carbon atoms), those represented by formula (I) are preferred.

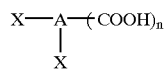

(I)

(In the formula, A represents an (n+2)-valent hydrocarbon group of 3 to 80 carbon atoms having a substituted or unsubstituted aliphatic cyclic structure; each of X's represents independently a hydroxyl group or —NHR$^1$ (R$^1$ represents a hydrogen atom or a substituted or unsubstituted monovalent hydrocarbon group of 1 to 20 carbon atoms.); and n represents an integer of from 1 to 5.

The (n+2)-valent hydrocarbon group of 3 to 80 carbon atoms having a substituted or unsubstituted alicyclic structure and represented by A in formula (I) includes the compound in which a (n+2)-valent hydrocarbon group is formed by eliminating (n+2) hydrogen atoms attached to arbitrary carbon atoms of a compound containing an alicyclic structure such as cyclopropane, cyclopentane, cyclohexane, cycloheptane, cyclooctane, cyclodecane, dicyclohexyl, tercyclohexyl, norbornane, decahydronaphthalene, perhydrofluorene, tricyclo[5.2.1.$^{2.6}$] decane, adamantane, quadracycline, congressane, cubane, spiro[4.4]octane, cyclopentene, cyclohexene, cycloheptene, cyclooctene, cyclodecene, cyclohexadiene, cycloheptadiene, cyclooctadiene, cycloheptatriene, cyclodecatriene, cyclooctatetraene, norbornylene, octahydronaphthalene, bicyclo[2.2.1]heptadiene, bicyclo [4.3.0]nonadiene, dicyclopentadiene, hexahydroanthracene or spiro[4.5]decadiene.

Any one or more carbon atoms of the compound having an alicyclic structure may be replaced with a hetero atom selected from nitrogen, oxygen or sulfur.

From the viewpoint of printing durability, group A is preferably a 5- to 8-membered monocyclic aliphatic hydrocarbon group, a condensed polycyclic aliphatic hydrocarbon group comprising up to 4 rings, a spiroaliphatic hydrocarbon group or an ensemble of aliphatic hydrocarbon rings.

As the substituent, monovalent non-metallic atom groups other than hydrogen are typical such as a halogen atom (—F, —Br, —Cl or —I), an alkoxy group, an aryloxy group, an alkylthio group, an arylthio group, an alkyldithio group, an aryldithio group, an N,N-dialkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N', N'-dialkylureido group, an N'-arylureido group, an N'-diarylureido group, an N'-alkyl-N'-arylureido group, an N-alkylureido group, an N-arylureido group, an N'-alkyl-N-alkylureido group, an N'-alkyl-N-arylureido group, an N', N'-diallcyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N- aryloxycarbonylamino group, an N-aryl-N-alkoxycarbonylamino group, an N-aryl-N-aryloxycarbonylamino group, a formyl group, an acyl group, a carboxyl group and the conjugate base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo (—$SO_3H$) group and the conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and the conjugate base group thereof, an N-alkylsulfonylsulfamoyl group [—$SO_2NHSO_2$(alkyl)] and the conjugate base group thereof, an N-arylsulfonylsulfamoyl group [—$SO_2NHSO_2$(aryl)] and the conjugate base group thereof, an N-alkylsulfonylcarbamoyl group [—$CONHSO_2$(alkyl)] and the conjugate base group thereof, an N-arylsulfonylcarbamoyl group [—$CONHSO_2$(aryl)] and the conjugate base group thereof, an alkoxysilyl group [—Si(O-alkyl)$_3$], an aryloxysilyl group [—Si(O-aryl)$_3$], a hydroxysilyl group [—Si(OH)$_3$] and the conjugate base group thereof, a phosphono group (—$PO_3H_2$) and the conjugate base group thereof, a dialkylphosphono group [—$PO_3$(alkyl)$_2$], a diarylphosphono group [—$PO_3$(aryl)$_2$], an alkylarylphosphono group [—$PO_3$(alkyl)(aryl)], a monoalkylphosphono group [—$PO_3H$(alkyl)] and the conjugate base group thereof, a monoarylphosphono group [—$PO_3H$(aryl)] and the conjugate base group thereof, a phosphonoxy group (—$OPO_3H_2$) and the conjugate base group thereof, a dialkylphosphonoxy group [—$OPO_3$(alkyl)$_2$], a diarylphosphonoxy group [—$OPO_3$(aryl)$_2$], an alkylarylphosphonoxy group [—$OPO_3$(alkyl)(aryl)], a monoalkylphosphonoxy group [—$OPO_3H$(alkyl)] and the conjugate base group thereof, a monoarylphosphonoxy group [—$OPO_3H$(aryl)] and the conjugate base group thereof, a cyano group, a nitro group, a dialkylboryl group [—B(alkyl)$_2$], a diarylboryl group [—B(aryl)$_2$], an alkylarylboryl group [—B(alkyl)(aryl)], a dihydroxyboryl group [—B(OH)$_2$] and the conjugate base group thereof, an alkylhydroxyboryl group [—B(alkyl)(OH)] and the conjugate base group thereof, an arylhydroxyboryl group [—B(aryl)(OH)] and the conjugate base group thereof, an alkyl group, an aryl group, an alkenyl group and an alkynyl group.

Preferable substituents include a halogen atom, an alkyl group, an alkoxy group, an aryloxy group, an aryl group, an alkenyl group and an alkynyl group.

In formula (I), X represents a hydroxyl group or an —$NHR^1$ group wherein $R^1$ represents a substituted or unsubstituted monovalent hydrocarbon group of 1 to 20 carbon atoms.

As the hydrocarbon group of 1 to 20 carbon atoms, an alkyl group, an aryl group, an alkenyl group and an alkynyl group are included.

The substitutent which $R^1$ may have includes those enumerated as the one which A may have.

Due to the ease of synthesis, each of X's is preferably a hydroxyl group or an amino group independently of each other. And more preferably at least one of X's is a hydroxyl group, which is still more preferably a primary hydroxyl group.

Symbol n represents an integer of 1 to 5. From the viewpoint of printing durability, n is preferably 1 to 3, more preferably equal to 1.

In the following, specific examples of preferable compounds represented by formula (I) will be listed, however, the invention is not restricted to those at all.

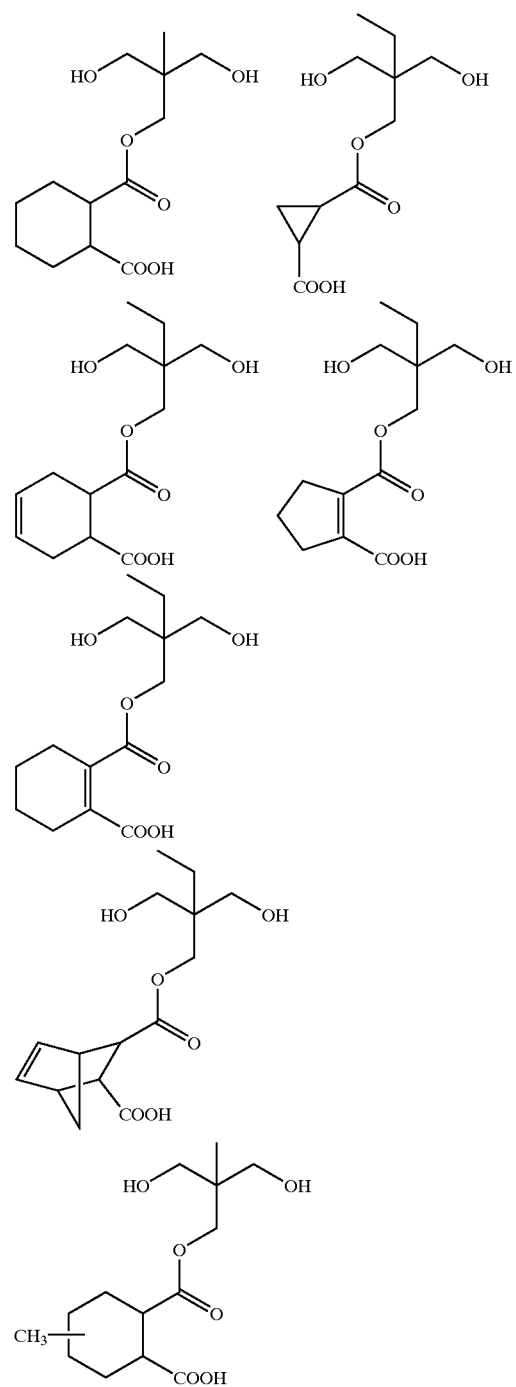

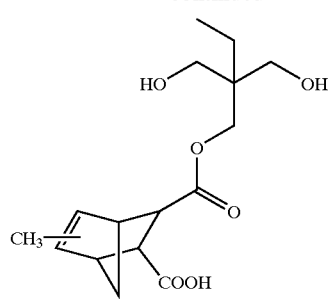
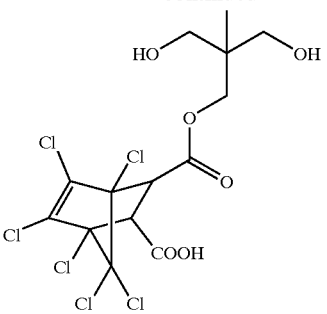
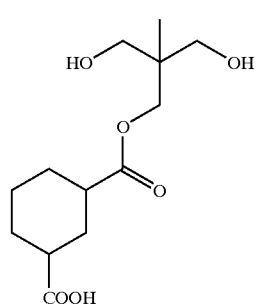
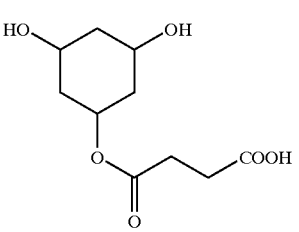
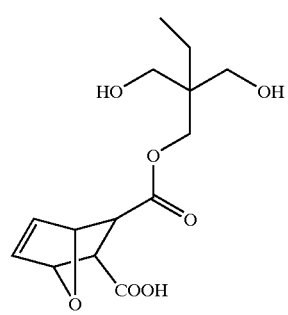
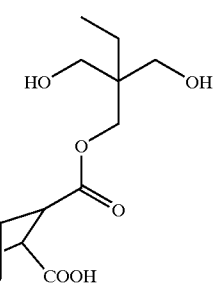
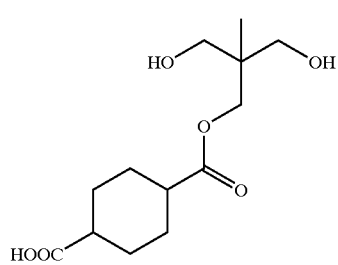
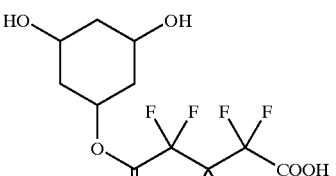
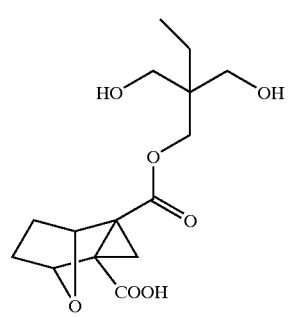
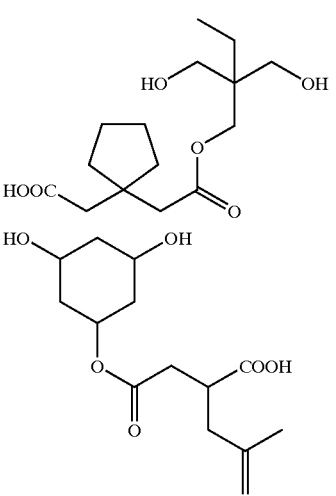

-continued
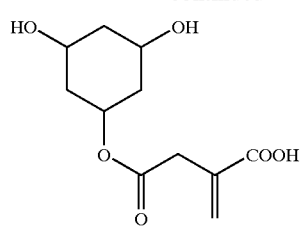
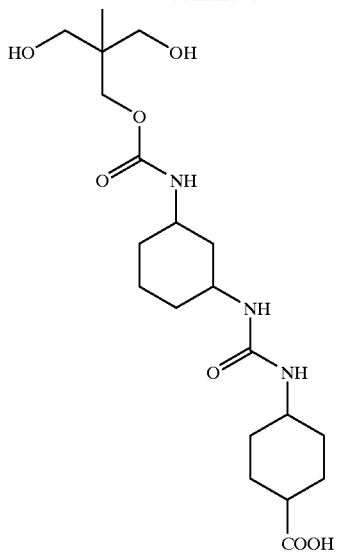
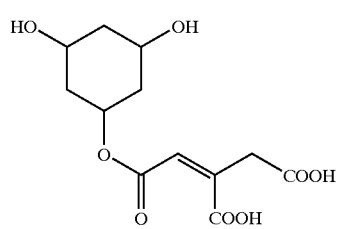
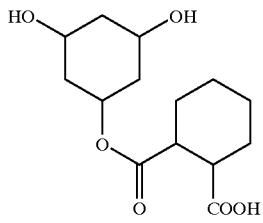
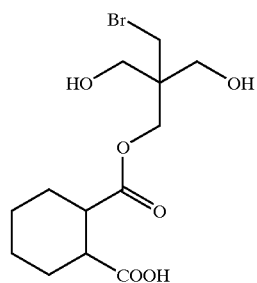
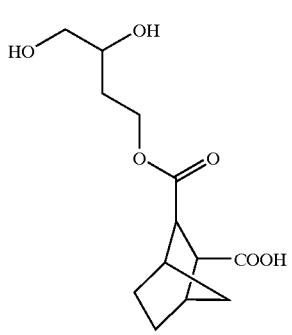
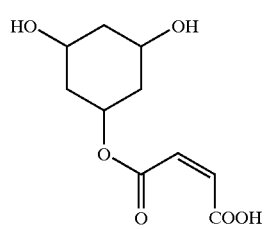
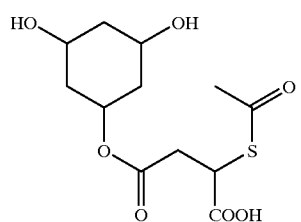

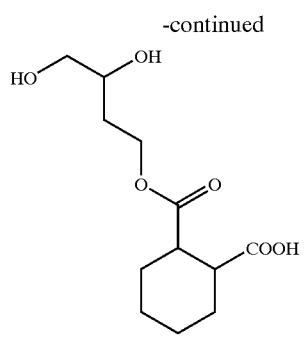
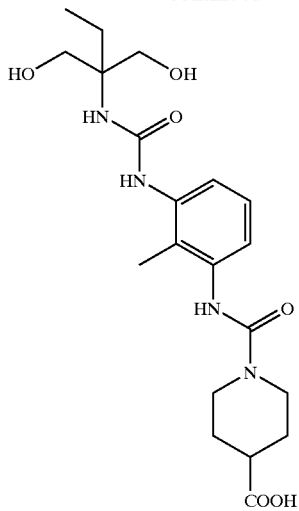
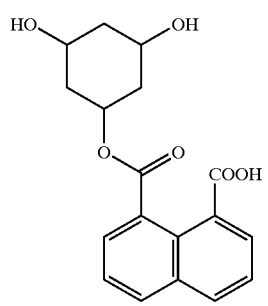
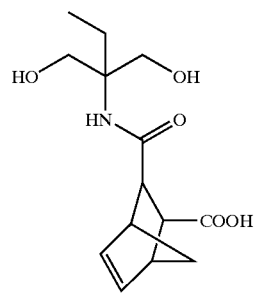
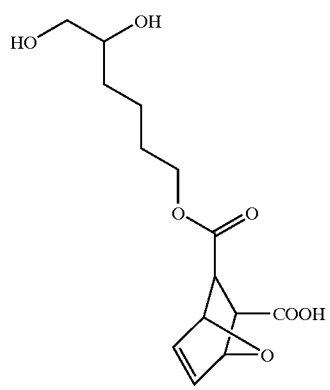
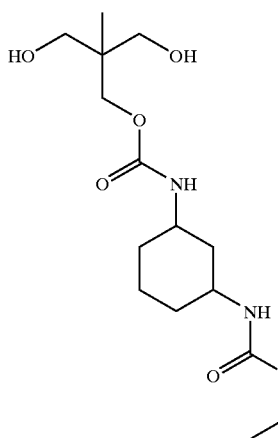
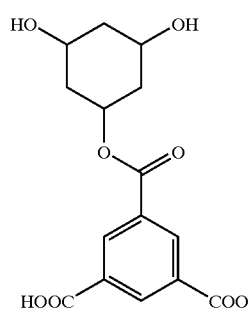
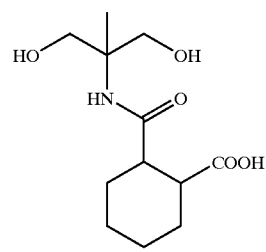
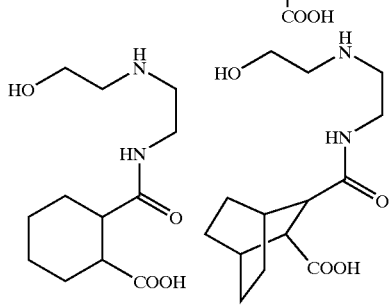

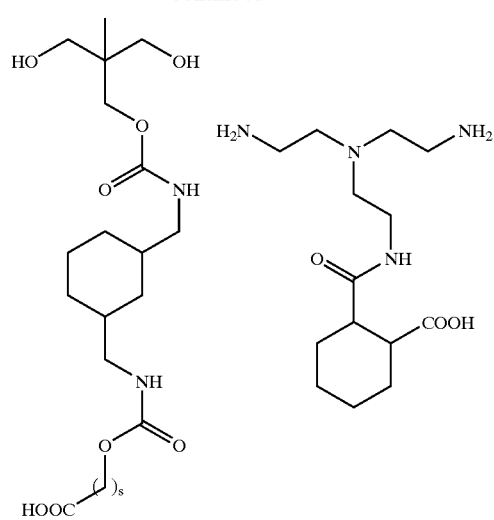
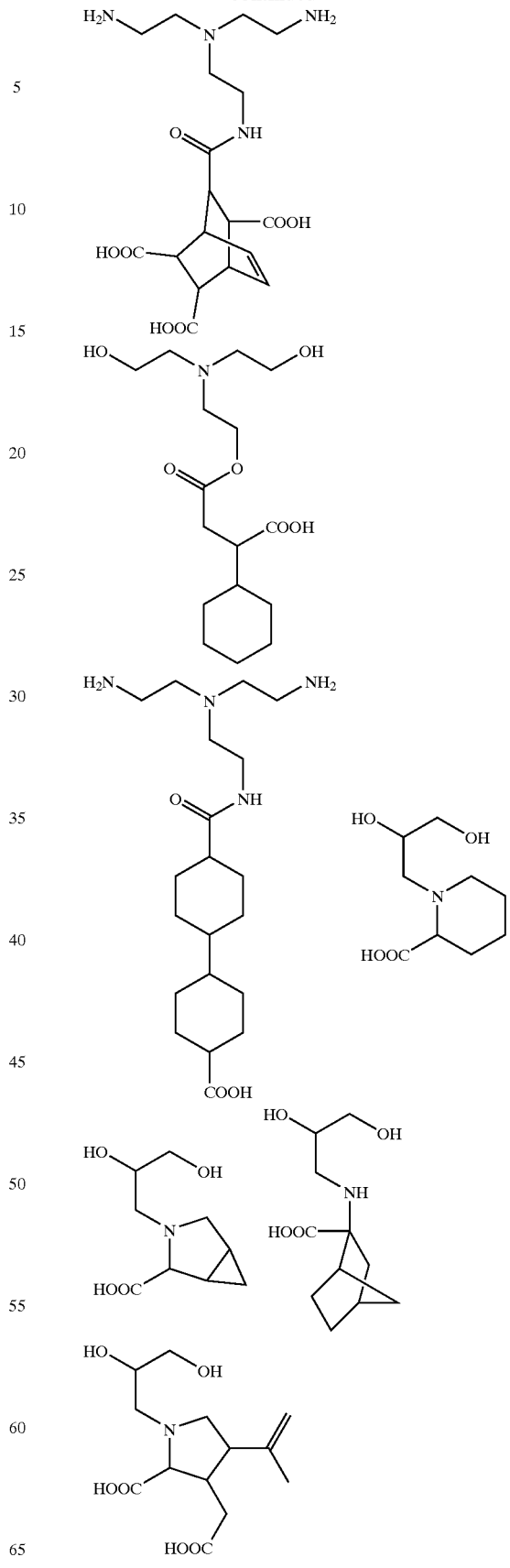

One or more types of the structures derived from the compounds represented by formula (I) may be contained in the urethane resin binder.

Though the urethane resin polymer for the invention can be synthesized only from a diisocyanate compound and a compound represented by formula (I), it can be usually synthesized with use of one or more still other diol compounds.

Although appropriately determined depending on the structure, the design of the photosensitive layer, and other factors, the total content of the repeating unit represented by formula (I) in the urethane resin polymer obtained from such combinations of compounds preferably lies in the range of from 1 to 50 mol %, more preferably from 10 to 50 mol %, and still more preferably from 20 to 50 mol % based on the total molar quantity of the polymer used.

From the viewpoint of developability and printing durability, the urethane resin binder for the invention preferably has a desirable molecular weight and acid value. Though the molecular weight and the acid value are adjusted in consideration of pH of a developer, composition of a developer, performance necessary for a printing plate, and the like, the molecular weight of the urethane resin binder is, as GPC value in terms of polystyrene, from 5,000 to 500,000, preferably from 10,000 to 300,000, more preferably from 20,000 to 150,000. In the case of the molecular weight being less than 5,000, printing durability gets worse. In the case of the molecular weight being no less than 500,000, developability gets worse and stain is generated. The acid value of the urethane resin binder is from 0.1 to 10.0 meq/g, preferably from 0.3 to 6.0 meq/g, more preferably from 0.6 to 3.0 meq/g. In the case of the acid value being less than 0.1 meq/g, stain is generated because of bad developability. In the case of the acid value being no less than 6.0 meq/g, printing durability gets worse.

Any diisocyanate compound and diol compound known in the art which are jointly used with a compound represented by formula (I) can be employed without any special restriction. Specifically, those given in *Kobunshi Deta Handobukku—Kiso Hen* (Polymer Data Handbook—Fundamentals) edited by The Society of Polymer Science, Japan, published by Saifukan Co., Ltd. in 1986. Such a diisocyanate compound as well as a diol compound that is used in conjunction with a compound represented by formula (I) may be used individually or in combination of two or more of them.

Specific examples of the diisocyanate compound include aromatic diisocyanates such as 2,4-tolylenediisocyanate, the dimer of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, and 3,3'-dimethylbiphenyl-4,4'-diisocyanate; aliphatic diisocyanates such as hexamethylenediisocyanate, trimethylhexamethylenediisocyaiiate, lysine diisocyanate, and dimerized acid diisocyanates; alicyclic diisocyanates such as isophoronediisocyanate, 4,4'-methylenebis(cyclohexylisocyanate), methylcyclohexane-2,4-(or 2,6-)diisocyanates, and 1,3 cyclohexane; the reaction products of a diol and a diisocyanate such as the addition product of 1 mol of 1,3-butylene glycol with 2 mols of tolylenedIisocyanate.

Specific examples of the diol compound include ethylene glycol, diethylene glycol, triethylene glycol, tetraethylene glycol, propylene glycol, dipropylene glycol, poly(ethylene glycol), poly(propylene glycol), neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adducts of bisphenol A, propylene oxide adducts of bisphenol A, ethylene oxide adducts of bisphenol F, propylene oxide adducts of bisphenol F, ethylene oxide adducts of hydrogenated bisphenol A, propylene oxide adducts of hydrogenated bisphenol A, hydroquinone dihydroxyethyl ether, p-xylylene glycol, dihydroxyethylsulfone, bis(2-hydroxyethyl)-2,4-tolylene dicarbamate, 2,4-tolylene-bis(2-hydroxyethyl carbamide), bis(2-hydroxyethyl)-m-xylylene dicarbamate, bis(2-hydroxyethyl) isophthalate, 1,3-propanediol, 1,4-butanediol, 1,5-pentanediol, 1,6-hexanediol, 1,7-heptanediol, 1,8-octanediol, 2-butene-1,4-diol, cis-2-butene-1,4-diol, trans-2-butene-1,4-diol, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcine, 4-benzylresorcin, 4-acetylresorcin, 4-carbomethoxyresorcin, 2-methylresorcin, 5-methylresorcin, t-butylhydroquinone, 2,5-di-t-butylhydroquinone, 2,5-di-t-amylhydroquinone, tetramethylhydroquinone, tetrachlorohydroquinone, methylcarbaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl) hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxy benzoate, 2-hydroxyethyl-4-hydroxyphenyl acetate, resorcin mono-2-hydroxyethyl ether, and various polyether diol compounds such as pentaethylene glycol, hexaethylene glycol, heptaethylene glycol, octaethylene glycol, di-1,2-propylene glycol,-tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3butylene glycol, poly(ethyleneglycol)s with average molecular weights of 1,000, 1,500, 2,000, 3,000, and 7,500, poly(propylene glycol)s with average molecular weights of 400, 700, 1,000, 2,000, 3,000 and 4,000, PTMG650, PTMG1000, PTMG20000, PTMG300O, Newpole PE-61, Newpole PE-62, Newpole PE-64, Newpole PE-68, Newpole PE-71, Newpole PE-74, Newpole FE-75, Newpole PE-78, Newpole PE-108, Newpole PE-128, Newpole BPE-20, Newpole BPE-20F, Newpole BPE-20NK, Newpole BPE-20T, Newpole BPE-20G, Newpole BPE-40, Newpole BPE-60, Newpole BPE-100, Newpole BPE-180, Newpole BP-2P, Newpole BPE-23P, Newpole BPE-3P, Newpole BPE-5P, Newpole 50HB-100, Newpole 50HB-260, Newpole 50HB-400, Newpole 50HB-660, Newpole 50HB-2000 and Newpole 50HB-5100 (PMTG and Newpole are products of Sanyo Chemical Industries, Ltd.), and polyester diol compounds and polycarbonate diol compounds.

Also, diol compounds having a carboxyl group can be jointly used such as 3,5-dihydroxybenzoic acid, 2,2-bis(hydroxymethyl)propionic acid, 2,2-bis(2-hydroxyethyl) propionic acid, 2,2-bis(3-hydroxypropyl)propionic acid, bis (hydroxymethyl)acetic acid, bis(4-hydroxyphenyl)acetic acid, 2,2-bis(hydroxymethyl)lactic acid, 4,4-bis(4-hydroxyphenyl)pentanoic acid, tartaric acid, N,N-dihydroxyethylglycine, and N,N-bis(2-hydroxyethyl)-3-carboxypropionamide Further, the following compounds can be used. Aliphatic diamine compounds such as ethylenediamine, propylenedianilne, tetramethylenediamine, pentamethylenediamine, hexamethylenediamine, heptamethylenediamine, octaniethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2-6,6-tetramethylpiperazine, N,N-dimethylethylenediamine, lysine, L-cystine, and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediaxnine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether, and 1,8-naphthalenediamine; heterocyclic amine compounds such as 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-s-triazine, 2,6-diaminopyridine, L-histidine, DL-triptophan, and adenine; aminoalcohols or aminophenols such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglicine, 2-aminobenzyl alcohol, 4-aminophenethyl alcohol, 2-carboxy-5-amino-1-naphthol, and L-tyrosine.

To cap the unreacted terminal isocyanate group with an alcohol having a radical polymerizable group in the polymer synthesis for the purpose of reaction termination is preferred since a urethane polymer which exhibits an improved printing durability can be prepared. Alcohols having a radical polymerizable group include 2-hydroxyethyl (meth)acrylate, 2-hydroxypropyl (meth)acrylate, 2-hydroxy-3-chloropropyl (meth)acrylate, 2-hydroxy-3-allyloxypropyl (meth)acrylate, 2-hydroxy-3-phenoxypropyl (meth)acrylate, 4-hydroxybutyl (meth)acrylate, glycerol diacrylate, glycerol acrylate methacrylate, glycerol dimethacrylate, pentaerythritol triacrylate, and tris(acryloyloxyethyl) isocyanurate.

The urethane binder in the invention may be used individually, or in combination of two or more thereof. Further, one or more of conventionally known polymer binders may be added to prepare blends. When such a blend is used, the conventional polymer binder is added in 1 to 60% by weight, preferably 1 to 40% by weight, more preferably 1 to 20% by weight of the total amount of binder. As the conventionally known polymer binder, any material known in the art maybe used without special restriction, preferably including binders having an acrylate main chain, urethane binders, and acetal-modified poly(vinyl alcohol)s (e.g., butyral resins).

[Polymer Binder in the Second Preferred Embodiment of the Invention]

The polymer binder to be used in the photosensitive layer of the photosensitive lithographic printing plate of the invention is a polyvinyl alcohol resin modified with an acetal skeleton having an alicyclic structure.

The foregoing polyvinyl alcohol resin binder of the invention is not specifically limited so far as it is modified with an acetal skeleton having an alicyclic structure. In practice, however, one having a constituent unit represented by the following formula (II) may be used.

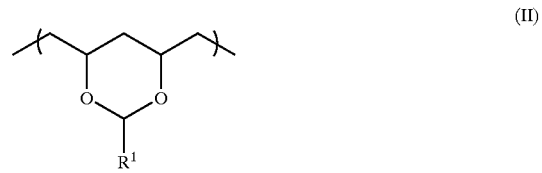

wherein $R^1$ represents a $C_3$–$C_{30}$ monovalent hydrocarbon group having an alicyclic structure which may have substituents.

Examples of the $C_3$–$C_{30}$ monovalent hydrocarbon group having an alicyclic structure which may have substituents as $R^1$ in the formula (II) include the compound in which a monovalent hydrocarbon group is formed by eliminating one hydrogen atom attached to arbitrary carbon atoms of a compound containing an alicyclic structure such as cyclopropane, cyclopentane, cyclohexane, cyclooctane, cyclodecane, dicyclohexyl, tercyclohexyl, norbornane, decahydronaphthalene, perhydrofluorene, tricyclo[5.2.1.0$^{2.6}$]decane, adamantane, quadracycline, congressane, cubane, spiro[4.4]octane, cyclopentene, cyclohexene, cycloheptene, cyclooctene, cyclodecene, cyclohexadiene, cycloheptene, cycloheptadiene, cyclooctadiene, cycloheptatriene, cyclodecatriene, cyclooctatetraene, norbornylene, octahydronaphthalene, bicyclo[2.2.1]heptadiene, bicyclo[4.3.0]nonadiene, dicylopentadiene, hexahydroanthracene and spiro[4.5]decadiene which may be substituted by one or more arbitrary substituents.

Any one or more carbon atoms of the compound having an alicyclic structure may be replaced with a hetero atom selected from nitrogen, oxygen and sulfur.

From the viewpoint of printing durability, the group $R^1$ is preferably a monovalent hydrocarbon group having a 5- to 8-membered monocyclic aliphatic hydrocarbon group, a condensed polycyclic aliphatic hydrocarbon group or an ensemble of aliphatic hydrocarbon rings.

As the substituent on $R^1$, monovalent non-metallic atom groups other than hydrogen are typical such as a halogen atom (—F, —Br, —Cl or —I), a hydroxyl group, an alkoxyl group, an aryloxy group, a mercapto group, an alkylthio group, an arylthio group, an alkyldithio group, an aryldithio group, an amino group, an N-alkylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacrylamino group, an N-arylacylamino group, an ureido group, an N'-alkylureido group, an N',N'-dialkylureido group, an N'-arylureido group, N',N'-diarylureido group, N'-alkyl-N'-arylureido group, an N-alkylureido group, an N-arylureido group, an N'-alkyl-N-alkylureido group, an N'-alkyl-N-arylureido group, an N', N'-dialkyl-N-alkylureido group, N',N'-dialkyl-N-arylureido group, an N'-aryl-N-alkylureido group, an N'-aryl-N-arylureido group, an N',N'-diaryl-N-alkylureido group, an N',N '-diaryl-N-arylureido group, an N'-alkyl-N'-aryl-N-alkylureido group, an N'-alkyl-N'-aryl-N-arylureido group, an alkoxycarbonylamino group, aryloxycarbonylamino group, an N-alkyl-N-alkoxycarbonylamino group, an N-alkyl-N-aryloxycabonylamino group, an N-aryl-N-alkoxycarbonylamino group, an N-aryl-N-aryloxycarbonylamino group, a formyl group, an acyl group, a carboxyl group and the conjugate base group thereof, an alkoxycarbonyl group, an aryloxycarbonyl group, a carbonyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and the conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfmamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and the conjugate base group thereof, an N-alkylsulfonylsulfamoyl group [—SO$_2$NHSO$_2$(alkyl)] and the conjugate base group thereof, an N-arylsulfonylsulfamoyl group [—SO$_2$NHSO$_2$(aryl)] and the conjugate base group thereof, an N-alkylsulfonylcarbamoyl group [—CONHSO$_2$(alkyl)] and the conjugate base group thereof, an N-arylsulfonylcarbamoyl group [—CONHSO$_2$(aryl)] and the conjugate base group thereof, an alkoxysilyl group [—Si(O-alkyl)$_3$], an aryloxysilyl group [—Si(O-aryl)$_3$], a hydroxysilyl group [—Si(OH)$_3$] and the conjugate base group thereof, a phosphono group (—PO$_3$H$_2$) and the conjugate base group thereof, a dialkylphosphono group [—PO$_3$(alkyl)$_2$], a diarylphosphono group [—PO$_3$(aryl)$_2$], an alkylarylphosphono group [—PO$_3$(alkyl)(aryl)], a monoalkylphosphono group [—PO$_3$H(alkyl)] and the conjugate base group thereof, a monoarylphosphono group [—PO$_3$H(aryl)] and the conjugate base group thereof, a phosphonoxy group (—OPO$_3$H$_2$) and the conjugate base group thereof, a dialkylphosphonoxy group [—OPO$_3$(alkyl)$_2$], a diarylphosphonoxy group [—OP$_3$(aryl)$_2$], an alkylarylphosphonoxy group [—OPO$_3$H(alkyl)(aryl)], a monoalkylphosphonoxy group [—OPO$_3$H(alkyl)] and the conjugate base group thereof, a monoarylphosphonoxy group [—OPO$_3$H(aryl)] and the conjugate base group thereof, a cyano group, a intro group, a dialkylboryl group [—B(alkyl)$_2$], a diarylboryl group [—B(aryl)$_2$], an alkylarylboryl group [—B(alkyl)(aryl)], a dihydroxyboryl group [—B(OH)] and the conjugate base group thereof, an alkylhydroxyboryl group [—B(alkyl)(OH)] and the conjugate base group thereof, an arylhydroxyboryl group [—B(aryl)(OH)] and the conjugate base group thereof, an alkyl group, an aryl group, and alkenyl group and an alkynyl group.

Preferable substituents include a halogen atom, an alkyl group, an alkoxy group, an aryloxy group, an aryl group, an alkenyl group, and an alkynyl group. If possible, these substituents may be bonded to each other to form a ring. These substituents may be further substituted.

The modified polyvinyl alcohol resin binder having a constituent component represented by the formula (II) may have two or more R$^1$'s. However, one R$^1$ is preferably used from the standpoint of ease of synthesis.

Specific examples of the structure represented by the formula (II) will be given below.

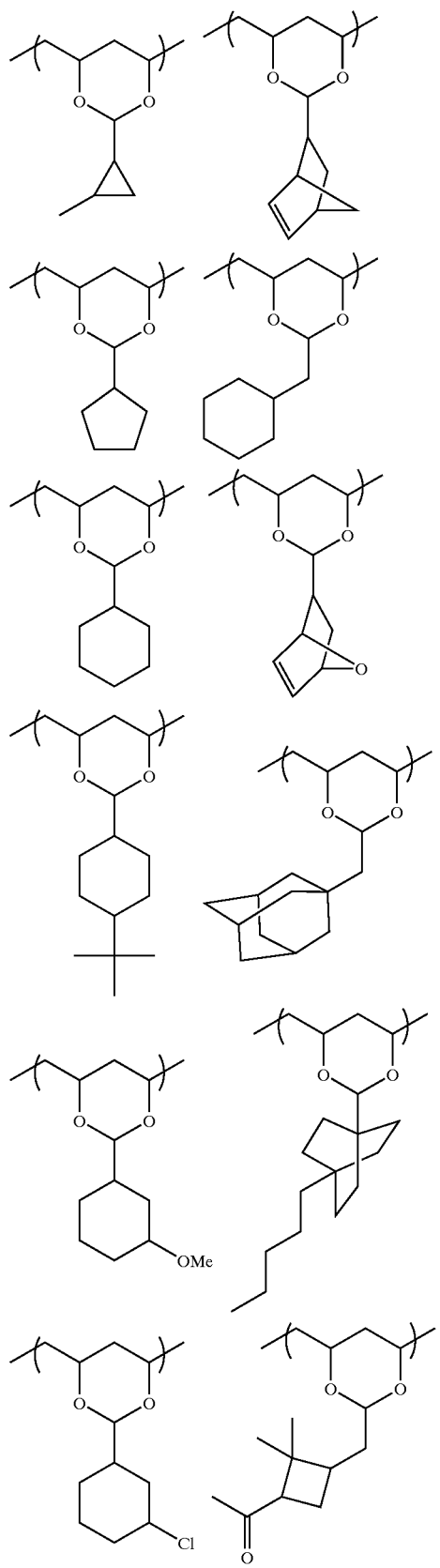

The polyvinyl alcohol resin binder modified with an acetal skeleton having an alicyclic structure of the invention preferably has an acid group to render itself alkali-developable. The content of the acid group can be arbitrarily predetermined depending on the design of the photosensitive layer or the formulation of the developer. It is preferably from 0.5 to 4.0 meq/g, more preferably from 1.0 to 3.0 meq/g as calculated in terms of acid value determined by the titration with NaOH.

The polyvinyl alcohol resin binder having an acid group modified with an acetal skeleton having an alicyclic structure of the invention is not specifically limited. In practice, however, one having a constituent unit represented by the following formula (III) may he used.

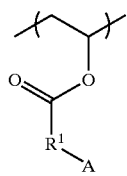
(III)

wherein $R^3$ represents a $C_1$–$C_{30}$ divalent hydrocarbon group which may have substituents; and A represents an acid group.

Examples of the $C_1$–$C_{30}$ divalent hydrocarbon group which may have substituents as $R^3$ include alkylene group, arylene group, alkenylene group, and alkynylene group. Specific examples of these groups include divalent hydrocarbon group obtained by eliminating one hydrogen atom attached to arbitrary carbon atoms of the monovalent hydrocarbon group listed as specific example of $R^1$ in the formula (II).

Examples of the substituents on $R^3$ include those on $R^1$ in the formula (II).

From the stand point of view, $R^3$ preferably has an alicyclic structure in its structure.

The acid group represented by A is not specifically limited. In practice, however, an acid group having an acid dissociation constant (pKa) of not greater than 7 is preferred. More preferably, —COOH, —$SO_3H$, —$OSO_3H$, —$PO_3H_2$, —$OPO_3H_2$, —$CONHSO_2$—, and —$SO_2NHSO_2$— are used. In particular, a structure having —COOH represented by the following formula (IV) is preferred.

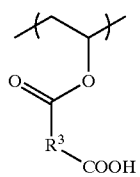
(IV)

wherein $R^3$ is as defined in the formula (III)

The modified polyvinyl alcohol resin binder having a constituent component represented by the formula (III) or (IV) may have two or more constituent components containing different $R^3$'s. However, one $R^3$ is preferably contained from the standpoint of ease of synthesis.

Specific examples of the structure represented by the formula (IV) will be given below.

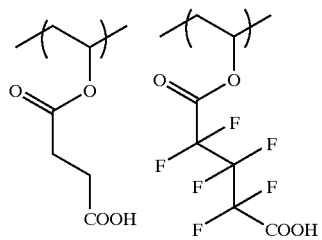

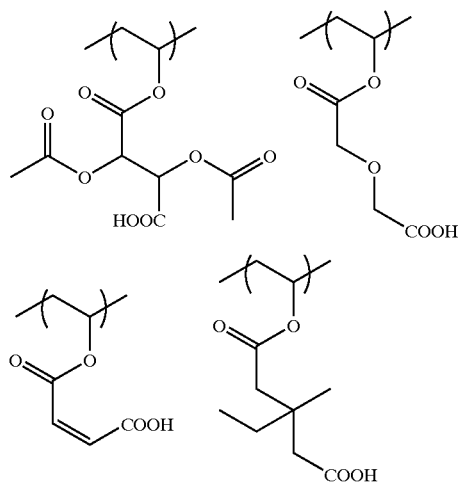

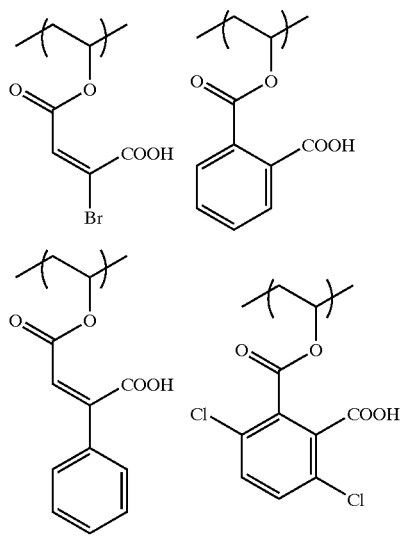

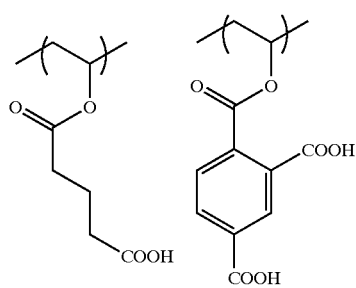

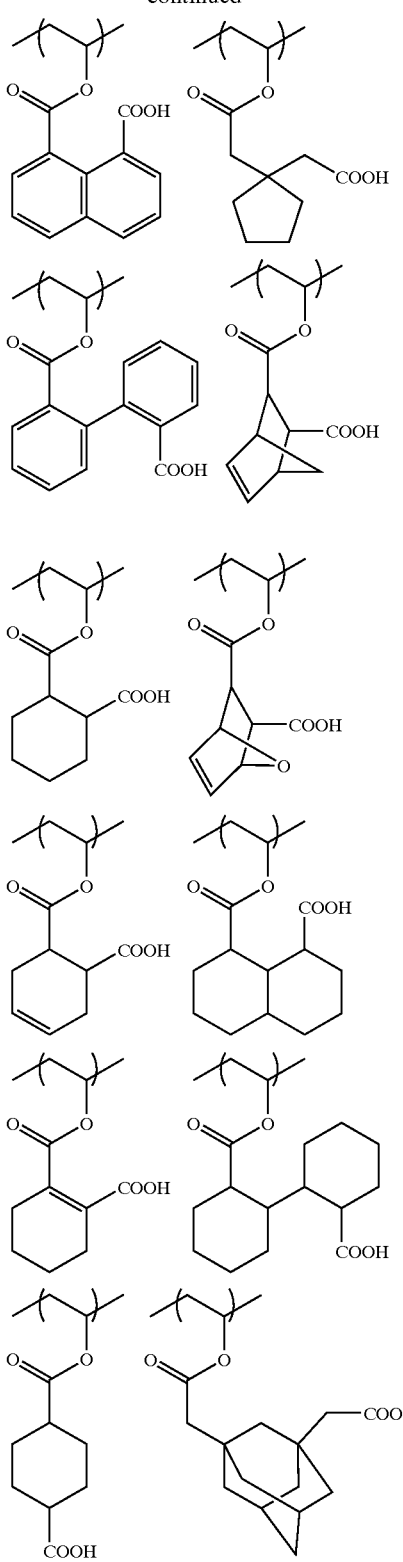

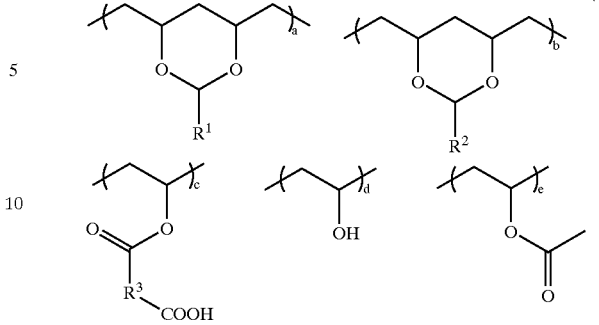

An even more desirable example of the polyvinyl alcohol resin binder modified with an acetal skeleton having an alicyclic structure of the invention is one represented by the following formula (V).

wherein $R^1$ and $R^3$ are as defined in the formulae (II) to (IV); $R^2$ represents a $C_1$–$C_{30}$ monovalent hydrocarbon group which may have substituents; and the suffixes a, b, c, d and e represent an integer of from 1 to 99, from 0 to 70, from 1 to 99, from 0 to 98 and from 0 to 30, respectively, with the proviso that the sum of a, b, c, d and e is 100.

Examples of the $C_1$–$C_{30}$ monovalent hydrocarbon group which may have substituents represented by $R^2$ include alkyl group, aryl group, alkenyl group and alkynyl group which may have substituents. However, $R^2$ doesn't contain an alicyclic structure.

Specific examples of the alkyl group include $C_1$–$C_{10}$ straight-chain or branched alkyl group such as methyl, ethyl, propyl, butyl, pentyl, hexyl, heptyl, octyl, nonyl, decyl, isopropyl, isobutyl, sec-butyl, tert-butyl, isopentyl, neopentyl, 1-methylbutyl and isohexyl.

Specific examples of the aryl group represented by $R^2$ include $C_1$–$C_{10}$ aryl group such as phenyl, naphthyl and indenyl, and $C_1$–$C_{10}$ heteroaryl group having one hetero atom selected from the group consisting of nitrogen atom, oxygen atom and sulfur atom such as furyl, thienyl, pyrrolyl, pyridyl and qumolyl.

Specific examples of the alkenyl group include $C_1$–$C_{10}$ straight-chain or branched alkenyl group such as vinyl, 1-propenyl, 1-butenyl and 1-methyl-1-propenyl.

Specific examples of the alkynyl group include $C_1$–$C_{10}$ alkynyl group such as ethynyl, 1-propynyl, 1-butyryl and 1-octinyl.

Examples of the substituents on $R^2$ include those described with reference to $R^1$ in the formula (II).

The modified polyvinyl alcohol resin binder represented by the formula (V) may have two or more structures having different $R^2$'s. In this case, the suffix b represents the total of b of the various structures. One $R^2$ is preferably contained from the standpoint of ease of synthesis.

The modified polyvinyl alcohol resin binder represented by the formula (V) may have two or more different $R^1$'s. In this case, the suffix a represents the total of a of the various structures. One $R^1$ is preferably contained from the standpoint of ease of synthesis.

The suffixes a, b, c, d and e represent an integer of from 1 to 99, from 0 to 70, from 1 to 99, from 0 to 98 and from 0 to 30, respectively, with the proviso that the sum of a, b, c, d and e is 100. The polymer composition ratio represented by a, b, c, d and e may be arbitrarily predetermined by the design of the photosensitive layer or the structure of $R^1$, $R^2$ and $R^3$. From the standpoint of printing durability, the suffix a is preferably from 20 to 90, more preferably from 30 to 80. Similarly, from the standpoint of printing durability, the suffix b is preferably from 0 to 50, more preferably from 0 to 30. From the standpoint of developability, the suffix c is preferably from 5 to 60, more preferably from 10 to 50.

From the standpoint of printing durability, the suffix d is preferably from 0 to 40, more preferably from 0 to 20. Further, the value of e, which determines the saponification degree of the polyvinyl alcohol as starting material, is preferably from 0 to 20, more preferably from 0 to 10 from the standpoint of ease in imparting functions to the binder.

Specific examples of the structure containing $R^1$, $R^2$ and $R^3$ in the formula (IV) will be given below, but the present invention should not be construed as being limited thereto.

Specific examples of the structure containing $R^1$ include those described with reference to the structure represented by the formula (II).

Specific examples of the structure containing $R^3$ include those described with reference to the structure represented by the formula (IV).

Specific examples of the structure containing $R^2$ include the following compounds.

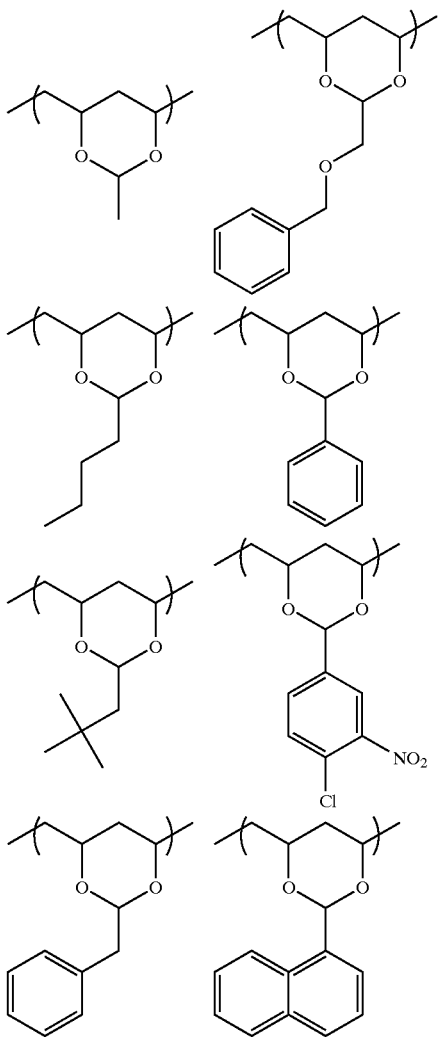

The process for the synthesis of the modified polyvinyl alcohol resin binder represented by the formula (V) is not specifically limited. In practice, however, $R^1$ and $R^2$ can be introduced by allowing $R^1$—CHO, $R^2$—CHO and a polyvinyl alcohol to undergo polymerization reaction in the presence of an acid catalyst. $R^3$ can be introduced by allowing an anhydride represented by the formula (VI) and a polyvinyl alcohol to undergo polymerization reaction.

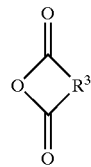

(VI)

wherein $R^3$ is as defined in the formulae (III) to (V).

Specific examples of such an acid anhydride include succinic anhydride, methylsuccinic anhydride, isobutynylsuccinic anhydride, 2-octene-1-ilsuccinic anhydride, S-acetylmercaptosuccinic anhydride, phenylsuccinic anhydride, itaconic anhydride, diacetyltartaric anhydride, maleic anhydride, citraconic anhydride, bromomaleic anhydride, dichloromaleic anhydride, phenylmaleic anhydride, aconitic anhydride, glutaric anhydride, 3-ethyl-3-methylglutaric anhydride, 3,3-tetramethyleneglutaric anhydride, hexafluoroglutaric anhydride, 2-phenylglutaric anhydride, 3,5-diacetyltetrahydropyran-2,4,6-trione, diglycolic anhydride, 3-oxabicyclo[3.1.0]hexane-2,4-dione, cyclohexanedicarboxylic anhydride, hexahydro-4-methylphthalic anhydride, 1,2,3,6-tetrahydrophthalic anhydride, 3,4,5,6-tetrahydrophthalic anhydride, 5-norbornene-2,3-dicarboxylic anhydride, bicyclo[2.2.2]octo-5-ene-2,3-dicarboxylic anhydride, cantharidin, 3,6-epoxy-1,2,3,6-tetrahydrophthalic anhydride, 1-cyclopentene-1,2-dicarboxylic anhydride, 1,4,5,6,7,7-hexachloro-5-norbornene-2,3-dicarboxylic anhydride, phthalic anhydride, isatoic anhydride, homophthalic anhydride, 4-methylphthalic anhydride, 3,6-difluorophthalic anhydride, 3-hydroxyphthalic anhydride, 1,2,4-benzenetricarboxylic anhydride, 3-nitrophthalic anhydride, diphenic anhydride, 1,8-naphthalic anhydride, 4-aminonaphthalic anhydride, and dipotassium 4-amino-3,6-disulfo-1,8-naphthalic anhydride.

The molecular weight of the polyvinyl alcohol resin binder modified with an acetal skeleton having an alicyclic structure of the invention is properly predetermined from the standpoint of image forming properties and printing durability. In general, the modified polyvinyl alcohol resin binder having a raised molecular weight exhibits an improved printing durability but deteriorated image forming properties. On the contrary, the modified polyvinyl alcohol resin binder having a decreased molecular weight exhibits improved image forming properties but deteriorated printing durability. The molecular weight of the modified polyvinyl alcohol resin binder is preferably from 2,000 to 1,000,000, more preferably from 5,000 to 500,000, even more preferably from 10,000 to 200,000.

The polyvinyl alcohol resin binder modified with an acetal skeleton having an alicyclic structure of the invention may be used singly. Alternatively, a plurality of these polyvinyl alcohol resin binders may be used in combination. Further, the polyvinyl alcohol resin binder modified with an acetal skeleton having an alicyclic structure of the invention may be used in admixture with one or more conventionally known polymer binders. The amount of polymer binders to be added to the modified polyvinyl alcohol resin binder is from 1 to 60% by weight, preferably from 1 to 40% by weight, more preferably from 1 to 20% by weight based on the total weight of the polymer binder. As the polymer binder to be added there may be used any conventionally known polymer binder without any restriction. Specific preferred examples of such a polymer binder include acryl main chain binder, urethane binder, and acetal-modified polyvinyl alcohol resin (butyral resin), which are often used in the art.

Next, ingredients for the photosensitive layer except the polymer binder will be described.

The photosensitive ingredient for image formation and used in the photosensitive layer of the lithographic printing plate of the invention may be of either positive type or negative type, but negative type photosensitive ingredients are more suited for the intention. Although such negative type photosensitive systems include a combination of an agent generating an acid by light or heat with a compound capable of undergoing an acid-catalyzed cross-linking reaction, and a combination of a photo- or heat-polymerization initiator with a compound having an ethylenically unsaturated bond capable of radical addition polymerization, particularly preferable photosensitive layers are photo- or heat-polymerizable photosensitive ones containing at least a photo- or heat-polymerization initiator and a compound having an ethylenically unsaturated bond capable of radical addition polymerization.

Moreover, the photosensitive lithographic printing plate of the invention is specially suited for the plate-making by a direct imaging using a laser with an emission wavelength of from 300 to 1,200 nm, and achieves a higher printing durability than the conventional lithographic plates.

[Photo- or Heat-polymerizable Negative Type Photosensitive Layer]

The particularly preferable photosensitive layer for the photosensitive lithographic printing plate of the invention contains, as its essential ingredients, one of a polyurethane resin binder associated with the invention and a polyvinyl alcohol resin binder modified with an acetal skeleton having an alicyclic structure, a photo- or heat-polymerization initiator and an ethylenically unsaturated compound capable of addition polymerization (hereinafter referred to as addition polymerizable compound). To the photosensitive layer of this type, may be added a co-sensitizer, a coloring agent, a plasticizer, a polymerization inhibitor, and other additives

[Addition Polymerizable Compound]

The addition polymerizable compound used for the photo- or heat-polymerizable negative type photosensitive layer and having at least one ethylenically unsaturated double bond is selected from compounds having at least one, preferably two or more, terminal ethylenically unsaturated bonds. Such compounds, which are well known in the related industrial fields, can be applied to the invention without any special restriction. Those compounds can take chemical forms such as monomer, pre-polymer, i.e., dimer, trimer and oligomer, mixtures as well as copolymers thereof. Examples of the monomer and the copolymer thereof include an unsaturated carboxylic acid (e.g., acrylic acid, methacrylic acid, itaconic acid, crotonic acid, isocrotonic acid or maleic acid), the ester and amide of such carboxylic acid, among which preferable compounds are the ester of an unsaturated carboxylic acid with an aliphatic polyvalent alcohol, and the amide of an unsaturated carboxylic acid with an aliphatic polyvalent amine compound. Also, the addition reaction product of an unsaturated carboxylic acid ester or amide both having a nucleophilic substituent such as a hydroxyl group, amino group or a mercapto group with a mono- or poly-functional isocyanate or epoxide, or the dehydrating condensation reaction product of an unsaturated carboxylic acid ester or amide both having a nucleophilic substituent such as a hydroxyl group, amino group or a mercapto group with a mono- or poly-functional carboxylic acid can be preferably used. Further, the product obtained by the addition reaction between an unsaturated carboxylic acid ester or amide having an electrophilic substituent such as an isocyanate group or an epoxy group and a mono- or poly-functional alcohol, amine or thiol, and one obtained by the substitution reaction using an unsaturated carboxylic acid ester or amide with a mono- or poly-functional alcohol, amine or thiol can be preferably used. As still other examples, the products obtained by similar reactions whereby the unsaturated carboxylic acid is replaced to an unsaturated phosphonic acid, styrene or vinyl ether are also useful.

Specific examples of the monomer in the form of the ester of an aliphatic polyvalent alcohol with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethylmethane, and bis[p-(methacryloxyethoxy)phenyl]dimethylmethane;

itaconic acid esters such as ethylene glycol diitaconate, propylene glycol diitaconate, 1,3-butanediol diitaconate, 1,4-butandiol diitaconate, tetramethylene glycol diitaconate, pentaerythritol diitaconate, and sorbitol tetraitaconate;

crotonic acid esters such as ethylene glycol dicrotonate, tetramethylene glycol dicrotonate, pentaerythritol dicrotonate, and sorbitol tetracrotonate;

isocrotonic acid esters such as ethylene glycol diisocrotonate, pentaerythritol diisocrotonate, and sorbitol tetraisocrotonate;

maleic acid esters such as ethylene glycol dimaleate, triethylene glycol dimaleate, pentaerythritol dimaleate, and sorbitol tetramaleate;

and other esters such as esters of aliphatic alcohols described in Japanese Patent Publication Nos. 27926/1981 and 47334/1986 and Japanese Patent Laid-Open No. 196231/1983; those having an aromatic back-bone structure as described in Japanese Patent Laid-Open Nos. 5240/1984, 5241/1984 and 226149/1990; and those containing an amino group as described in Japanese Patent Laid-Open No. 165613/1989. All of these can be preferably used in the invention.

The ester monomers enumerated heretofore may be used as mixtures thereof.

Specific examples of the amide obtained from an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide.

Other preferable amide monomers include those having a cyclohexylene structure and described in Japanese Patent Publication No. 21726/1979.

Moreover, urethane-type addition polymerizable compounds obtained by the addition reaction between an isocyanate group and a hydroxyl group are suited for use in the invention. Specific examples thereof include, for example, vinyl urethane compounds having at least 2 polymerizable vinyl groups in a molecule by adding a hydroxyl group-containing vinyl monomer represented by the following formula (VII) to a polyisocyanate compound having at least 2 isocyanate groups in a molecule as described in Japanese Patent Publication No. 41708/1973.

$$CH_2=C(R^4)COOCH_2CH(R^5)OH \tag{VII}$$

In the above formula, $R^4$ and $R^4$ each represents H or $CH_3$.

Furthermore, the urethane acrylates described in Japanese Patent Laid-Open No. 37193/1976, Japanese Patent Publication Nos. 32293/1990 and 16765/1990, and the urethane compounds having an ethylene oxide-based backbone as described in Japanese Patent Publication Nos. 49860/1983, 17654/1981, 39417/1987 and 39418/1987 can be preferably used.

Also, photo-polymerizable compositions exhibiting a very high photographic speed can be obtained by using an addition polymerizable compound having an amino structure or a sulfide structure in the molecule as described in Japanese Patent Laid-Open Nos. 277653/1988, 260909/1988 and 105238/1989.

Still other examples of preferred esters include the polyester acrylates described in Japanese Patent Laid-Open No 64183/1973 and Japanese Patent Publication Nos. 43191/1974 and 30490/1977, and polyfunctional acrylates or methacrylates such as epoxy acrylates obtained by reacting an epoxy resin with (meth)acrylic acid. The specific unsaturated compounds described in Japanese Patent Publication Nos. 43946/1971, 40337/1989 and 40336/19389, and the vinylsulfonic acid derivatives described in Japanese Patent Laid-Open No. 25493/1990 can also be used. In some cases, the perfluoroalkyl group-containing structure given in Japanese Patent Laid-Open No. 22048/1986 is preferably used, too. Further, the photo-crosslinkable monomers and oligomers described in The *Journal of the Adhesion Society of Japan,* 20 (7), pp. 300 to 308 (1984) are applicable to the invention.

Details on how these addition polymerizable compounds are used including molecular structure, individual or joint usage thereof, addition level, etc. may be arbitrarily fixed depending on the performance design of the final product as a negative type photosensitive lithographic printing plate. For example, the following viewpoints are taken into consideration for the determination of the use conditions. As for photographic speed, larger numbers of unsaturated groups contained in one molecule are better, and in most cases bi- or higher poly-functional compounds are selected. From the viewpoint of the mechanical strength of image areas, i.e., cross-linked areas, tri- or higher poly-functional compounds are preferred- It is further effective to control both of photographic speed and mechanical strength by jointly using plural compounds of different functionalities and having different polymerizable groups (e.g., acrylic acid esters, methacrylic acid esters, styrene and its derivatives and vinyl ether compounds). Compounds of a large molecular weight or a highly hydrophobic nature are desirable in the photographic speed and mechanical strength as a film, on the other hand, however, are sometimes not preferred with regard to the development speed or the tendency of separation in the developer. The type and using method of the addition polymerizable compound plays a key role on the compatibility with and the dispersion stability of other ingredients such as the binder polymer, polymerization initiator, or coloring agent included in the photosensitive layer. To improve compatibility, use of a low purity compound or two or more kinds of materials are effective in some cases.

Some specific structures need be selected for the purpose of enhancing the adhesion to the support or an overcoat to be described later. Higher mixed ratios of the addition polymerizable compound in the photosensitive layer are generally preferred to raise the photographic speed, but excessively high ratios cause problems of an undesirable phase separation, manufacturing troubles due to the tackiness of the photosensitive layer (e.g., failures derived from the transfer or adhesion of some ingredients of the photosensitive layer), or deposit formation in the developer. By considering these aspects, the addition polymerizable compound is used preferably in 5 to 80% by weight, more preferably 25 to 75% by weight of the non-volatile ingredients of the photosensitive layer. Only one kind or two or more of the addition polymerizable compound may be used. In the determination of the using conditions for the addition polymerizable compound, factors such as the degree of polymerization suppression caused by oxygen, image resolution, fog formation, refractive index modification and surface tackiness are taken into account, and an appropriate molecular structure, formulation and added amount are selected arbitrarily. In some instances, various layer structures as well as coating processes including sub-coating and over-coating may be adopted.

[Photo- or Heat-polymerization Initiator]

Various photo-polymerization initiators known in a number of patents and literatures can be appropriately used with consideration on the wavelength of the light source to be used. Two or more kinds of photo-polymerization initiators forming a photo-polymerization initiating system may be jointly used, too.

In cases where the second harmonics of a blue semiconductor laser, an Ar laser or an infrared semiconductor laser, or an SHG-YAG laser is used as the light source, various photo-polymerization initiators (or initiating systems) have been proposed, including the photo-reducible dyes such as, for example, rose bengale, eosin or erythrosine as described in U.S. Pat. No. 2,850,445, systems based on the combinations of a dye and an initiator such as, for example, a complex initiating system based on a dye and an amine (Japanese Patent Publication No. 20189/1969), a system jointly using a hexaarylbiimidazole, a radical generator and a dye (Japanese Patent Publication No. 37377/1970), a system using a hexaarylbiimidazole and a p-dialkylaminobenzylidene ketone (Japanese Patent Publication No. 2528/1972 and Japanese Patent Laid-Open No. 155292/1979), a system based on a cyclic cis-α-dicarbonyl compound and a dye (Japanese Patent Laid-Open No. 84183/1973), a system based on a cyclic triazine and a merocyanine dye (Japanese Patent Laid-Open No. 151024/1979), a system based on 3-ketocoumarin and an activator (Japanese Patent Laid-Open Nos. 112681/1977 and 15503/1983), a system with a biimidazole, a styrene derivative and a thiol (Japanese Patent Laid-Open Nos. 140203/1984), a system based on an organic peroxide and a dye (Japanese Patent Laid-Open Nos. 1504/1984, 140203/1984, 189340/1984 and 174203/1987, Japanese Patent Publication No. 1641/1937 and U.S. Pat. No. 4,766,055), a system based on a dye and an active halogen compound (Japanese Patent Laid-Open Nos. 1718105/1938, 258903/1988 and 264771/1991), a system based on a dye and a borate compound (Japanese Patent Laid-Open Nos. 143,044/1987, 150,242/

1987, 13,140/1989, 13,141/1989, 13142/1989, 13,143/1989, 13,144/1989, 17,048/1969, 229,003/1989, 298,348/1989 and 138204/1989), a system based on a rhodanine ring-containing dye and a radical generator (Japanese Patent Laid-Open Nos. 179643/1990 and 244,050/1990), a system based on a titanocene and a 3-ketocoumarine dye (Japanese Patent Laid-Open No.221110/1988), a system based on a titanocene, a xanthene dye and an ethylenically unsaturated compound which contains an addition polymerizable amino or urethane group (Japanese Patent Laid-Open Nos. 221958/1992 and 219,756/1994), a system based on a titanocene and a special merocyanine dye (Japanese Patent Laid-Open No. 295061/1994) and a system based on a titanocene and a pyrazoline ring-containing dye (Japanese Patent Laid-Open No. 334897/1996).

Particularly preferable photo-polymerization initiators (initiating systems) for the photosensitive layer of the negative type photosensitive lithographic printing plate of the invention contain at least a titanocene.

Any of the titanocene compounds that can yield an active radical with light irradiation in the presence of another sensitizing dye can be used for the invention as the photopolymerization initiator (initiating system). The known compounds described in, for example, Japanese Patent Laid-Open Nos. 152396/1984, 151197/1986, 41483/1988, 41484/1988, 249/1990, 291/1990, 27393/1991, 12403/1991 and 41170/1994 can be appropriately selected for use.

More specifically, di-cyclopentadienyl-Ti-dichloride, di-cyclopentadienyl-Ti-bis-phenyl, di-cyclopentadienyl-Ti-bis-2,3,4,5, 6-pentafluorophen-1-yl (abbreviated as "T-1" hereinafter), di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2, 4-difluorophen-1-yl, bis(cyclopentadienyl)-bis(2,6-difluoro-3-(pyr-1-yl)phenyl) titanium (abbreviated as "T-2" hereinafter).

These titanocene compounds may be subjected to a variety of chemical modifications to further improve the characteristics of the photosensitive layer. Such modifications include, for example, attaching a sensitizing dye or a radical generating part such as an addition polymerizable unsaturated compound and the like, introducing a hydrophilic part, introducing a substituent for the purposes of compatibility enhancement and suppressing crystalline deposit formation, and introducing a substituent or polymer formation for the purpose of improving adhesive properties.

Similarly to the case of the addition polymerizable compound mentioned hereinabove, details on how these titanocene compounds are used may be arbitrarily determined depending on the performance design of the final product as a negative type photosensitive lithographic printing plate. For example, by using two or more compounds, the compatibility in the photosensitive layer can be improved. Larger amounts of the photo-polymerization initiator such as titanocene compounds are advantageous for photographic speed; to secure a sufficiently high photographic speed, 0.5 to 80 parts by weight, more preferably 1 to 50 parts by weight of the initiator are used per 100 parts by weight of the non-volatile ingredient of the photosensitive layer. On the other hand, when the plate is to be handled under the illumination of a yellow or white light, the use amount of titanocene should be suppressed because of fogging with an around 500 nm wavelength light. And, by combining other types of sensitizing dyes, the use amount of titanocene can be suppressed to 6parts by weight or less, further 1.9 parts by weight or less, still further 1.4 parts by weight or less whereby still a sufficient speed can be achieved.

In cases where a laser emitting an IR light of from 760 to 1,200 nm is used as the exposing light source, an IR absorbing agent is essentially used in general. The IR absorbing agent acts to convert the absorbed IR light to heat. The heat generated by this mechanism thermally decomposes the radical generator to yield a radical. The IR absorbing agent used in the invention comprises a dye or pigment which has an absorption maximum in the range of from 760 to 1200 nm.

Commercially available dyes and those known in the art as described in, for example, Senryo Binran (Dye Handbook), (edited by The Society of Synthetic Organic Chemistry, Japan, published in 1970) can be used. Specifically, azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes and metal thiolate complex dyes are included.

Preferable dyes include the cyanine dyes described in, for example, Japanese Patent Laid-Open Nos. 125246/1983, 84356/1984, 202829/1984 and 78787/1985, the methine dyes described in Japanese Patent Laid-Open Nos. 173696/1983, 181690/1983 and 194595/1983, the naphthoquinone dyes described in Japanese Patent Laid-Open Nos. 112793/1983, 224793/1983, 48187/1984, 73996/1984, 52940/1985 and 63744/1985, the squarylium dyes described in Japanese Patent Laid-Open No. 112792/1983, and the cyanine dyes described in Brit. Patent No. 434,875.

Moreover, preferably used are the near IR absorbing sensitizers described in U.S. Pat. No. 5,156,938, the substituted arylbenzo(thio)pyrylium salts described in U.S. Pat. No. 3,881,924, the trimethinethiapyrylium salts given in Japanese Patent Laid-Open No. 142645/1982 (U.S. Pat. No. 4,327,169), the pyrylium-related compounds given in Japanese Patent Laid-Open Nos. 181051/1983, 220143/1983, 41363/1984, 84248/1984, 84249/1984, 146063/1984 and 146061/1984, the cyanine dyes given in Japanese Patent Laid-Open No. 216146/1984, the pentamethinethiopyrylium salts given in U.S. Pat. No. 4,283,475, and the pyrylium compounds given in Japanese Patent Publication Nos. 13514/1993 and 19702/1993.

Other preferable examples include the near infrared absorbing dyes defined by formulae (VI) and (VII) of U.S. Pat. No. 4,756,993.

Among the dyes enumerated hereinabove, particularly preferable ones are cyanine dyes, squarylium dyes, pyrylium salts and nickel thiolate complexes. Among these, cyanine dyes are more preferably used, and those represented by the following formula (VIII) are still more preferably used.

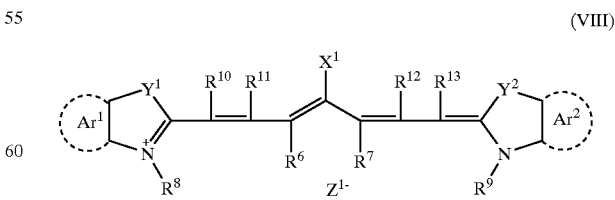

(VIII)

In formula (VIII), $X^1$ represents a halogen atom or $X^2$-$L^1$, wherein $X^2$ represents an oxygen or sulfur atom, and $L^1$ represents a hydrocarbon group of 1 to 12 carbon atoms. $R^6$ and $R^7$ each represents independently a hydrocarbon group of 1 to 12 carbon atoms. For the storage stability of the coating mixture for the photosensitive layer, $R^6$ and $R^7$ each is preferably a hydrocarbon group of 2 or more carbon atoms, and moreover, $R^6$ and $R^7$ are more preferably bonded together to form a 5- or 6-membered ring.

$Ar^1$ and $Ar^2$, which may be the same or different, each represents a substituted or unsubstituted aromatic hydrocarbon group. Preferable aromatic hydrocarbon groups include benzene and naphthalene rings. Preferable substituents include a hydrocarbon group of up to 12 carbon atoms, a halogen atom and an alkoxy group of up to 12 carbon atoms. $Y^1$ and $Y^2$, which may be the same or different, each represents a sulfur atom or a dialkylmethylene group of up to 12 carbon atoms. $R^8$ and $R^9$, which may be the same or different, each represents a substituted or unsubstituted hydrocarbon group of up to 20 carbon atoms. Preferable substituents include an alkoxy group, a carboxyl group and a sulfo group all of up to 12 carbon atoms. $R^{10}$, $R^{11}$, $R^{12}$ and $R^{13}$, which may be the same or different, each represents a hydrogen atom or a hydrocarbon group of up to 12 carbon atoms. They should be preferably hydrogen atoms from the viewpoint of raw material availability. $z^{1-}$ represents a counter anion. However, in the case where one of $R^6$ to $R^{13}$ is substituted with a sulfo group, $Z^{1-}$ is not necessary. Preferable ions for $Z^{1-}$ include a halogen ion, perchlorate ion, tetrafluoroborate ion, hexafluorophosphate ion and a sulfonic acid ion from the viewpoint of the storage stability of the coating mixture for the photosensitive layer. Among these, perchlorate ion, hexafluorophosphate ion and an arylsulfonic acid ion are particularly preferred.

Specific examples of the cyanine dye represented by formula (VIII) for use in the invention include those described in Japanese Patent Application No. 310623/1999.

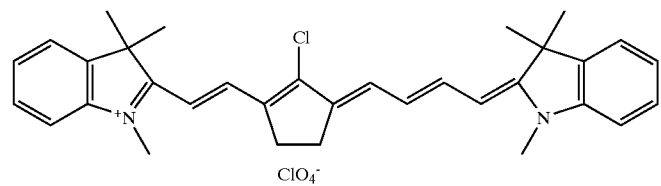

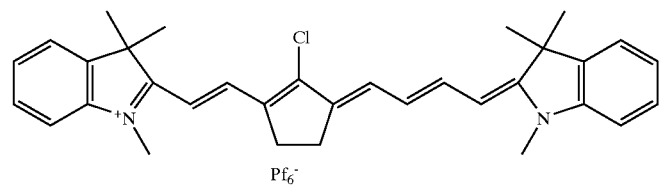

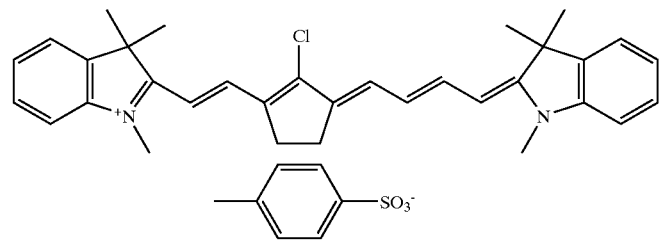

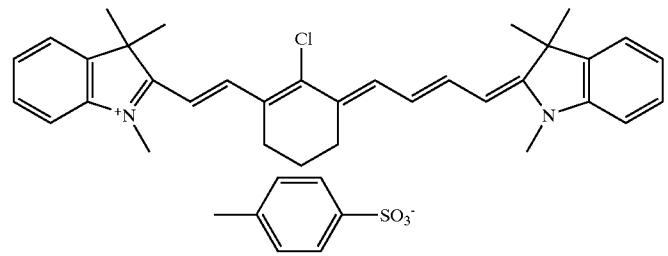

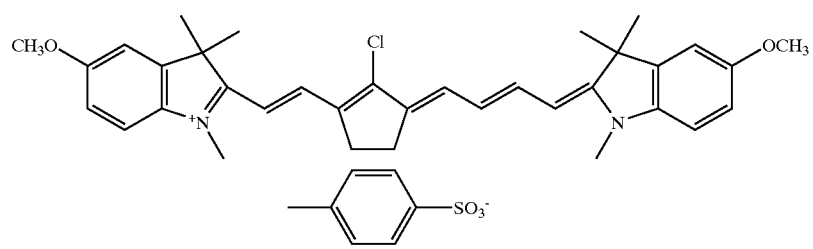

-continued
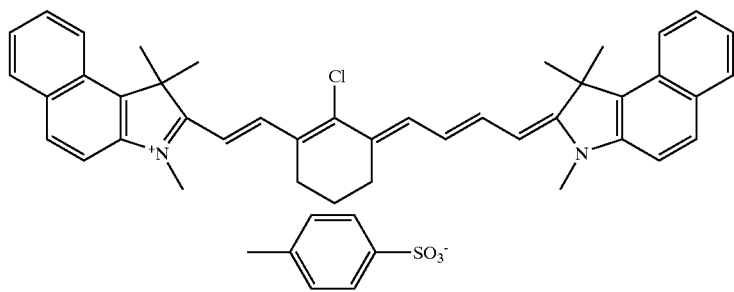
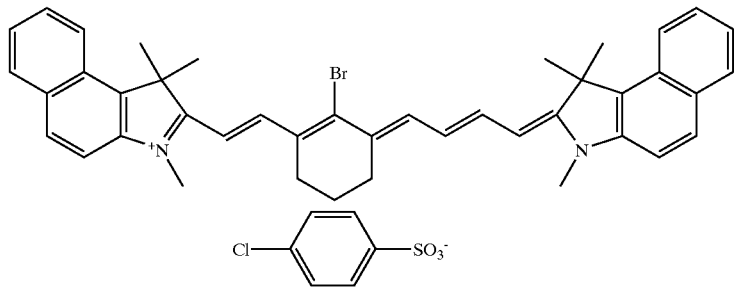
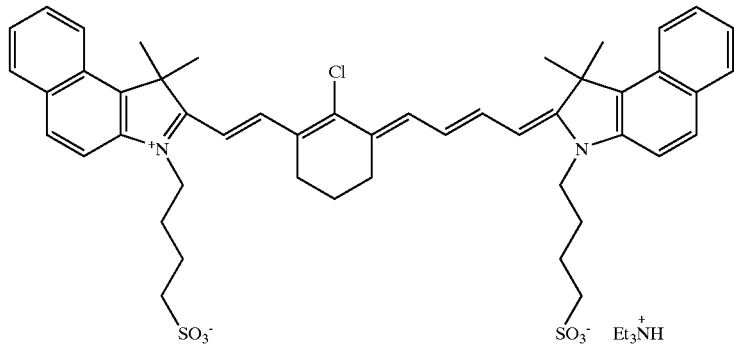
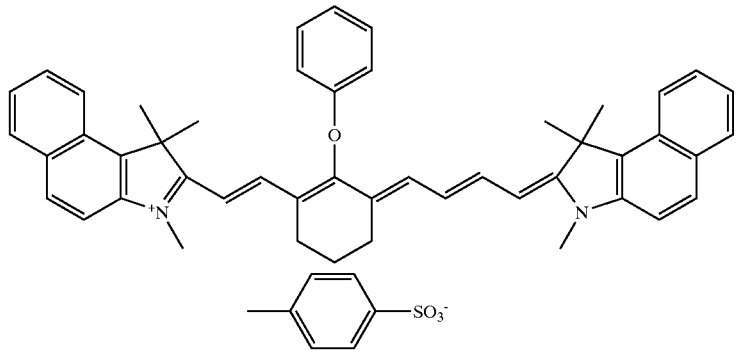
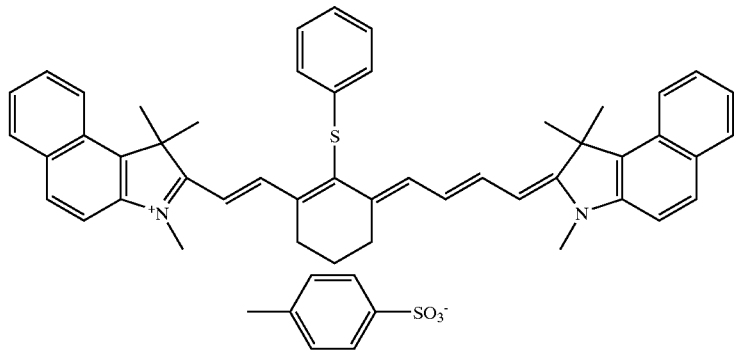

-continued

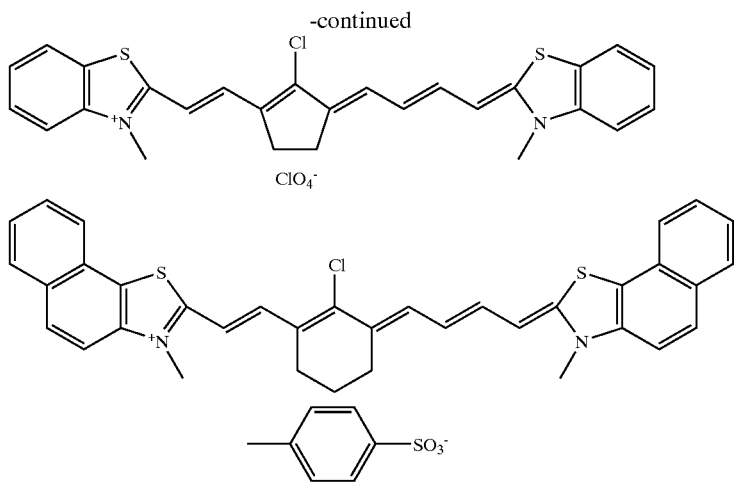

As the pigment used for the invention, commercially available ones and those listed in Color Index (C. I.) Handbook, and those described in *Saishin Ganryo Binran* (Updated Handbook on Pigment), edited by Nihon Ganryo Gijutu Kvokai (Pigment Technology Association of Japan) and published in 1977, *Saishin Ganryo Oyo Gijutu* (The Latest Pigment Application Technology) (CMC Books, 1986), and *Insatsu Inki Gijutu* (Printing Ink Technology) (CMC Books, 1934).

Applicable types of pigment include black, yellow, orange, brown, red, violet blue and green pigments, fluorescent pigments, metal powder pigments and polymer-grafted dyes. Specifically, insoluble azo pigments, azo lake pigments, condensed azo pigments, chelated azo pigments, phthalocyanine pigments, anthraquinone pigments, perylene and perinone pigments, thiomdigo pigments, guinacridone pigments, dioxazine pigments, isoindolmone pigments, quinophthalone pigments, lake pigments azine pigments, nitroso pigments, nitro pigments, natural pigments, inorganic pigments and carbon black. Among these, carbon black is particularly preferred.

These pigments may be used without surface treatment, or may be subjected to a surface treatment such as surface coating with a resin or wax, deposition of a surfactant, and bonding a reactive substance (e.g., a silane coupling agent, an epoxy compound or a polyisocyanate) to the pigment surface. These surface treatments are described in *Kinzoku Sekken no Seishitsu to Oyo* (Properties and Applications of Metal Soaps) (Saiwai Shobo), *Insatsu Inki Gijutu* (Printing Ink Technology) (CMC Books, 1984) and *Saishin Ganryo Oyo Gijutu* (The Latest Pigment Application Technology) (CMC Books, 1936).

The particle size of the pigment lies preferably in the range of from 0.01 to 10 µm, more preferably from 0.05 to 1 µm, and still more preferably from 0.1 to 1 µm. When the particle size falls below 0.01 µm, the pigment dispersion added to the coating mixture for the photosensitive layer exhibits a poor stability, while with sizes exceeding 10 µm the uniformity of the resulting photosensitive layer deteriorates.

Pigments can be dispersed by various methods well known in the fields of ink or toner manufacture. As the dispersing apparatus, an ultrasonic dispersion device, a sand mill, an attritor, a pearl mill, a super mill, a ball mill, an impeller, a disperser, a KD mill, a colloid mill, a dynatron, a three-roll mill or a pressure-aided kneader can be used. Details of dispersing methods are given in *Saishin Ganryo Oyo Gijutu* (The Latest Pigment Application Technology) (CMC Books, 1988).

Such an IR absorber may be incorporated not only in the photosensitive layer, but also to another layer including an over-coat or subbing layer. In any case, it is desirable that the optical density of the negative type photosensitive lithographic printing plate is from 0.1 to 3.0 at the absorption maximum lying between the wavelengths of 760 and 1200 nm. With an optical density outside the cited range, the photographic speed tends to be low. Since the optical density is determined by the added amount of the IR absorber cited above and the photosensitive layer thickness, a preferable optical density can be achieved by controlling these two factors. Optical density can be measured by the conventional manner. For example, a photosensitive layer having a thickness after drying in the appropriate range as a lithographic printing plate is formed on a transparent or white support, and the density is measure with a transmission type densitometer, or a photosensitive layer is formed on a reflective support such as an aluminum sheet, and subjected to refection density measurement.

A heat-decomposable radical generator means a compound that is used in combination with the IR absorber enumerated above and generates a radical when irradiated with an IR laser. Such a radical generator includes onium salts, triazine compounds containing a trihalomethyl group, peroxides, azo-type polymerization initiators, azide compounds and quinonediazides, among which onium salts are preferred due to their high sensitivity.

The onium salts that are preferably used in the invention as the radical polymerization initiator will be described. Preferable onium salts include iodonium salts, diazonium salts and sulfonium salts. In the invention, these onium salts act as the initiator of radical polymerization not as an acid generator. The onium salts preferably used in the invention can be represented by the following formulae (IX) to (XI).

$Ar^{11}$—$I^+$—$Ar^{12}$  $Z^{11-}$  Formula (IX)

$Ar^{21}$—$N^+$≡$N$  $Z^{21-}$  Formula (X)

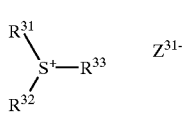

Formula (XI)

In formula (IX), $Ar^{11}$ and $Ar^{12}$ each represents independently a substituted or unsubstituted aryl group of up to 20 carbon atoms including those of the substituent. In the case where this aryl group has a substituent, a halogen atom, a nitro group, an alkyl group of up to 12 carbon atoms, an alkoxy group of up to 12 carbon atoms and an aryloxy group of up to 12 carbon atoms are preferred as the substituent. $Z^{11-}$ represents a counter ion chosen from the group comprising a halogen ion, perchlorate ion, tetrafluoroborate ion, hexafluorophosphate ion and a sulfonate ion. Among these, perchlorate ion, hexafluorophosphate ion and an arylsulfonate ion are preferred.

In formula (X), $Ar^{31}$ represents a substituted or unsubstituted aryl group of up to 20 carbon atoms including those of the substituent. Preferable substituents include a halogen atom, a nitro group, an alkyl group of up to 12 carbon atoms, an alkoxy group of up to 12 carbon atoms, an aryloxy group of up to 12 carbon atoms, an alkylamino group of up to 12 carbon atoms, an arylamino group of up to 12 carbon atoms and a diarylamino group of up to 12 carbon atoms. $Z^{21-}$ represents a counter ion and has the same meaning as $z^{11-}$.

In formula (XI), $R^{31}$, $R^{32}$ and $R^{33}$, which may be the same or different, each represents a substituted or unsubstituted hydrocarbon group of up to 20 carbon atoms including the carbon atoms of the substituent. Preferable substituents include a halogen atom, a nitro group, an alkyl group of up to 12 carbon atoms, an alkoxy group of up to 12 carbon atoms and an aryloxy group of up to 12 carbon atoms. $Z^{31-}$ represents a counter ion and has the same meaning as $Z^{11-}$.

Specific examples of the onium salt preferably used as the radical generator of the invention include those described in Japanese Patent Laid-Open No. 310623/1999.

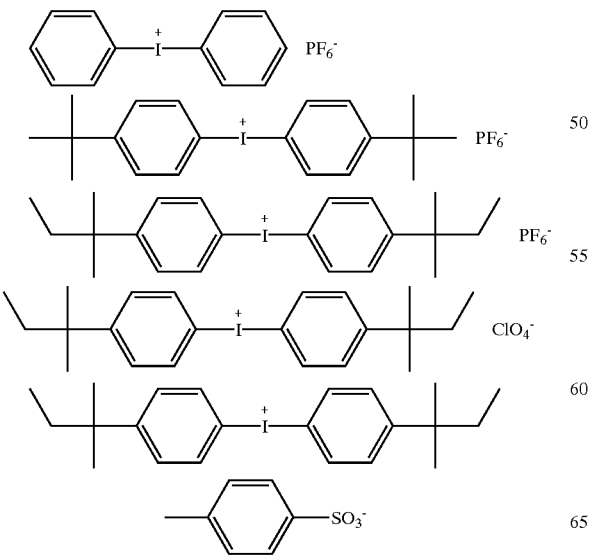

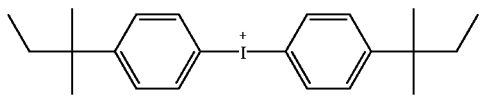

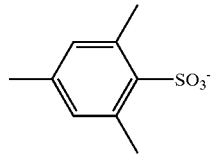

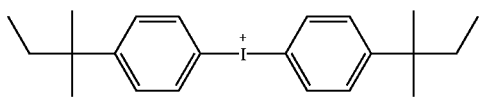

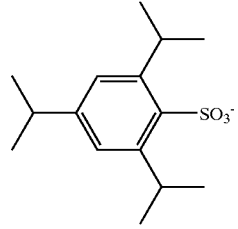

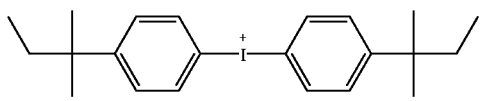

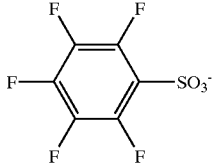

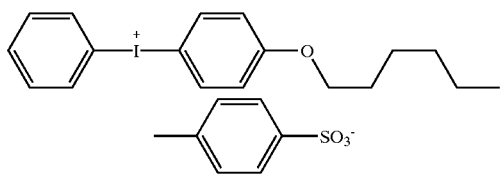

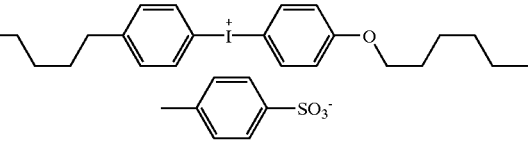

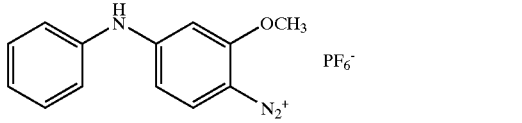

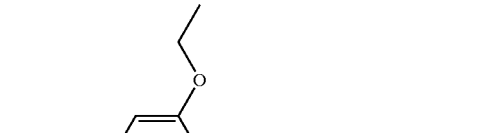

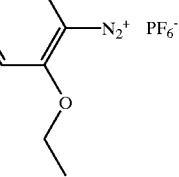

-continued

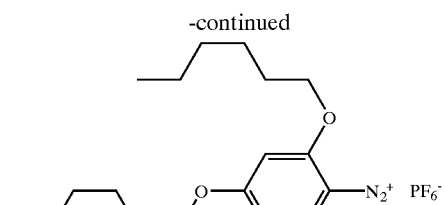
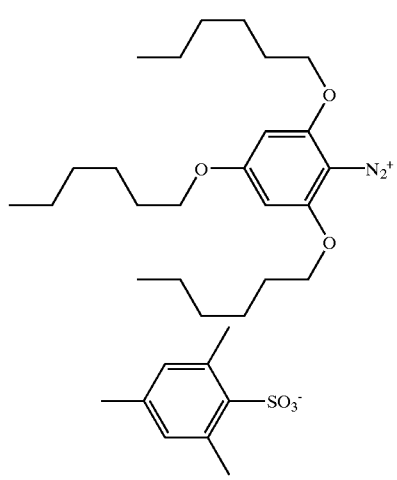
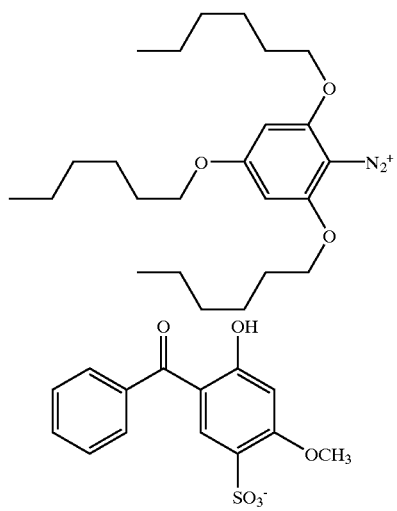
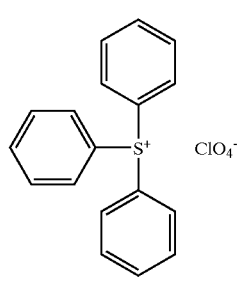

-continued

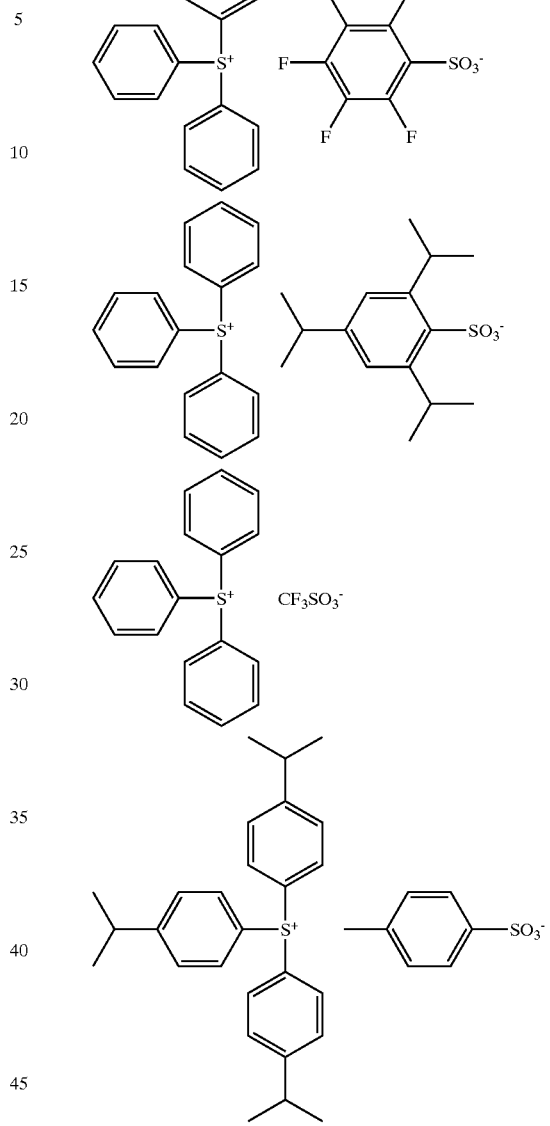

The heat-decomposable radical generator used in the invention preferably has the maximum absorption wavelength shorter than 400 nm, more preferably shorter than 360 nm. By placing the absorption peak in a UV region, the negative type photosensitive lithographic printing plate can be handled under a white light.

Such a heat-decomposable radical generator is incorporated in the coating mixture for the photosensitive layer in an amount of 0.1 to 50% by weight, preferably 0.5 to 30% by weight, and particularly preferably from 1 to 20% by weight of the total weight of the non-volatile ingredient in the coating mixture. With an added amount below 0.1% by weight, the photographic speed is undesirably low, while an added amount exceeding 50% by weight causes stain formation in the non-image areas during printing. The radical generator to be used may comprise one type of material or two or more in combination. Although the heat decomposable radical generator may be incorporated in the same layer as other essential ingredients, or in another layer separately provided, the former method is preferred.

In addition to the essential ingredients described heretofore, the photo- or heat-polymerizable negative type photosensitive layer of the photosensitive lithographic printing plate of the invention may further contain other ingredients suited for the product application and manufacturing process. Examples of such preferable additives will be shown hereinafter.

[Co-sensitizer]

By using a co-sensitizer for the photo-polymerizable photosensitive layer, the photographic speed of the photosensitive layer can be further enhanced. The working mechanism of the co-sensitizer, though not definitely clarified, may be probably based on the following chemical processes for most cases. That is, the co-sensitizer is assumed to react with various intermediate active species (such as a radical, a peroxide, an oxidizing agent or a reducing agent) formed in the photochemical reaction initiated by the light absorption of the photo-polymerization initiator (initiating system) followed by a subsequent addition polymerization reaction to generate a new active radical. The co-sensitizer can be roughly classified into (a) a compound capable of forming an active radical by reduction, (b) a compound capable of forming an active radical by oxidation, and (c) a compound reacting with a radical of low activity to convert it into a more active radical or acting as a chain transfer agent. However, commonly accepted views are not always established on which group each co-sensitizer belongs to.

(a) Compounds Capable of Forming an Active Radical by Reduction

Compounds having a carbon-halogen bond: an active radical is considered to generate by the reductive cleavage of the carbon-halogen bond. Specifically, for example, trihalomethyl-s-triazines and trihalomethyloxadiazoles can be preferably used.

Compounds having a nitrogen-nitrogen bond: an active radical is considered to generate by the reductive cleavage of the nitrogen-nitrogen bond. Specifically, hexaarylbiimidazoles are preferably used.

Compounds having an oxygen-oxygen bond: an active radical is considered to generate by the reductive cleavage of the oxygen-oxygen bond. Specifically, for example, organic peroxides are preferably used.

Onium compounds: an active radical is considered to generate by the reductive cleavage of the carbon-hetero atom bond or the oxygen-nitrogen bond. Specifically, for example, diaryliodonium salts, triarylsulfonium salts, N-alkoxypyridium (azinium) salts are preferably used.

Ferrocene and iron arene complexes: they can form reductively an active radical.

(b) Compounds Forming an Active Radical by Oxidation

Alkylate complexes: an active radical is considered to generate by the oxidative cleavage of the carbon-hetero atom bond. Specifically, for example, triarylalkylborates are preferably used.

Alkylamine compounds: an active radical is considered to generate by the oxidative cleavage of the C—X bond on the carbon atom adjacent to the nitrogen atom. X preferably represents a hydrogen atom, a carboxyl group, trimethylsilyl group and benzyl group. Specifically, for example, ethanolamine and derivatives thereof, N-phenylglycin and derivatives thereof, and N-trimethylsilylmethylaniline and derivatives thereof are preferably used.

Sulfur- or tin-containing compounds: the compounds resulting from the substitution of the nitrogen atom in the above-cited amine compounds to a sulfur or tin atom can form an active radical in a similar manner. Further, it is known that compounds having an S—S bond exhibit a sensitizing effect based on S—S cleavage.

α-Substituted methylcarbonyl compounds: an active radical can be generated by the oxidative cleavage of the carbonyl-α-carbon bond. The compounds in which the carbonyl group is converted to an oxime ether exhibit a similar function. Specifically, 2-alkyl-[1-[4-(alkylthio)phenyl]-2-morpholinopronone-1 and related compounds, and the oxime ethers which result from the reaction of the above compounds with a hydroxylamine followed by the etherification of the N—OH can be used.

Sulfinic acid salts: these compounds can reductively yield an active radical. Specifically sodium arylsulfinates are included.

(c) Compounds which react with a radical to convert it into a more active radical or which act as a chain transfer agent: compounds having SH, PH, SiH or GeH in the molecule are used. These compounds donate hydrogen to a radical species of low activity to form another radical, or can form a radical by deprotonation after oxidation. Specific examples include 2-mercaptobenzoimidazoles.

Specific examples of the various co-sensitizers enumerated heretofore are described in, for example, Japanese Patent Laid-Open No. 236913/1997 as the additives that are used to enhance photographic speed. Some of the compounds are listed in the following, to which, however, those used in the photosensitive layer of the photosensitive lithographic printing plate of the invention are not limited at all.

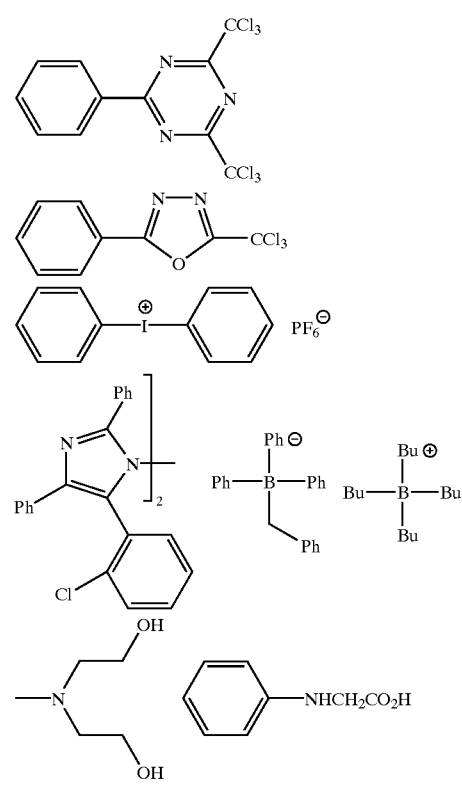

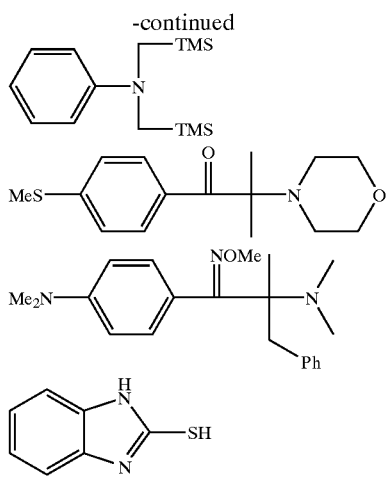

Co-sensitizers may be also subjected to a variety of chemical modifications to improve the characteristics of the photosensitive layer. Such modifications include, for example, attaching a sensitizing dye or a radical generating portion such as titanocene, an addition polymerizable unsaturated compound and the like, introducing a hydrophilic portion, introducing a substituent for the purposes of compatibility enhancement and suppressing crystalline deposit formation, and introducing a substituent or polymer formation for the purpose of improving adhesive properties.

One, two or more kinds of the co-sensitizers cited above may be used. The appropriate use amount thereof is from 0.05 to 100 parts by weight, preferably from 1 to 80 parts by weight, and more preferably from 3 to 50 parts by weight per 100 parts by weight of the compound having an ethylenically unsaturated double bond.

[Polymerization Inhibitor]

In the negative type photo- or heat-polymerizable photosensitive layer, as a particularly preferable embodiment of the invention, the photosensitive layer is preferably added with a small amount of a heat polymerization inhibitor in order to prevent the compound having an ethylenically unsaturated double bond from undesirable heat polymerization which may proceed during the manufacture or the storage of the negative type photosensitive composition. Suitable heat polymerization inhibitor include hydroquinone, p-methoxyphenol, di-t-butyl-p-cresol, pyrogallol, t-butylcatechol, benzoquinone, 4,4'-thiobis-(3-methyl-6-t-butylphenol), 2,2'-methylenebis (4-methyl-6-t-butylphenol), and the primary cerium salt of N-nitrosophenylhydroxyamine. The addition amount of the heat polymerization inhibitor is preferably from about 0.01 to about 5% by weight of the amount of the non-volatile ingredient of the composition. Depending on need, higher aliphatic acid derivatives such as behenic acid or behenic acid amide may be added whereby these additives are localized at the surface of the photosensitive layer after drying to suppress the polymerization inhibition caused by oxygen. Such higher aliphatic acid derivatives are preferably added in about 0.5 to 10% by weight of the total amount of the non-volatile ingredient of the composition.

[Coloring Agent]

The photosensitive layer of the photosensitive lithographic printing plate of the invention may be incorporated with a coloring agent such as a dye or pigment for the coloration thereof. With this countermeasure, the so-called plate inspection capability is improved which indicates the ease of visual inspection of the printing plate after plate making or the adaptiveness to image density measuring apparatuses. Since most of dyes act to lower the photographic speed of the photo-polymerizable photosensitive layer, pigments are preferably used as a coloring agent. Specifically, pigments such as phthalocyanine and azo pigments, carbon black and titanium oxide, dyes such as ethyl violet, crystal violet, azo dyes, anthraquinone dyes and cyanine dyes can be used. Such a dye or pigment is preferably used in an amount of about 0.5% to about 5% by weight of the non-volatile ingredient of the composition.

[Other Additives]

To further improve the physical properties of the crosslinked layer, various additives well known in the art maybe incorporated including an inorganic filler, a plasticizer, and an oil-affinitizing agent which can enhance the ink-receptivity of the photosensitive layer surface.

Preferable plasticizers include, for example, dioctyl phthalate, didodecyl phthalate, triethylene glycol dicaprylate, dimethyl glycol phthalate, tricresyl phosphate, dioctyl adipate, dibutyl sebacate, and triacetyl glycerin. The plasticizer can be incorporated in a content of 10% by weight or lower relative to the total weight of the polymer binder and the addition polymerizable compound.

Furthermore, with the purpose of enhancing the mechanical strength of the layer (printing durability) as will be described hereinafter, a UV initiator and a thermal cross-linking agent may be incorporated, too. These additives enhance the effect of post baking or exposure after development.

To prepare the photosensitive layer by coating, the photopolymer composition for said layer is dissolved in a variety of organic solvents, and the resulting coating mixture is applied to the interlayer described above. Solvents used for that purpose include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. The solvent material can be used in pure form or as a mixture. The solid content in the coating mixture is usually 2 to 50% by weight.

Since the coated amount of the photosensitive layer described heretofore mainly governs the photographic speed, the developability of the photosensitive layer, and the strength and the durability of the exposed layer, it should be appropriately determined depending on the application of the final product. With a too small coated amount, an insufficient printing durability results. On the other hand, with an excessively large coated amount, the photographic speed falls, thus undesirably expanding the exposure time and the developing time. The appropriate range of coated amount after drying, as the photosensitive lithographic printing plate used for scanning exposure, which is the main object of the invention, is from about 0.1 to about 10 g/m$^2$ more preferably from 0.5 to 5 g/m$^2$.

[Support]

As the support of the photosensitive lithographic printing plate of the invention, any hydrophilic support that is well known in the art and has been used for photosensitive lithographic printing plates can be used without any restriction. The support should preferably be in the for of highly dimensionally stable sheet: preferable specific materials include, for example, paper, paper laminated with a plastic (e.g., polyethylene, polypropylene or polystyrene), sheet-formed metals (e.g., aluminum, zinc or copper), plastic films (e.g., cellulose diacetate, cellulose triacetate, cellulose propionate, cellulose lactate, cellulose acetate lactate, cellulose nitrate, poly(ethylene terephthalate), polyethylene, polystyrene, polypropylene, polycarbonate or polyvinyl acetal), and paper or plastic films on which the metal cited above is laminated or vapor-deposited. With the purposes of imparting a hydrophilic nature or enhancing the surface strength, such a support may be subjected to an appropriate physical or chemical surface treatment well known in the art, if required and necessary.

Particularly preferable supports include paper, polyester films and aluminum sheets. Among these, aluminum sheets are still more preferred since aluminum is dimensionally stable, relatively inexpensive, and can be provided with a surface excelling in hydrophilic nature and mechanical strength. A complex sheet comprising an aluminum sheet bonded to a poly(ethylene terephthlate) film is also preferred.

Aluminum-based supports are dimensionally stable metallic sheets consisting mainly of aluminum, including pure aluminum sheets, aluminum alloy sheets containing a small amount of foreign elements and aluminum (or aluminum alloy)-laminated plastic films or papers.

In the following descriptions, the term "aluminum support" will be used for the aluminum-based supports described above comprising aluminum or aluminum alloys. The foreign elements included in such aluminum alloys include silicon, iron, manganese, copper, magnesium, chromium, zinc, bismuth, nickel and titanium. The content thereof is up to 10% by weight of the alloy. Though pure aluminum sheets are suited for the invention, those containing a scarce amount of foreign elements can also be used since perfectly purified aluminum is difficult to produce with the current smelting technology.

Hence, the composition of the aluminum sheet applicable to the invention is not specifically identified, but the conventionally known materials including, for example, JIS A 1050, JIS A 1100, JIS A 3103 and JIS A 3005 can be appropriately used. The thickness of the aluminum support for use in the invention lies in the rough range of from 0.1 to 0.6 mm. The thickness may be suitably adjusted depending on the size of the press machine, the size of the printing plate and user requests. These aluminum supports may be subjected to a surface treatment to be described later, if required and necessary. Self-evidently, supports free of surface treatments may be used.

[Surface Graining]

In the surface graining processes, mechanical graining as disclosed in Japanese Patent Laid-Open No. 28893/1981, chemical etching and electrolytic graining are included. Besides usable are electrochemical graining where in the surface is roughened electrochemically in an electrolytic solution containing hydrochloric or nitric acid, and a number of mechanical graining such as wire brush graining wherein the aluminum surface is scratched with metallic wires, ball graining wherein the aluminum surface is grained with polishing balls and an abradant, and brush graining wherein nylon brushes and an abradant are used for surface graining. These graining processes can be used separately or in combination.

Among those various processes, most effective one is the electrochemical graining conducted in an electrolytic solution containing hydrochloric or nitric acid. A suitable anode electric quantity lies in the range of 50 to 400 C./dm$^2$. More specifically, an ac and/or dc electrolysis is preferably conducted in an electrolytic solution containing 0.1 to 50% of hydrochloric or nitric acid at a temperature between 20 and 80° C., for 1 sec to 30 min with a current density of 100 to 400 C./dm$^2$.

The aluminum support thus surface-roughened may further be chemically etched with an acid or an alkali. Preferable etching agents include caustic soda, sodium carbonate, sodium aluminate, sodium metasilicate, sodium phosphate, potassium hydroxide and lithium hydroxide. Preferable ranges for the concentration and temperature are 1 to 50% and 20 to 100° C., respectively. An acid rinse is carried out to eliminate the smut remaining on the surface after etching. The acid to be used includes nitric, sulfuric, phosphoric, chromic, hydrofluoric and borofluoric. As the desmutting treatment after the electrochemical graining process, the method described in Japanese Patent Laid-Open No. 12739/1988 and comprising bringing the sheet into contact with 15 to 65% by weight sulfuric acid at 50 to 90° C., and an alkali etching given in Japanese Patent Publication No. 28123/1973 are preferably adopted.

Any graining process may be used-provided that the grained surface has a centerline average surface roughness Ra of 0.2 to 0.5 μm.

[Anodic Oxidation]

The aluminum support thus treated and having an oxide layer is then subjected to an anodic oxidation. The anodizing treatment is conducted in an electrolytic solution containing, as the main ingredient, one or more of the aqueous solution of sulfuric acid, phosphoric acid, oxalic acid or boric acid/sodium borate appropriately combined. Self-evidently the electrolytic solution may contain those ingredients that are usually contained in the aluminum alloy sheet, the electrode, tap water or underground water. Further, secondary or tertiary components may be present in the electrolytic solution. Examples of such secondary or tertiary components include the ions of metals such as Na, K, Mg, Li, Ca, Ti, Al, V, Cr, Mn, Fe, Co, Ni, Cu and Zn and other cationic ions such as ammonium ion, and anionic ions such as nitrate ion, carbonate ion, chloride ion, phosphate ion, fluoride ion, sulfite ion, titanate ion, silicate ion and borate ion. The concentration thereof is usually 0 to 10000 ppm. Though there is no restriction on the conditions of anodic oxidation, sheets are preferably subjected to a dc or an ac electrolysis with a process load of 30 to 500 g/liter under a treatment solution temperature of 10 to 70° C. at a current density of 0.to 40A/m$^2$. The thickness of the oxide layer formed by such anodic oxidation usually lies in the range of 0.5 to 1.5 μm, preferably 0.5 to 1.0 μm.

It is essential to select the processing conditions so that the micro-pores formed in the oxide layer obtained by the anodic oxidation are of 5 to 10 nm diameter and that the pore density lies in the range of from $8 \times 10^{15}$ to $2 \times 10^{16}$/m$^2$ in number.

The surface of the support described heretofore is subjected to various water-receptivity enhancing treatments well known in the art. Particularly preferable treatments include those using a silicate or polyvinylphosphoric acid. A hydrophilic coating is formed so as to have 2 to 40 mg/m$^2$, more preferably 4 to 30 mg/m$^2$ in terms of the deposited amount of elemental Si or P.

The deposited amount of such water-receptivity enhancing agent can be measured by X-ray fluorescence analysis.

The above-described water-receptivity enhancing treatment is conducted by immersing the aluminum support having the anodic oxidation layer in an alkali metal silicate or polyvinylphosphonic acid aqueous solution of 1 to 30% by weight concentration, preferably 2 to 15% by weight concentration, which shows a pH of 10 to 13 at 25° C., at a temperature between 15 and 80° C. for 5 to 120 sec.

The alkali metal silicate used for such water-receptivity enhancing treatment includes sodium silicate, potassium silicate and lithium silicate. The hydroxide used to raise the pH of the aqueous alkali metal silicate solution includes sodium hydroxide, potassium hydroxide and lithium hydroxide.

To the solution used for the water-receptivity enhancing treatment may be incorporated an alkaline earth metal salt or the salt of a Group IVB metal. The alkaline earth metal salt includes nitrates such as potassium nitrate, strontium nitrate, magnesium nitrate and barium nitrate, and various water-soluble sulfates, chlorides, phosphates, acetates, oxalates and borates. The salt of a Group IVB metal includes titanium tetrachloride, titanium trichloride, potassium titanium fluoride, titanium potassium oxalate, titanium sulfate, titanium tetraiodide, zirconium oxychloride, zirconium dioxide, zirconium oxychloride and zirconium tetrachloride.

These alkaline earth metal salts or the salts of Group IVB metals may be used individually or in combination of two or more thereof. A preferable content of these metal salts is from 0.01 to 10% by weight, and a more preferable content is from 0.05 to 5.0% by weight.

Alternatively, the electro-deposition of a silicate is also effective as described in U.S. Pat. No. 3,658,662. The surface treatment comprising the combination of the above-described anodic oxidation treatment and water-receptivity enhancing treatment, which are applied to the support subjected to the electrolytic graining described in Japanese Patent Publication No. 27481/1971, and Japanese Patent Laid-Open Nos. 58602/1977 and 30503/1977, are useful.

[Interlayer]

In the photosensitive lithographic printing plate of the invention, an interlayer may be provided between the photosensitive layer and the support for the purposes of adhesion improvement and stain prevention. Specific examples of such an interlayer are given in Japanese Patent Publication No. 7481/1975, Japanese Patent Laid-Open Nos. 71123/1976, 72104/1979, 101651/1984, 149491/1985, 232998/1986, 304441/1990, 56177/1991, 282637/1992, 16553/1993, 246171/1993, 341532/1993, 159983/1991, 314937/1995, 202025/1996, 320551/1996, 34104/1997, 236911/1997, 269593/1997, 69092/1998, 115931/1998, 161317/1998, 260536/1998, 282679/1998, 282682/1998, 84674/1999, 69092/1998, 115931/1998, 38635/1999, 38629/1999, 282645/1998, 301262/1998, 24277/1999, 109641/1999, 319600/1998, 84674/1999, 327152/1909 and 10292/2000, Japanese Patent Application Nos. 36377/1999, 165861/1999, 284091/1999 and 14697/2000.

[Protective Layer]

In the photosensitive lithographic printing plate having a photo- or heat-polymerizable photosensitive layer as a preferable embodiment of the invention, it is desirable to provide a protective layer on the photosensitive layer cited above in order to conduct image exposure in the air. The protective layer prevents the oxygen or a low molecular weight compound such as a basic material present in the air, both of which hinder the image forming reaction triggered by an exposure to the photosensitive layer mentioned above, from contaminating in the photosensitive layer, thus enabling the photosensitive plate to be exposed in the air. Accordingly, the characteristics expected to such a protective layer include, in the first place, a low permeability of low molecular weight molecules such as oxygen, and further an easy removability during development after image exposure. Various proposals have been already made on the protective layer as described in detail in U.S. Pat. No. 3,458,3111 and Japanese Patent Laid-Open No. 49729/1980.

As the material used for the protective layer, water-soluble polymers with a relatively high degree of crystallinity are preferred. Specifically, water-soluble polymers such as poly(vinyl alcohol), polyvinylpyrrolidone, acid cellulose derivatives, gelatin, gum Arabic and poly(acrylic acid). To use poly(vinyl alcohol) as the principal ingredient of the protective layer gives the best result on the basic characteristics such as oxygen exclusion and removability during development. The poly(vinyl alcohol) to be used for the protective layer, may be partially substituted with an ester, ether or acetal so lone as a sufficient amount of unsubstituted polylvinyl alcohol) remains to secure the necessary degree of oxygen exclusion as well as water-solubility. Similarly, the polylvinyl alcohol) may contain another copolymerized ingredient in part. Specific examples of poly(vinyl alcohol) include those in which 71 to 100% of the monomer units are hydrolyzed and which have a molecular weight of from 300 to 2400.

Specifically, the following products of Kuraray Corp., Ltd. are preferably used: PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PCA-224E, PVA-405, PVA-420, PVA-613, and L-8.

The composition (selection of PVA and use of additives) and the coating weight of the protective layer are determined with consideration of, in addition to the degree of oxygen-exclusion and the removability during development, fog formation, adhesive property and anti-abrasion property. Generally speaking, the higher the degree of hydrolysis of PVA (i.e., the higher the content of unsubstituted vinyl alcohol unit in the protective layer) is, and the thicker the layer is, the higher the degree of oxygen-exclusion becomes, and therefore the product is desirable as regards photographic speed. However, when oxygen is excessively excluded, various problems arise: undesirable polymerization proceeds during manufacture or storage before use, or after image exposure, unwanted fog or fattening of a line image takes place. Besides, the adhesion of the protective layer to the image portion and the abrasion resistance are very important in plate handling. When a hydrophilic layer comprising an water-soluble polymer is superposed on the oleophilic photosensitive layer, layer separation tends to occur due to the lack of adhesive strength, and the area where the protective layer has been peeled off gives rise to an image defect due to the polymerization impediment by oxygen which leads to a poor cross-linking of the photosensitive layer. To solve the problem, various proposals have been made which aim to improve the adhesion of these two layers. For example, U.S. Pat. Nos. 292,501 and 44,563 disclose that a sufficient adhesion is achieved by forming a protective layer with a mixture comprising a hydrophilic polymer mainly consisting of PVA and 20 to 60% by weight of an acrylic emulsion or a water-insoluble vinylpyrrolidone-vinyl acetate copolymer on a photosensitive layer. To the protective layer for the invention, any known technique including the one cited above can be applied. Methods or coating such a protective layer are described in detail in, for example, U.S. Pat. No. 3,458,311 and Japanese Patent Laid-Open No. 49729/1980.

In the plate-making process with which a lithographic printing plate is produced from the photosensitive lithographic printing plate of the invention, the entire area of the photosensitive plate may be baked prior to or during exposure, or in the period between exposure and development, depending on need. Such baking operation brings about advantages such as promotion of the image forming reaction in the photosensitive layer, enhancement of photographic speed or printing durability, and stabilization of photographic speed. Moreover, it is effective to post-bake the plate or give a uniform exposure to the image obtained by development for the purposes of enhancing image strength and printing durability. Usually, mild heating conditions not exceeding 150° C. are preferably adopted for pre-baking prior to development. When the baking temperature is too high, non-image areas tend to be fogged. In contrast, the post-baking condition is very harsh, using temperatures between 200 and 500° C. With a post-baking at too low temperatures, the image enhancing effect is not enough, while a too high temperature post-baking causes problems such as the deterioration of the support and the thermal decomposition of the image area.

Without any restriction, various exposure methods known in the art can be used to expose the photosensitive lithographic printing plate of the invention. Preferably the wavelength of the light source to be used lies in the range of 300 to 1200 nm, and specifically various types of lasers can be used as the light source Any of exposure mechanisms such as of inner drum type, outer drum type, or flat bed type can be used. The photosensitive composition of the photosensitive lithographic printing plate of the invention can be formulated so as to be soluble in neutral or weakly alkaline water with the use of highly water-soluble ingredients. When a photosensitive lithographic printing plate of such a composition is loaded on a press machine, image exposure and development can be performed on the machine.

As other exposure lights for the photosensitive lithographic printing plate of the invention, those emitted from a number of sources such as ultra-high, high, medium and low pressure mercury lamps, a carbon arc lamp, a xenon lamp, a metal halide lamp, various laser lamps, a fluorescent lamp, an incandescent lamp or the sun can be used.

The photosensitive lithographic printing plate of the invention is developed after image exposure.

The developer used for such development consists of preferably an aqueous alkali solution of a pH up to 14, and more preferably an aqueous alkali solution of a pH of from 8 1 to 12 containing an anionic surfactant. For example, inorganic alkaline compounds such as sodium, potassium or ammonium tertiary phosphate, sodium, potassium or ammonium secondary phosphate, sodium, potassium or ammonium carbonate, sodium, potassium or ammonium bicarbonate, sodium, potassium or ammonium borate, sodium, potassium, ammonium or lithium hydroxide, and organic ones such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenimine, ethylenediamine, and pyridine can be used.

These alkaline compounds may be used individually or in combination of two or more thereof.

In developing the photosensitive lithographic printing plate of the invention, an anionic surfactant is incorporated in the developer in an amount of 1 to 20% by weight, preferably 3 to 10% by weight. With a smaller amount of the surfactant than the lower limit cited above, the development does not proceed well, while with a larger amount than the upper limit cited above, various problems arise such as insufficient image strength including printing durability, etc.

Such anionic surfactants include, for example, sodium lauryl alcohol sulfate, ammonium lauryl alcohol sulfate, sodium octyl alcohol sulfate, sodium isopropylnaphthalenesulfonate, sodium isobutylnaphthalenesulfonate, sodium salt of polyoxyethylene glycol mononaphthyl ether sulfonate ester, alkylarylsulfonic acid salts such as sodium dodecylbenzenesulfonate and sodium m-nitrobenzenesulfonate, higher alcohol sulfuric acid esters of 3 to 22 carbon atoms such as sodium alkyl secondary sulfate, aliphatic alcohol phosphoric acid esters exemplified by the sodium salt of cetyl alcohol phosphate ester, the sulfonic acid salts of alkylamides exemplified by $C_{17}H_{33}CON(CH_3)CH_2CH_2SO_3Na$, and the sulfonic acid salts of dibasic aliphatic esters.

If required and necessary, an organic solvent miscible with water such as benzyl alcohol maybe added to the developer. As such an organic solvent, those having a solubility in water of about 10% by weight or lower are suited, and preferably selected from those having a solubility up to 5% by weight. Examples include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. A preferable range of the organic solvent content is from 1 to 5% by weight based on the total weight of the working developer. This content is closely related to the use amount of the anionic surfactant; as the amount of the organic solvent increases, it is desirable to increase the use amount of the anionic surfactant. The reason is that, if a small amount of an anionic surfactant is used in combination with a large amount of an organic solvent, the organic solvent fails to dissolve in the developer thus making it difficult to secure good developing characteristics.

Still further, depending on need, other additives such as an anti-forming agent and a hard water softener may be added. As the examples of hard water softener, polyphosphate salts such as, for example, $Na_2P_2O_7$, $Na_5P_3O_3$, $Na_3P_3O_9$, $Na_2O_4P$ $(NaO_3P)$ $PO_3Na_2$ or Calgon (sodium polymetaphosphate), aminopolycarboxylic acid salts such as, for example, ethylenediaminetetraacetic acid and the potassium or sodium salt thereof,
diethylenetriaminepentaacetic acid and the potassium or sodium salt thereof, triethylenetriaminehexaacetic acid and the potassium or sodium salt thereof,
hydroxyethylethylenediaminetriacetic acid and the potassium or sodium salt thereof, nitrilotriacetic acid and the potassium or sodium salt thereof, 1,2-diaminocyclohexanetetraacetic acid and the potassium or sodium salt thereof,
1,3-d-amino-2-propanoltetraacetic acid and the potassium or sodium salt thereof, organic phosphonic acids and their salts such as 2-phosphonobutanetricarboxylic acid-1,2,4 and the potassium or sodium salt thereof,
2-phosphonobutanetricarboxylic acid-2,3,4 and the potassium or sodium salt thereof, 1-phosphonoethanetricarboxylic acid-1,2,2 and the potassium or sodium salt thereof,
1-hydroxyethane-1,1-diphosphonic acid and the potassium or sodium salt thereof, and aminotri(methylenephosphonic acid) and the potassium or sodium salt thereof are included. The most appropriate amount of such a hard water softener, which depends on the hardness and quantity of hard water used, is usually from 0.01 to 5% by weight, preferably from 0.01 to 0.5% by weight of the working developer.

In the case where the photosensitive lithographic printing plate is processed with an automatic processor, the developer is gradually exhausted corresponding to the processed amount, thus the developing capability may be recovered by adding a replenisher or a fresh developer. It is preferable to adopt a replenishing method given in U.S. Pat. No. 4,882,246.

The developers given in Japanese Patent Laid-Open Nos. 26601/1975and 54341/1983, and Japanese Patent Publication Nos. 39464/1981, 42860/1981 and 7427/1982 are also preferably used.

The photosensitive lithographic printing plate thus processed is subjected to a post-processing with a rinse water, a rinse liquid containing a surfactant, or a desensitizing liquid containing gum arabic or a starch derivative as described in Japanese Patent Laid-Open Nos. 8002/1979, 115045/1980 and 58431/1984. As the post-processing for the photosensitive lithographic printing plate of the invention, various combinations of the procedure cited above may be adopted.

A lithographic printing plate thus prepared is loaded on an offset press machine to produce a large number of prints.

Conventionally known plate cleaners for PS plates including CL-1, CL-2, CP, CN-4, CN, CG-1, PC-1, SR, and IC, all being the products of Fuji Photo Film Co., Ltd. are used to remove the stains on the plate formed during printing.

EXAMPLES

The invention will be explained with reference to some examples, to which, however, the invention is not limited at all.

Synthesis Example 1

In 300 ml acetone, 120.2 g of 1,1,1-tris (hydroxymethyl) ethane and 75.0 g of 2-methoxypropene were suspended. After the addition of one drop of concentrated sulfuric acid at 0° C., the suspension was stirred for one hour. Then, the temperature of the suspension was set back to room temperature, and the suspension was further stirred for 2 hours. After the elimination of acetone by distillation, the distillate obtained under a reduced pressure of 1.7 mm Hg at 70° C. was collected to yield 155.2 g of (1,4,4-trimethyl-3,5-dioxyanyl)methane-1-ol.

Synthesis Example 2

In 90 ml tetrahydrofuran, 48.1 g of cis-1,2-cyclohexanedicarboxylic anhydride, 46.3 g of the (1,4,4-trimethyl-3,5-dioxyanyl)methane-1-ol prepared in Synthesis Example 1 and 1.8 g of 4-(dimethylamino)pyridine were dissolved, and the resulting mixture was refluxed for 6 hours under heating. After the elimination of the tetrahydrofuran by distillation, the mixture was subjected to silica gel column chromatography to yield 54.7 g of 2-((1,4,4-trimethyl-3,5-dioxanyl) methyl) oxycarbonyl) cyclohexanecarboxylic acid.

Synthesis Example 3

In 100 ml of tetrahydrofuran, the 2-((1,4,4-trimethyl-3,5-dioxanyl)methyl)oxycarbonyl)cyclohexanecarboxylic acid prepared in Synthesis Example 2 was dissolved. To the solution was added 40 ml of 1N hydrochloric acid, and the resulting solution was stirred for 2 hours at room temperature. After condensation, the solution was added with 100 ml tetrahydro furan and 100 g anhydrous magnesium sulfate. Thereafter, the mixture was left to stand still for one hour. Then the filtrate obtained by filtration was condensed followed by silica gel column chromatography treatment to yield 25.3 g of 2-((3-hydroxy-2-hydroxymethyl)-2-methylpropylmethyl)oxycarbonyl)cyclohexanecarboxylic acid.

Synthesis Example 4

In a 500 ml three-neck round bottle flask equipped with a stirrer, 24.7 g of the 2-((3-hydroxy-2-hydroxymethyl)-2-methylpropylmethyl)oxycarbonyl)Cyclohexanecarboxylic acid prepared in Synthesis Example 3, and 10.0 g of a polypropylene glycol having a molecular weight of 1,000 were dissolved in 100 ml N,N-dimethylacetamide. To the resulting solution were added 3.4 g of hexamethylenediisocyanate and 20.0 g of 4,4'-diphenylmethanediisocyanate and five drops of di-n-butyl tin dilaurate, and the mixture was stirred at 100° C. for 5 hours. Thereafter, the mixture was diluted with 200 ml N,N-dimethylacetamide and 400 ml methanol. This reaction mixture was thrown into 4 liters of water under stirring whereby a white polymer deposited. After filtration, the polymer was washed with water, and dried in vacuum to yield 50.5 g of urethane polymer P-1 listed in Table 1. The weight-averaged molecular weight of this polymer measured by gel permeation chromatography was 42,000 in terms of polystyrene equivalent value, and the acid value was 1.52 meq/g.

Synthesis Example 5

By repeating the processes of Synthesis Example 4 except that methanol was changed to 2-hydroxyethyl methacrylate, 51.1 g of urethane polymer P-2 was prepared.

Synthesis Example 6

Similarly, binder polymers P-3 to P-30 and comparative samples PR-1 to PR-3 shown in Tables 1 and 2 were prepared.

TABLE 1

| Binder polymer | Component 1 | Component 2 | Component 3 | Component 4 | Polymerization molar ratio (charged monomer ratio) | Polymer chain end capping | Mol. W. (10000) | Acid value (meq/g) |
|---|---|---|---|---|---|---|---|---|
| P-1 | PO-1 | PD-13 | PI-1 | PI-7 | 45/5/10/50 | MeOH | 4.2 | 1.52 |
| P-2 | PO-1 | PD-13 | PI-1 | PI-7 | 45/5/10/40 | HEMA | 4.2 | 1.51 |
| P-3 | PO-1 | PD-1 | PI-2 | PI-8 | 40/10/20/30 | EtOH | 1.9 | 1.69 |
| P-4 | PO-1 | PD-4 | PI-3 | PI-5 | 20/30/15/35 | GDMA | 0.9 | 0.81 |
| P-5 | PO-1 | PD-5 | PI-5 | PI-6 | 40/10/25/25 | CHOH | 8.7 | 1.72 |

TABLE 1-continued

| Binder polymer | Component 1 | Component 2 | Component 3 | Component 4 | Polymerization molar ratio (charged monomer ratio) | Polymer chain end capping | Mol. W. (10000) | Acid value (meq/g) |
|---|---|---|---|---|---|---|---|---|
| P-6  | PO-1 | PD-8  | PD-12 | PI-1 | 5/30/15/50   | MeOH | 6.3  | 1.87 |
| P-7  | PO-1 | PD-9  | PD-11 | PI-7 | 10/25/15/50  | MeOH | 1.5  | 1.61 |
| P-8  | PO-1 | PD-12 | PD-13 | PI-4 | 40/5/5/50    | MPOH | 10.5 | 2.26 |
| P-9  | PO-1 | PO-7  | PI-3  | PI-4 | 35/15/45/5   | MPOH | 6.1  | 2.02 |
| P-10 | PO-1 | PO-9  | PO-16 | PI-3 | 15/30/5/50   | HEA  | 4.8  | 2.02 |
| P-11 | PO-1 | PI-1  | PI-3  | PI-8 | 50/5/15/30   | HEMA | 6.2  | 1.92 |
| P-12 | PO-2 | PD-2  | PI-2  | PI-5 | 30/20/10/40  | GAMA | 8.1  | 1.44 |
| P-13 | PO-2 | PO-4  | PO-6  | PI-7 | 10/20/20/50  | CHOH | 12.9 | 1.79 |
| P-14 | PO-3 | PD-6  | PD-10 | PI-2 | 30/15/5/50   | MeOH | 7.3  | 1.50 |
| P-15 | PO-4 | PD-10 | PI-3  | PI-5 | 45/5/35/15   | MPOH | 2.3  | 1.72 |
| P-17 | PO-4 | PO-10 | PO-11 | PI-6 | 10/30/10/50  | HEA  | 5.1  | 1.80 |
| P-18 | PO-5 | PD-3  | PD-6  | PI-1 | 25/5/20/50   | MeOH | 0.6  | 1.29 |
| P-19 | PO-6 | PO-12 | PD-13 | PI-1 | 15/15/20/50  | MPOH | 3.6  | 0.74 |
| P-20 | PO-6 | PD-14 | PI-1  | PI-4 | 45/5/35/15   | MeOH | 5.0  | 1.01 |

TABLE 2

| Binder polymer | Component 1 | Component 2 | Component 3 | Component 4 | Polymerization molar ratio (charged monomer ratio) | Polymer chain end capping | Mol. W. (10000) | Acid value (meq/g) |
|---|---|---|---|---|---|---|---|---|
| P-21 | PO-7  | PD-4  | PD-5  | PI-3 | 25/15/10/50 | HEA  | 3.9  | 1.05 |
| P-22 | PO-8  | PD-2  | PD-12 | PI-4 | 40/5/5/50   | MPOH | 4.1  | 1.69 |
| P-23 | PO-9  | PO-15 | PI-3  | PI-8 | 5/45/5/45   | MeOH | 11.2 | 1.74 |
| P-24 | PO-11 | PD-1  | PD-12 | PI-1 | 30/10/10/50 | CHOH | 3.7  | 1.43 |
| P-25 | PO-11 | PI-1  | PI-5  | PI-8 | 50/10/5/35  | MPOH | 6.4  | 2.02 |
| P-26 | PO-13 | PD-5  | PI-3  | PI-4 | 15/35/5/45  | MPOH | 4.2  | 0.91 |
| P-27 | PO-14 | PD-6  | PD-14 | PI-7 | 35/10/5/50  | MeOH | 5.1  | 0.74 |
| P-28 | PO-15 | PD-11 | PD-13 | PI-7 | 5/25/20/50  | GAMA | 8.1  | 1.26 |
| P-29 | PO-15 | PD-13 | PI-3  | PI-5 | 45/5/20/30  | MPOH | 5.5  | 1.49 |
| P-30 | PO-16 | PD-4  | PD-9  | PI-7 | 35/5/10/50  | HEMA | 1.3  | 1.50 |
| PR-1 | PD-8  | PD-13 | PI-1  | PI-7 | 35/15/10/40 | MPOH | 4.5  | 1.05 |
| PR-2 | PD-1  | PD-5  | PD-8  | PI-3 | 5/10/35/50  | HEMA | 8.6  | 1.97 |
| PR-3 | PD-4  | PD-11 | PI-6  | PI-8 | 35/15/25/25 | MeOH | 2.1  | 0.97 |

The abbreviations shown in Tables 1 and 2 mean the following compounds.

MeCH: methanol
EtCH: ethanol
MPOH: 1-methoxy-2-propanol
CHOH: cyclohexyl alcohol
HEA: 2-hydroxyethyl acrylate
HEMA: 2-hydroxyethyl methacrylate
GAMA: glycerol acrylate methacrylate
GDMtA: glycerol dimethacrylate

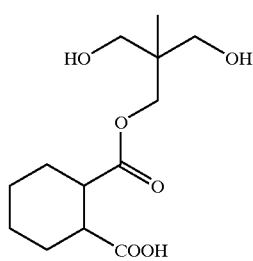

PO-1

PO-2

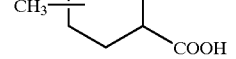

PO-3

PO-4 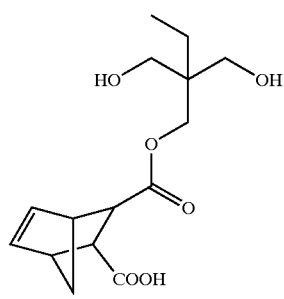
PO-9 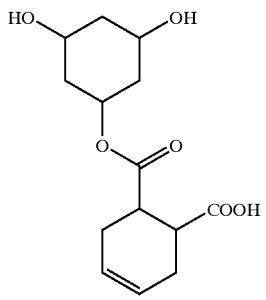
PO-5 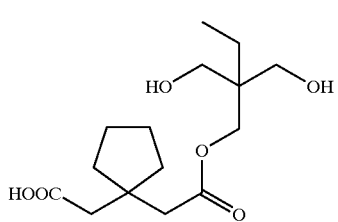
PO-10 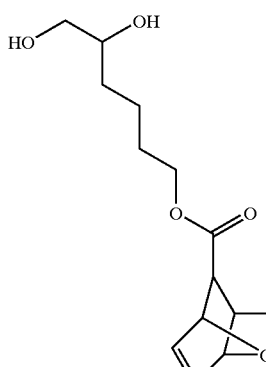
PO-6 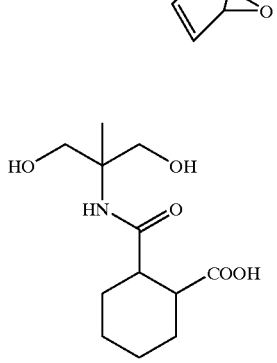
PO-11 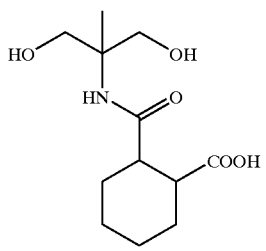
PO-7 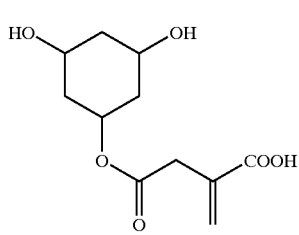
PO-12 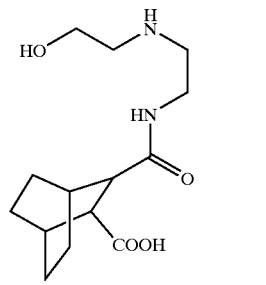
PO-8 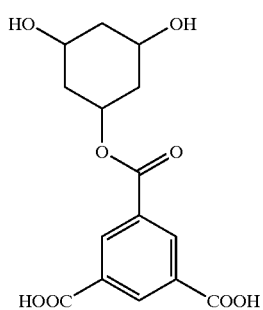
PO-13 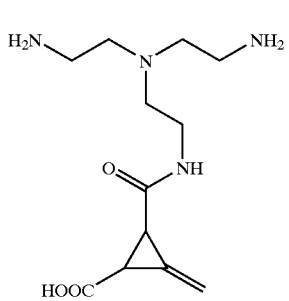

PO-14
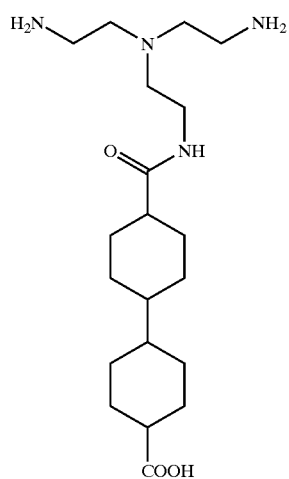
PO-15
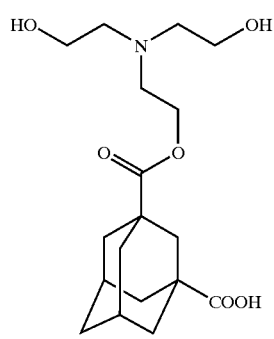
PO-16
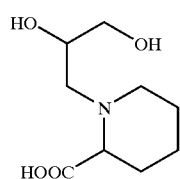
PD-1
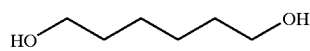
PD-2
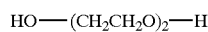
PD-3
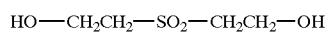
PD-4
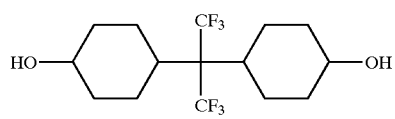
PD-5
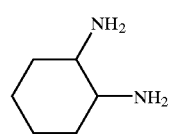
PD-6
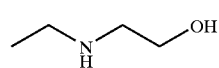
PD-7
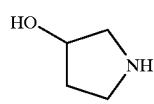
PD-8
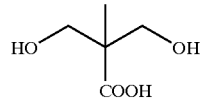
PD-9
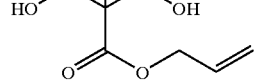
PD-10
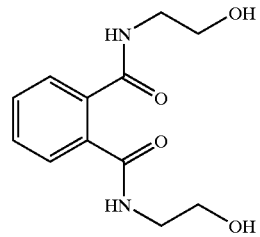
PD-11
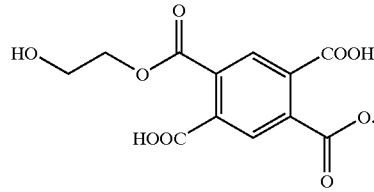
PD-12
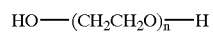
Average molecular weight: 300, n ≅ 7
PD-13
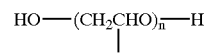
Average molecular weight: 1,000, n ≅ 7
PD-14
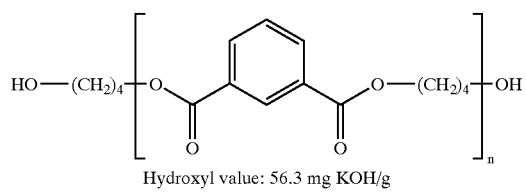
Hydroxyl value: 56.3 mg KOH/g
PI-1
PI-2
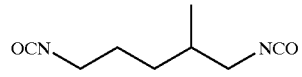
PI-3
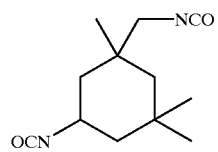
PI-4

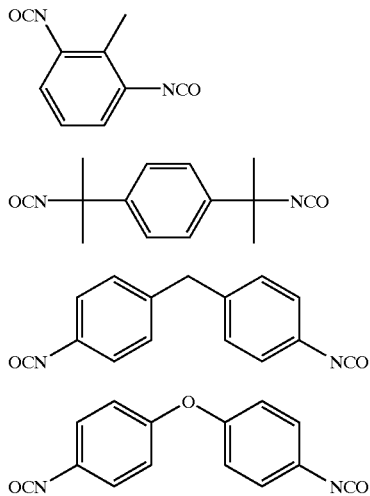

PI-5
PI-6
PI-7
PI-8

Examples 1 to 20 and Comparative Examples 1 to 3

By following the procedures to be described below, a series of negative type photosensitive lithographic printing plates were prepared, and the printing characteristics thereof were evaluated. The results are summarized in Table 3.

[Preparation of Support]

A JIS A 1050 aluminum web of 0.24 mm thickness and 1030 mm width was continuously subjected to the following treatments.

(a) The surface of the sheet was mechanically grained with rotating nylon brush rollers along with feeding, on the surface of the aluminum web, a graining slurry comprising an aqueous suspension of pumice as the abradant with a specific gravity of 1.12. The average particle diameter of the abradant was 40 to 45 µm with the maximum diameter of 200 µm. The nylon brushes were made of 6.10 nylon, the hair length was 50 mm, and the diameter of the hair was 0.3 mm. The nylon brush was fabricated by transplanting the hairs into holes closely made at the surface of a stainless steel pipe of 300 mm ø. Three rotating brushes were used. Two supporting rollers of 200 mm ø arranged beneath the brush rollers were separated from each other by 300 mm. The brush rollers were pushed to the aluminum web by such a force that the load to the driving motor which rotated the brush increased by 7 kW compared to the load before the rollers were brought into contact with the sheet. The rotating direction of the brushes was the same as the moving direction of the aluminum web, and the rate of rotation was 200 rpm.

(b) The grained aluminum web was subjected to an etching treatment by spraying a solution containing 26% by weight of caustic soda and 6.5% by weight of aluminum ion at 70° C. to dissolve 0 3 g/m² aluminum. Thereafter, the sheet was rinsed by spraying water.

(c) Desmutting was conducted on the sheet by spraying an aqueous 1% by weight nitric acid (containing 0.5% by weight of aluminum ion) at 30° C., and then the sheet was rinsed by spraying water. The aqueous nitric acid used for the above desmutting is the waste solution resulting from the electrochemical graining conducted in an aqueous nitric acid with use of ac.

(d) Electrochemical graining was conducted using a 60 Hz ac in a continuous mode. The electrolytic solution was an aqueous 1% by weight nitric acid (containing 0.5% by weight of aluminum ion and 0.007% by weight of ammonium ion) kept at 40° C. The waveform of the ac was trapezoidal having TP, a time required for the current reaching the peak from zero, of 2 msec, and a duty ratio of 1:1. A carbon electrode was used as the counter electrode for the electrochemical graining. A ferrite auxiliary anode was used. The peak current density was 30 A/dm², and the electric quantity was 255 C./cm² in total when the aluminum web acted as anode. To the auxiliary electrode, 5% of the current from the power source was divided. After the graining, the sheet was rinsed by spraying water.

(e) The grained aluminum web was etched by spraying a solution containing 26% by weight of caustic soda and 6.5% by weight of aluminum ion at 32° C. to dissolve 0.2 g/m² of the aluminum web whereby the smut component mainly comprising aluminum hydroxide formed during the preceding electrochemical graining using ac was eliminated and the edge portion of the pits formed was dissolved to smoothen the edge. Thereafter, the sheet was rinsed by spraying water.

(f) Desmutting was conducted on the sheet by spraying an aqueous 25% by weight sulfuric acid (containing 0.5% by weight of aluminum ion) at 60° C., and then the sheet was rinsed by spraying water.

(g) By using a conventional anodic oxidation apparatus for two-step electrolytic treatment (the lengths of the first and second electrolysis parts: 6 m, the length of the first electric feeding part: 3 m, the length of the second electric feeding part: 3 m, and the length of the first and second feeding electrodes: 2.4 m), an anodic oxidation treatment was conducted with the sulfuric acid concentration at the electrolysis part of 170 g/liter (containing 0.5% by weight of aluminum ion) at 38° C. Thereafter, the sheet was rinsed by spraying water, In this treatment, the current from the power source flows into the first feeding electrode provided in the first electric feeding part, then to the aluminum web via the electrolytic solution to form an oxide film on the surface of the aluminum web at the first electrolysis part, further passes through the electrolysis electrode provided in the first electric feeding part, and returns to the power source. On the other hand, the current from the power source flows into the second feeding electrode provided in the second electric feeding part, and then similarly to the aluminum web via the electrolytic solution to form an oxide film on the surface of the aluminum web at the second electrolysis part. The electric quantity fed to the first feeding part from the power source is the same as that fed to the second feeding part, and the feeding current density at the oxide film-bearing surface at the second feeding part was about 25 A/dm². In the second feeding part, feeding was done from the surface having an oxide film of 1.35 g/m². The amount of the oxide film finally obtained was 2.7 g/m². The aluminum support at this stage is designated [AS-1].

[Hydrophilicity-enhancing Treatment]

A silicate treatment was conducted on aluminum support [AS-1] to enhance the hydrophilic nature as the non-image area of the printing plate by conveying the aluminum web in such a manner that the web was in contact with a 1.5% aqueous solution of No. 3 sodium silicate kept at 70° C. for 15 seconds. Then, the web was rinsed with water. The deposited amount of Si was 10 mg/m². The support thus finished is designated [AS-2].

[Coating of Interlayer]

Via the following procedure, a fluidized composition (a sol) for use in SG process was prepared. The following ingredients were charged and weighed in a beaker, and stirred for 20 min at 25° C.

| | |
|---|---|
| Tetraethoxysilane | 38 g |
| 3-Methacryloxypropyltrimethoxysilane | 13 g |
| 85% aqueous phosphoric acid | 12 g |
| Ion-exchanged water | 15 g |
| Methanol | 100 g |

The solution was poured into a three-neck flask, which was equipped with a reflux cooler and put in an oil bath of room temperature. With stirring by means of a magnetic stirrer, the content of the three-neck flask was heated to 50° C. over the period of 30 min. Then, the content was allowed to react for 1 hour at 50° C. to give a sol. This sol fluid was diluted with a mixture of methanol and ethylene glycol (20:1 in weight ratio) so as to give a concentration of 0.5% by weight. The diluted product was coated on aluminum support [AS-1] prepared above with a whirler, and dried at 100° C. for one min. The coated weight was 3.5 mg/m² which was derived from the amount of Si element determined by X-ray fluorescent analysis. The support thus finished is designated [AS-3].

As a next treatment, a coating mixture of the following composition was coated on aluminum support [AS-2] with a wire bar, and dried at 90° C. for 30 sec with a hot air stream-type drying apparatus. The coated amount after drying was 10 mg/m².

| | |
|---|---|
| Copolymer of ethyl methacrylate and Na 2-acrylamide-2-methyl-1-propanesulfonate with a copolymerization molar ratio of 75:25 | 0.1 g |
| 2-Aminoethylphosphonic acid | 0.1 g |
| Methanol | 50 g |
| Ion-exchanged water | 50 g |

The thus coated support is designated [AS-4].

[Coating of Photosensitive Layer]

On the aluminum support prepared in this manner, a negative type photosensitive composition consisting of the following ingredients was coated so as to give the coated amount on dry base shown in Table 3, and dried at 100° C. for 1 min to provide a photosensitive layer.

| (Negative type photosensitive composition) | |
|---|---|
| Addition-polymerizable compound (shown in Table 3) | 1.5 g |
| Binder polymer (shown in Table 3) | 2.0 g |
| Spectral sensitizer (shown in Table 3) | 0.2 g |
| Photo-polymerization initiator (shown in Table 3) | 0.4 g |
| Co-spectral sensitizer (shown in Table 3) | 0.4 g |
| Fluorine-containing nonionic surfactant (Megafac F-177, a product of Dai-nippon Ink and Chemicals, Inc.) | 0.03 g |
| Heat-polymerization inhibitor (aluminum salt of N-nitrosophenylhydroxylamine) | 0.01 g |
| Pigment dispersion for coloration described below | 2.0 g |
| Methyl ethyl ketone | 20.0 g |
| Propylene glycol monomethyl ether | 20.0 g |
| (Pigment dispersion for coloration) | |
| Pigment Blue 15:6 | 15 parts by weight |
| Allyl methacrylate/methacrylic acid copolymer (copolymerization molar ratio: 80:20, weight-averaged molecular weight: 40,000) | 10 parts by weight |
| Cyclohexanone | 15 parts by weight |
| Methoxypropyl acetate | 20 parts by weight |
| Propylene glycol monomethyl ether | 40 parts by weight |

[Coating of Protective Layer]

On this photosensitive layer, a 3% by weight aqueous solution of poly(vinyl alcohol) (degree of saponification: 98 mol %, degree of polymerization: 550) was coated so as to give a coated amount on dry base of 2 g/m², and dried at 100° C. for 2 min.

[Exposure to Negative Type Photosensitive Lithographic Printing Plate]

On the negative type photosensitive lithographic printing plate thus prepared, a solid image exposure and a 2540 dpi, 175 lines/inch halftone tint image exposure ranging from 1% to 99% with 1% increment was given with use of an FD-YAG (532 nm) laser exposure device installed in Gutenberg, a plate-setter made by Heidelberg Pressmachine, Inc. At these exposures, the laser power was adjusted so that the exposure energy density at the plate surface was 200 µJ/cm².

[Development/Plate-making]

Each of the developers shown in Table 3 and finisher FP-2W (a product of Fuji Photo Film Co., Ltd.) were charged in automatic processor FLP-813, a product of Fuji Photo Film Co., Ltd. The exposed plate was developed and processed to produce a printing plate with the processor under the condition of development temperature of 30° C. and development time of 18 sec.

[Test of Solid Area Printing Durability]

An R201 of Roland Co., Ltd. was used as the press machine, and Graph G (N) of Dainippon Ink and Chemicals, Inc. was used as the ink. The solid area obtained by uniform exposure was visually inspected. The printing durability of the plate was expressed by the number of runs at which the solid area became non-uniform in density. Larger numbers indicate higher printing durabilities.

[Accelerated Test of Tint Area Printing Durability]

The same press machine, R201 of Roland Co., Ltd. was used as the press machine, and Graph G (N) of Dainippon Ink and Chemicals, Inc. was used as the ink. At the 5,000th print from the start, the tint area of the plate was wiped with a sponge impregnated with PS Plate Cleaner CL-2 made by Fuji Photo Film Co., Ltd. to remove the ink on the plate. Thereafter, 10,000 prints were produced, and the prints were visually inspected as to halftone dot deficiency.

Examples 21 to 30 and Comparative Examples 4 to 6

As in Examples 1 to 20, negative type photosensitive lithographic printing plates shown in Table 4 were prepared and evaluated on the characteristics thereof.

Each compound listed in Tables 3 and 4 will be shown below.

[Addition-polymerizable Compound]

M-1: pentaerythritol tetraacrylate (NK Ester A-TMMT, a product of Shin Nakamura Chemical Industries, Ltd.)

M-2: glycerin dimethacrylate hexamethylenediisocyanate urethane pre-polymer (UA 101H, a product of Kyoeisha Chemical Co., Ltd.)

M-3: dipentaerythritol acrylate (NK Ester A-9530, a product of Shin Nakamura Chemical Industries, Ltd.)

[Materials for Photo-polymerization Initiating System]

I-1

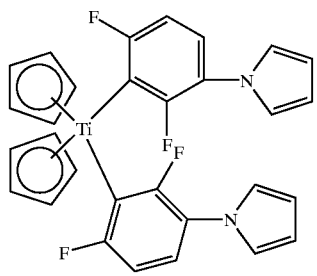

I-2

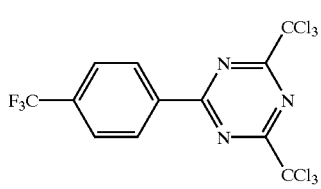

S-1

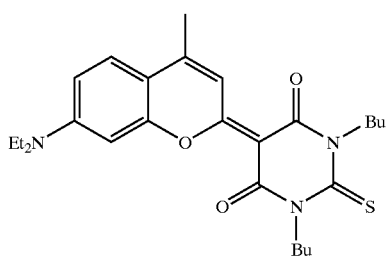

S-2

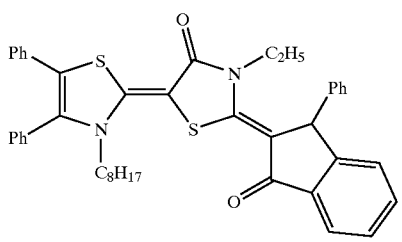

C-1

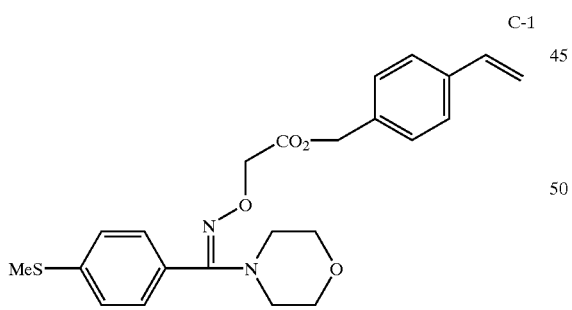

C-2

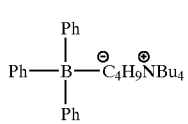

C-3

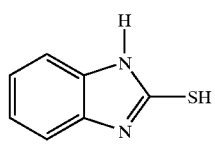

[Binder Polymer]

PA-1

Allyl methacrylate (POC-1)/methacrylic acid copolymer (copolymerization molar ratio: 80:20)

Acid value measured by NaOH titration: 1.70 meq/g

Weight-averaged molecular weight measured by GPC: 48,000

PA-2

Methyl methacrylate/acrylonitrile/N-[(4-sulfamoyl)phenyl]methacrylamide copolymer (copolymerization molar ratio: 37:30:33)

Weight-averaged molecular weight measured by GPC: 49,000

[Developer]

D-1

An aqueous solution of the following composition with a pH of 10.

| | |
|---|---|
| Monoethanolamine | 0.1 parts by weight |
| Triethanolamine | 1.5 parts by weight |
| Compound of the following formula (1) | 4 parts by weight |
| Compound of the following formula (2) | 2.5 parts by weight |
| Compound of the following formula (2) | 0.2 parts by weight |
| Water | 91.7 parts by weight |

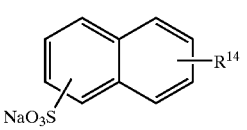

Formula (1)

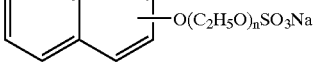

Formula (2)

Formula (3)

In formula (1), $R^{14}$ represents a hydrogen atom or butyl group.

D-2

An aqueous solution of the following composition.

| | |
|---|---|
| 1K potassium silicate | 3.0 parts by weight |
| Potassium hydroxide | 1.5 parts by weight |
| Compound of formula (3) | 0.2 parts by weight |
| Water | 95.3 parts by weight |

TABLE 3

| No. | Support | Add-pol. Comp. | Binder Polymer | Photo-pol. Initiator | Spectr. Sensitizer | Co-sensitizer | Coated Amount on Dry Base (g/m$^2$) | Developer | Printing Durability Solid Area (10000) | Halftone Tint Area |
|---|---|---|---|---|---|---|---|---|---|---|
| Example 1 | AS-3 | M-1 | P-1 | I-1 | S-1 | C-1 | 1.2 | D-2 | 25 | Excellent |
| Example 2 | AS-1 | M-1 | P-2 | I-1 | S-2 | C-1 | 1.3 | D-2 | 22 | Good |
| Example 3 | AS-3 | M-2 | P-4 | I-2 | S-1 | C-3 | 1.4 | D-2 | 33 | Excellent |
| Example 4 | AS-1 | M-3 | P-5 | I-1 | S-2 | C-1 | 1.4 | D-1 | 39 | Good |
| Example 5 | AS-3 | M-2 | P-7 | I-1 | S-2 | C-2 | 1.3 | D-2 | 33 | Good |
| Example 6 | AS-3 | M-3 | P-9 | I-2 | S-1 | C-3 | 1.6 | D-2 | 27 | Excellent |
| Example 7 | AS-3 | M-1 | P-11 | I-1 | S-1 | C-2 | 1.2 | D-2 | 28 | Good |
| Example 8 | AS-3 | M-1 | P-13 | I-2 | S-2 | C-1 | 1.4 | D-2 | 45 | Excellent |
| Example 9 | AS-1 | M-2 | P-16 | I-2 | S-1 | C-1 | 1.5 | D-2 | 37 | Excellent |
| Example 10 | AS-1 | M-1 | P-17 | I-2 | S-2 | C-2 | 1.5 | D-1 | 34 | Excellent |
| Example 11 | AS-3 | M-2 | P-18 | I-1 | S-2 | C-1 | 1.4 | D-2 | 21 | Good |
| Example 12 | AS-3 | M-2 | P-20 | I-1 | S-2 | C-1 | 1.3 | D-1 | 27 | Excellent |
| Example 13 | AS-1 | M-3 | P-22 | I-2 | S-1 | C-1 | 1.4 | D-2 | 30 | Excellent |
| Example 14 | AS-3 | M-3 | P-23 | I-1 | S-2 | C-3 | 1.7 | D-1 | 23 | Excellent |
| Example 15 | AS-3 | M-1 | P-24 | I-2 | S-1 | C-1 | 1.4 | D-2 | 27 | Good |
| Example 16 | AS-3 | M-2 | P-25 | I-1 | S-2 | C-1 | 1.3 | D-2 | 27 | Excellent |
| Example 17 | AS-1 | M-3 | P-26 | I-2 | S-1 | C-1 | 1.5 | D-2 | 25 | Good |
| Example 18 | AS-3 | M-3 | P-27 | I-1 | S-2 | C-3 | 1.7 | D-1 | 35 | Excellent |
| Example 19 | AS-1 | M-3 | P-28 | I-1 | S-2 | C-3 | 1.5 | D-1 | 30 | Good |
| Example 20 | AS-3 | M-1 | P-29 | I-2 | S-1 | C-1 | 1.4 | D-2 | 27 | Good |
| Compar. Example 1 | AS-3 | M-1 | PR-1 | I-1 | S-1 | C-1 | 1.4 | D-2 | 5 | Excellent |
| Compar. Example 2 | AS-3 | M-3 | PR-2 | I-2 | S-2 | C-1 | 1.4 | D-2 | 14 | Dot deficiency |
| Compar. Example 3 | AS-3 | M-2 | PR-3 | I-1 | S-1 | C-2 | 1.4 | D-2 | 4 | Dot deficiency |

TABLE 4

| No. | Support | Add. Pol. Compound | Binder Polymer 1 | Binder Polymer 2 | Weight Ratio of 1:2 | Phot-pol. Initiator | Spectr. Sens. | Co-sens. | Coated Amount on Dry Base (g/m$^2$) | Developer | Printing Durability Solid Area (10000) | Halftone Tint Area |
|---|---|---|---|---|---|---|---|---|---|---|---|---|
| Example 21 | AS-1 | M-1 | P-3 | P-6 | 5/5 | I-1 | S-2 | C-1 | 1.4 | D-2 | 30 | Good |
| Example 22 | AS-3 | M-3 | P-8 | P-21 | 6/4 | I-1 | S-1 | C-1 | 1.2 | D-2 | 28 | Good |
| Example 23 | AS-3 | M-2 | P-8 | P-30 | 7/3 | I-2 | S-1 | C-2 | 1.2 | D-2 | 34 | Good |
| Example 24 | AS-1 | M-2 | P-10 | P-21 | 8/2 | I-1 | S-2 | C-1 | 1.4 | D-1 | 33 | Good |
| Example 25 | AS-3 | M-1 | P-12 | P-28 | 9/1 | I-2 | S-2 | C-3 | 1.4 | D-1 | 21 | Excellent |
| Example 26 | AS-3 | M-1 | P-14 | P-15 | 3/7 | I-2 | S-1 | C-1 | 1.6 | D-2 | 24 | Excellent |
| Example 27 | AS-1 | M-2 | P-1 | PA-1 | 8/2 | I-1 | S-1 | C-1 | 1.4 | D-2 | 21 | Excellent |
| Example 28 | AS-3 | M-3 | P-10 | PA-2 | 5/5 | I-1 | S-1 | C-1 | 1.4 | D-1 | 23 | Excellent |
| Example 29 | AS-3 | M-2 | P-10 | PA-2 | 7/3 | I-2 | S-2 | C-3 | 1.7 | D-1 | 22 | Excellent |
| Example 30 | AS-3 | M-1 | P-26 | PR-3 | 7/3 | I-2 | S-2 | C-1 | 1.2 | D-1 | 27 | Good |
| Compar. Example 4 | AS-3 | M-2 | PR-1 | PA-1 | 5/5 | I-2 | S-2 | C-1 | 1.3 | D-2 | 9 | Dot deficiency |
| Compar. Example 5 | AS-1 | M-2 | PR-1 | PA-2 | 8/2 | I-1 | S-1 | C-1 | 1.5 | D-2 | 7 | Good |
| Compar. Example 6 | AS-3 | M-3 | PR-3 | PA-1 | 9/1 | I-1 | S-1 | C-3 | 1.5 | D-1 | 10 | Dot deficiency |

Examples 31 to 50 and Comparative Examples 7 to 9

[Coating of Photosensitive Layer]

A coating mixture of the following composition was prepared and coated on aluminum support [AS-4] with a wire bar so as to give the coated amount after drying shown in Table 5. The coated support was dried at 115° C. for 45 sec with use of a hot air stream-type drying apparatus to complete a photosensitive layer.

| | |
|---|---|
| Coating mixture for the photosensitive layer | 1.0 g |
| Addition-polymerizable compound (shown in Table 5) | |
| Binder polymer (shown in Table 5) | 1.0 g |
| IR absorber (IR-1) | 0.08 g |
| Heat-polymerization initiator (shown in Table 5) | 0.3 g |
| Fluorine-containing nonionic surfactant (Megafac F-177, a product of Dai-nippon Ink and Chemicals, Inc.) | 0.01 g |

-continued

| | |
|---|---|
| Naphthalenesulfonic acid salt of Victoria Pure Blue | 0.04 g |
| Methyl ethyl ketone | 9.0 g |
| Propylene glycol monomethyl ether | 8.0 g |
| Methanol | 10.0 g |

[Coating of Protective Layer]

On the above photosensitive layer, an aqueous by weight solution of poly(vinyl alcohol) (degree of saponification: 98 mol %, degree of polymerization: 550) was coated so as to give a coated weight or 2 g/m² on dry base, depending on need. The plate was dried at 100° C. for 2 min.

exposure was visually inspected. The printing durability of the plate was expressed by the number of runs at which the solid area becomes non-uniform in density. The larger the number is, the higher printing durability is indicated.

[Accelerated Printing Durability Test for Halftone Tint Area]

The same press machine, Lithron of Komori Corp. was used as the press machine, and Graph G (N) of Dainippon Ink and Chemicals, Inc. was used as the ink. At the 5,000th print from the start, the tint area of the plate was wiped with a sponge impregnated with PS Plate Cleaner CL-2 made by Fuji Photo Film Co., Ltd. to clean the ink on the plate. Thereafter, 10,000 prints were produced, and the prints were visually inspected as to halftone dot deficiency.

TABLE 5

| | | Photosensitive Layer | | | | | | | Printing Durability | |
|---|---|---|---|---|---|---|---|---|---|---|
| | | | Binder Polymer | | Weight Ratio | Heat-pol. | Coated Amount on Dry Base | Protect. | | Solid Area | Halftone |
| No. | Support | Add-polym. Compound | 1 | 2 | of 1 to 2 | Init. | (g/m²) | layer | Developer | (10,000) | Tint Area |
| Example 31 | AS-4 | M-3 | P-2 | None | — | OI-1 | 1.4 | None | D-3 | 38 | Excellent |
| Example 32 | AS-4 | M-3 | P-3 | None | — | OI-1 | 1.2 | Yes | D-3 | 40 | Good |
| Example 33 | AS-1 | M-2 | P-5 | None | — | OI-2 | 1.2 | None | D-2 | 25 | Good |
| Example 34 | AS-4 | M-1 | P-7 | None | — | OI-1 | 1.2 | Yes | D-1 | 33 | Excellent |
| Example 35 | AS-2 | M-3 | P-11 | None | — | OI-2 | 1.3 | None | D-3 | 21 | Excellent |
| Example 36 | AS-4 | M-3 | P-14 | None | — | OI-3 | 1.1 | None | D-3 | 28 | Excellent |
| Example 37 | AS-3 | M-2 | P-16 | None | — | OI-1 | 1.3 | Yes | D-3 | 32 | Excellent |
| Example 38 | AS-3 | M-2 | P-19 | None | — | OI-1 | 1.3 | None | D-2 | 23 | Excellent |
| Example 39 | AS-4 | M-1 | P-21 | None | — | OI-2 | 1.3 | None | D-1 | 36 | Excellent |
| Example 40 | AS-4 | M-1 | P-23 | None | — | OI-2 | 1.5 | Yes | D-1 | 27 | Good |
| Example 41 | AS-3 | M-3 | P-25 | None | — | OI-3 | 1.2 | Yes | D-3 | 30 | Good |
| Example 42 | AS-3 | M-3 | P-27 | None | — | OI-1 | 1.3 | None | D-2 | 24 | Good |
| Example 43 | AS-4 | M-3 | P-29 | None | — | OI-2 | 1.4 | None | D-1 | 34 | Good |
| Example 44 | AS-4 | M-2 | P-10 | P-6 | 8/2 | OI-1 | 1.2 | Yes | D-3 | 33 | Good |
| Example 45 | AS-2 | M-1 | P-12 | P-24 | 9/1 | OI-3 | 1.2 | None | D-3 | 21 | Excellent |
| Example 46 | AS-4 | M-3 | P-14 | PR-1 | 8/2 | OI-2 | 1.3 | None | D-2 | 24 | Excellent |
| Example 47 | AS-4 | M-2 | P-1 | PA-1 | 8/2 | OI-2 | 1.3 | None | D-1 | 36 | Excellent |
| Example 48 | AS-3 | M-3 | P-10 | PA-2 | 5/5 | OI-1 | 1.4 | Yes | D-3 | 23 | Excellent |
| Example 49 | AS-3 | M-2 | P-10 | PA-2 | 7/3 | OI-1 | 1.1 | None | D-3 | 22 | Excellent |
| Example 50 | AS-1 | M-3 | P-26 | PR-3 | 7/3 | OI-2 | 1.3 | None | D-1 | 27 | Good |
| Compar. Example 7 | AS-4 | M-3 | PR-1 | None | — | OI-1 | 1.3 | None | D-1 | 3 | Dot deficiency |
| Compar. Example 8 | AS-4 | M-2 | PR-2 | None | — | OI-1 | 1.2 | None | D-3 | 5 | Good |
| Compar. Example 9 | AS-4 | M-3 | PR-3 | PA-1 | 9/1 | OI-3 | 1.2 | Yes | D-3 | 10 | Dot deficiency |

[Exposure to Negative Type Photosensitive Lithographic Printing Plate]

The negative type photosensitive lithographic printing plate thus prepared was subjected to exposure with use of Trendsetter 3244VFS, a product of Creo Inc. equipped with a 40 W water-cooled IR semiconductor laser under the conditions of output power of 9 W, outer drum rotation of 210 rpm, exposure energy density at the plate surface of 100 µJ/cm², and resolution of 2400 dpi.

[Development/Plate-making]

The exposed plate was developed at 30° C. with automatic processor Stablon 900N, a product of Fuji Photo Film Co., Ltd. which had been charged with the developer shown in Table 5, and finisher FN:-6 (a product of Fuji Photo Film Co. , Ltd.) diluted with the same amount of water. A lithographic printing plate resulted.

[Printing Durability Test for Solid Image]

Lithron of Komori Corp. was used as the press machine, and Graph G (N) of Dainippon Ink and Chemicals, Inc. was used as the ink. The solid area obtained by solid image

[Heat-polymerization Initiators Shown in Table 5]

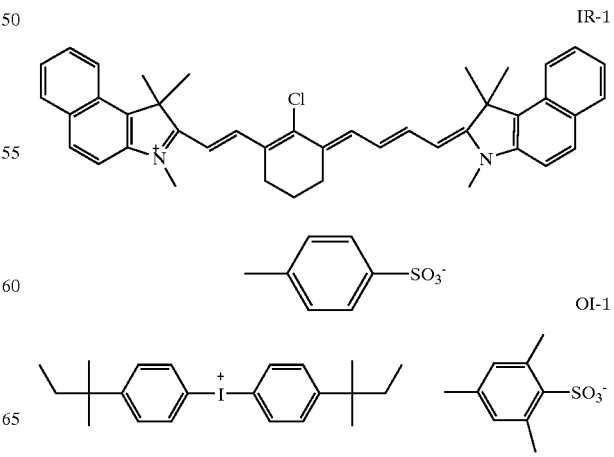

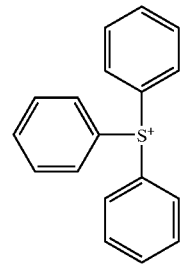

OI-2

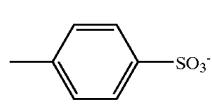

OI-3

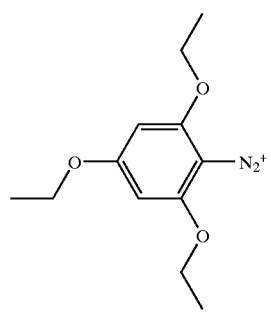

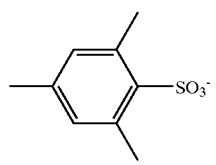

[Developer in Table 5]
D-3

| | |
|---|---|
| Sodium carbonate monohydrate | 10 g |
| Potassium bicarbonate | 10 g |
| Sodium isopropylnaphthalenesulfonate | 15 g |
| Sodium dibutylnaphthalenesulfonate | 15 g |
| Sodium ethylene glycol mononaphthyl ether monosulfonate | 10 g |
| Sodium sulfite | 1 g |
| Tetra sodium salt of ethylenediaminetetraacetic acid | 0.1 g |
| Ion-exchanged water | 938.9 g |

As is evident from Tables 3 to 5, the photosensitive lithographic printing plate associated with the invention having a photosensitive layer containing a polyurethane resin binder which has a aliphatic cyclic structure which has a carboxylic group as a substituent directly or indirectly attached to said structure can provide a printing plate having an extremely high printing durability.

The photosensitive lithographic printing plate of the invention can provide a printing plate having an extremely high printing durability owing to the use of a photosensitive layer containing a polyurethane resin binder which has a aliphatic cyclic structure which has a carboxylic group as a substituent directly or indirectly attached to said structure. Further, the photosensitive lithographic printing plate of the invention is suited for scanning exposure with a laser light, enabling a high-speed writing and simultaneously achieving a high productivity.

[Synthesis Example 7]

44.7 g of a polyvinyl alcohol having a saponification degree of 99% and a weight-average polymerization degree of 500 was dissolved in 775.0 g of purified water. The aqueous solution thus prepared was then cooled to a temperature of 5° C. To the aqueous solution was then added 1.6 g of concentrated hydrochloric acid (35% by weight) with stirring. To the mixture was then added dropwise 30.9 g of cyclohexanecarboxy aldehyde in 10 minutes. When 45 minutes passed from the beginning of dropwise addition, precipitation occurred. When 10 minutes passed from precipitation, 110.0 g of concentrated hydrochloric acid (35% by weight) was then added to the mixture. The mixture was allowed to stand for 4 hours, and then heated to a temperature of 60° C. where it was then kept for 4 hours to obtain a polyvinyl acetal. The polyvinyl acetal thus obtained was washed twice with purified water, dispersed in 800 g of purified water so that it was neutralized, and then stirred with its pH value kept to 9.5 for 4 hours. The polvinyl acetal thus obtained was dehydrated, and then extracted with n-hexane as a solvent in a Soxhlet extractor overnight so that the residual aldehyde was removed to obtain 68.0 g of a polyvinyl acetal. The polyvinyl acetal thus obtained had a polymerization degree of 550, a residual hydroxyl group content of 43.5 and a residual acetyl group content of 1.5.

[Synthesis Example 8]

16.9 g of the Polyvinyl acetal obtained in Synthesis Example 7 was added to 170 g of N,N-dimethylformamide. The mixture was then stirred at a temperature of 90° C. for 3 hours to make a solution. To the solution thus obtained was then added dropwise a solution of 6.1 g of 1,2-cyclohexanedicarboxylic anhydride in 30 g of N,N-dimethylformamide at a temperature of 90° C. in 15 minutes. Thereafter, to the solution was added 0.6 g of 4-(dimethylamino)pyridine. The mixture was then stirred at a temperature of 90° C. for 4 hours. The mixture was then allowed to cool to a temperature of 60° C. To the mixture was then added 7.3 g of acetic acid. The mixture was then allowed to cool to room temperature. The solution was added to a mixture of 1,400 g of water and 40 g of methanol, and then stirred for 2 hours. The resulting white solid was with drawn by filtration, and then dried to obtain 21.4 g of a binder polymer (P-31) according to the invention set forth in Table 6. The binder polymer thus obtained exhibited a weight-average molecular weight of 61,000 in polystyrene equivalence as determined by gel permeation chromatography, a residual hydroxyl group content of 15.5, a residual acetyl group content of 1.5 and an acid value of 1.69 meq/g.

Synthesis Example 9

Binder polymers (P-22) to (P50) according to the second preferred embodiment of the invention and comparative samples (PR-4) to (PR-6) set forth in Tables 6 and 7 were obtained in the same manner as mentioned above.

TABLE 6

| Binder polymer | R$^1$ | R$^2$ | R$^3$ | Molar ratio (a/b/c/d/e) | molecular weight (unit: 10,000) | Acid value (meq/g) |
|---|---|---|---|---|---|---|
| P-31 | P1-1 | None | P3-5 | 55/0/28/15.5/1.5 | 6.1 | 1.69 |
| P-32 | P1-1 | None | P3-1 | 55/0/35/8.5/1.5 | 5.9 | 2.20 |
| P-33 | P1-1 | None | P3-2 | 55/0/32/8/5 | 8.3 | 2.04 |
| P-34 | P1-1 | None | P3-3 | 60/0/38/0/2 | 12.3 | 2.01 |
| P-35 | P1-1 | P2-1 | P3-4 | 25/20/40/13/2 | 8.3 | 2.05 |
| P-36 | P1-1 | None | P3-6 | 40/0/25/30/5 | 2.6 | 1.52 |
| P-37 | P1-1 | None | P3-7 | 55/0/15/20/10 | 0.8 | 0.98 |
| P-38 | P1-1 | P2-2 | P3-8 | 35/25/10/25/5 | 6.5 | 1.29 |
| P-39 | P1-1 | None | P3-9 | 60/0/30/9/1 | 4.5 | 1.66 |
| P-40 | P1-1 | None | P3-10 | 40/0/40/10/10 | 10.3 | 2.30 |
| P-41 | P1-2 | P2-4 | P3-5 | 20/35/30/10/5 | 18.9 | 1.55 |
| P-42 | P1-3 | None | P3-2 | 55/0/25/15/5 | 8.3 | 1.39 |
| P-43 | P1-4 | P2-3 | P3-3 | 40/10/30/6/14 | 5.5 | 1.66 |
| P-44 | P1-5 | None | P3-6 | 55/0/40/0/5 | 8.3 | 1.72 |
| P-45 | P1-6 | None | P3-10 | 30/0/60/5/5 | 21.2 | 2.78 |
| PR-4 | None | P2-1 | P3-1 | 0/50/30/10/10 | 11.3 | 2.05 |
| PR-5 | None | P2-2 | P3-3 | 0/70/25/0/5 | 6.6 | 1.30 |
| PR-6 | None | P2-4 | P3-5 | 0/45/30/23/2 | 5.4 | 1.85 |

TABLE 7
| Binder polymer | R¹ | R² | R³ | Molar ratio (a/b/c/d/e) | molecular weight (unit: 10,000) | Acid value (meq/g) |
|---|---|---|---|---|---|---|
| P-46 | P1-1/P1-2 (25/30) | None | P3-2 | 55/0/40/4/1 | 12.5 | 2.11 |
| P-47 | P1-5 | None | P3-1/P3-10 (15/15) | 65/0/30/0/5 | 7.6 | 1.47 |
| P-48 | P1-6 | P2-1/P2-4 (5/25) | P3-5 | 20/30/35/10/5 | 5.5 | 1.80 |
| P-49 | P1-3/P1-4 (5/35) | None | P3-6/P3-7 (20/15) | 40/0/35/14/11 | 6.1 | 1.88 |
| P-50 | P1-1/P1-5 (20/20) | P2-4 | P3-4 | 40/5/40/10/5 | 3.2 | 2.00 |
In Tables 6 and 7, to P1-1 to P1-6, P2-1 to P2-4 and P3-1 to P3-10 have the following structures, respectively.
P1-1
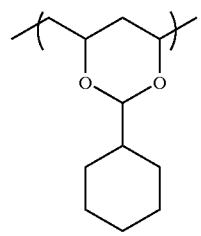
P1-2
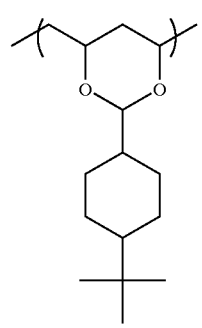
P1-3
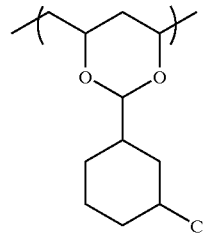
P1-4
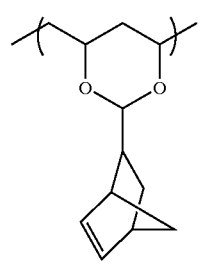
-continued
P1-5
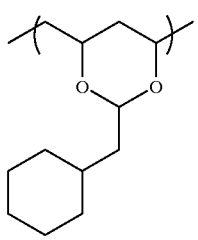
P1-6
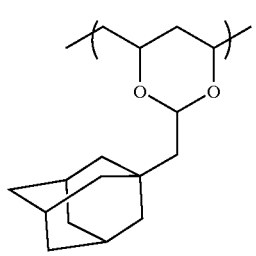
P2-1
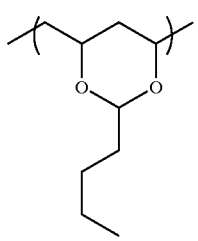
P2-2
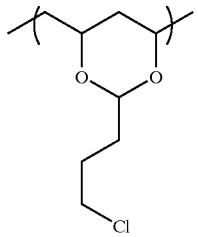

P2-3 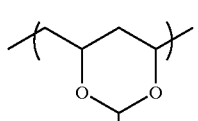

P2-4 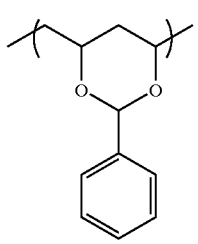

P3-1 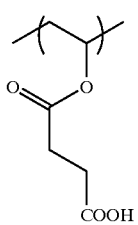

P3-2 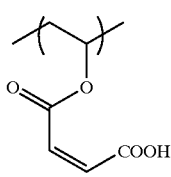

P3-3 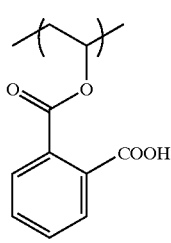

P3-4 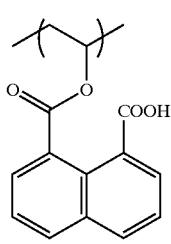

P3-5 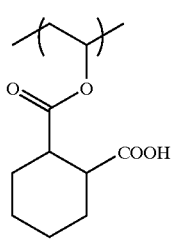

P3-6 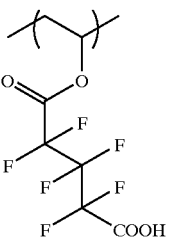

P3-7 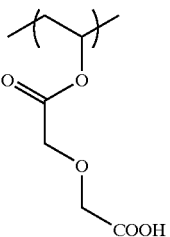

P3-8 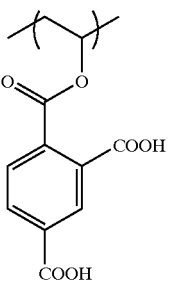

P3-9 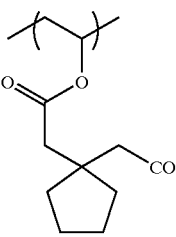

P3-10 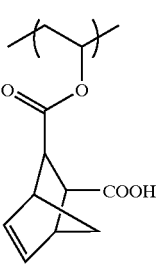

Examples 51 to 70, Comparative Examples 10 to 12

A negative-working photosensitive lithographic printing plate was prepared according to the following procedure. The negative-working photosensitive lithographic printing plate thus prepared was then evaluated for printing properties. The results are set forth in Table 8.

[Preparation of Support]

A JIS A 1050 aluminum plate having a thickness of 0.24 mm and a width of 1,030 mm was subjected to the following continuous processing.

(a) Using an existing mechanical roughening machine, the aluminum plate was subjected to mechanical roughening with a rotating roller nylon brush with an aqueous suspension of an abrasive (pumice) having a specific gravity of 1.12 supplied on the surface thereof as an abrasive slurry. The abrasive had an average particle diameter of from 40 to 45 μm and a maximum particle diameter of 200 μm. The nylon brush was made of 6.10 nylon and had a hair length of 50 mm and a hair diameter of 0.3 mm. The nylon brush was prepared by planting these nylon hairs in holes formed in a stainless steel cylinder having a diameter of 300 mm. Three such rotary brushes were used. The distance between two supporting rollers (φ200 mm) under these brushes was 300 mm. The brush rollers were pressed against the aluminum plate in such a manner that the load of the driving motor for rotating the brush was 7 kw plus that developed before the pressing of the brush roller against the aluminum plate. The direction of rotation of the brush was the same as that of movement of the aluminum plate. The rotary speed was 200 rpm.

(b) The aluminum plate was spray-etched with a solution having a caustic soda concentration of 2.6% by weight and an aluminum ion concentration of 6.5% by weight at a temperature of 70° C. so that it was dissolved at a rate of 0.3 g/m$^2$. The aluminum plate thus etched was then spray-washed with water.

(c) The aluminum plate was spray-desmutted with a 1 wt-% aqueous solution of nitric acid (aluminum ion content: 0.5% by weight) at a temperature of 30° C., and then spray-washed with water. As the aqueous solution of nitric acid for desmutting there was used a waste liquid from a step of electrochemical roughening in an aqueous solution of nitric acid with an alternating current.

(d) The aluminum plate was then subjected to continuous electrochemical roughening with an alternating voltage of 60 Hz. The electrolytic solution used herein was a 1 wt-% aqueous solution of nitric acid (aluminum ion content: 0.5% by weight; ammonium ion content: 0.007% by weight). The temperature of the electrolytic solution was 40° C. As the alternating power supply there was used a rectangular alternating current having a trapezoidal waveform, a time TF (required for current value to reach peak from zero) of 2 msec and a duty ratio of 1:1. Using a carbon electrode as a counter electrode, the aluminum plate was subjected to electrochemical roughening. As an auxiliary anode there was used ferrite. The current density was 30 A/dm$^2$ at its peak. The electrical quantity was 255 C/cm$^2$ in total when the aluminum plate was anodically processed. The auxiliary anode was supplied with current in an amount of 5% of that supplied from the electric supply. Thereafter, the aluminum plate was spray-washed.

(e) The aluminum plate was spray-etched with a solution having a caustic soda concentration of 25% by weight and an aluminum ion concentration of 6.5.% by weight at a temperature of 32° C. so that it was dissolved at a rate of 0.2 g/m$^2$. In this manner, smut component mainly composed of aluminum hydroxide produced when the aluminum plate was subjected to electrochemical roughening with an alternating current in the prestage processing was removed. Further, the edge portion on pit produced in the prestage processing was dissolved to smoothen the edge portion. Thereafter, the aluminum plate was spray-washed with water.

(f) The aluminum plate was spray-desmutted with a 25 wt-% aqueous solution of nitric acid (aluminum ion content: 0.5% by weight) at a temperature of 60° C., and then spray-washed with water.

(g) Using an existing anodizing apparatus employing a two-stage power supply electrolysis process (length of the first and second electrolysis zones: 6 m; length of the first power supply zone: 3 m; length of the second power supply zone: 3 m; length of the first and second power supply electrodes: 2.4 m), the aluminum plate was subjected to anodic oxidation with the sulfuric acid concentration in the electrolysis zone predetermined to 170 g/l (aluminum ion content: 0.5% by weight) at a temperature of 38° C. The aluminum plate was then spray-washed with water. At this time, in the anodizing apparatus, the current from the power supply flew into the first power supply electrode provided in the first power supply zone, flow into the plate-like aluminum through the electrolytic solution to form an oxide film on the plate-like aluminum in the first electrolysis zone, and then flew back to the power supply through the electrolysis electrode provided in the first power supply zone. On the other hand, the current from the power supply flew into the second power supply electrode provided in the second power supply zone, and then flew into the plate-like aluminum through the electrolytic solution to form an oxide film on the surface of the plate-like aluminum in the second electrolysis zone. The quantity of electricity supplied from the power supply into the first power supply zone is equal to the quantity of electricity supplied from the power supply into the second power supply zone. The density of electric current supplied into the oxide film in the second supply zone was about 25 A/dm$^2$. In the second power supply zone, electricity was supplied from the surface of oxide film of 1.35 g/m$^2$. The amount of final oxide film was 2.7 g/m$^2$. The aluminum support thus prepared is designated as [AS-5].

[Hydrophilic Treatment]

The aluminum support [AS-5] was then treated with silicate to enhance the hydrophilicity of the non-image area on the printing plate. The silicate treatment was carried out by passing the aluminum web through a 1.5% aqueous solution of No. 3 sodium silicate which had been kept at a temperature of 70° C. in such a manner that it was brought into contact with the aqueous solution for 15 seconds, and then washing the web with water. The attached amount of Si was 10 mg/m$^2$. The substrate thus processed is designated as [AS-6].

[Coating of Interlayer]

An SG process liquid composition (sol) was prepared according to the following procedure. The following compositions were measured out in a beaker, and then stirred at a temperature of 250° C. for 20 minutes.

| | |
|---|---|
| Tetraethoxysilane | 38 g |
| 3-Methacryloxypropyl trimethoxysilane | 13 g |
| 85% Aqueous solution of phosphoric acid | 12 g |
| Ion-exchanged water | 15 g |
| Methanol | 100 g |

The solution thus prepared was transferred into a three-necked flask which was then equipped with a reflux condenser. The three-necked flask was then dipped in a room temperature oil bath. The content in the three-necked flask was then heated to a temperature of 50° C. with stirring by a magnetic stirrer in 30 minutes. While the bath temperature was being kept at 50° C., the reaction mixture was then reacted for 1 hour to obtain a liquid composition (sol). This sol was diluted with a 20/1 (by weight) mixture of methanol and ethylene glycol to a concentration of 0.5% by weight, wheeler-coated onto the aluminum substrate [As-5], and then dried at a temperature of 100° C. for 1 minute. The coated amount of the sol was 3.5 mg/m$^2$. For the determination of the coated amount of the sol, the amount of Si element was determined by fluorescent X-ray analysis. The support thus prepared is designated as [AS-7].

Subsequently, a solution having the following formulation was applied to the aluminum support [As-6] by means of a wire bar, and then dried at a temperature of 90° C. for 30 seconds in a hot air drier. The dried amount of coat was 10 mg/m².

| | |
|---|---|
| 75:15 (molar ratio) copolymer of ethyl methacrylate and sodium 2-acrylamide-2-methyl-1-propanesulfonate | 0.1 g |
| 2-Aminoethylphosphonic acid | 0.1 g |
| Methanol | 50 g |
| Ion-exchanged water | 50 g |

The support thus prepared is designated as [AS-8].

Subsequently, a solution having the following formulation was applied to the aluminum support [AS-5] by means of a wire bar, and then dried at a temperature of 100° C. for 30 seconds in a hot air drier. The dried amount of coat was 30 mg/m².

| | |
|---|---|
| Crosslinkable quaternary ammonium salt polymer represented by the following formula (AA) general formula | 0.75 g |
| Methanol | 200 g |

The support thus prepared is designated as [AS-9].

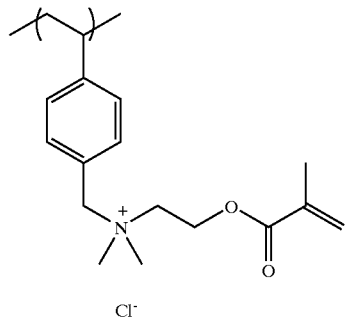

(AA)

[Coating of Photosensitive Layer]

A negative-working photosensitive composition having the following formulation was applied to the aluminum plate thus processed in an amount set forth in Table 8, and then dried at a temperature of 100° C. for 1 minute to form a photosensitive layer.

| (Negative-working photosensitive composition) | |
|---|---|
| Addition-polymerizable compound (compound set forth in Table 8) | 1.5 g |
| Binder polymer (compound set forth in Table 8) | 2.0 g |
| Sensitized dye (compound set forth in Table 8) | 0.2 g |
| Photopolymerization initiator (compound set forth in Table 8) | 0.4 g |
| Co-sensitized dye (compound set forth in Table 8) | 0.4 g |

| -continued | |
|---|---|
| Fluorine-based nonionic surface active agent (Megafac F-177, produced by DAINIPPON INK & CHEMICALS, INC.) | 0.03 g |
| Heat polymerization inhibitor (N-nitrosophenylhydroxylamine aluminum salt) | 0.01 g |
| Colored pigment dispersion having the following formulation | 2.0 g |
| Methyl ethyl ketone | 20.0 g |
| Propylene glycol monomethyl ether | 20.0 g |
| (Colored pigment dispersion) | |
| Pigment blue 15:6 | 15 parts by weight |
| Acryl methacrylate/methacrylic acid copolymer (copolymerization molar ratio: 80/20; weight-average molecular weight: 40,000) | 10 parts by weight |
| Cyclohexanone | 15 parts by weight |
| Methoxypropyl acetate | 20 parts by weight |
| Propylene glycol monomethyl ether | 40 parts by weight |

[Coating of Protective Layer]

A 3 wt-% aqueous solution of a polyvinyl alcohol (saponification degree: 98 mol-%; polymerization degree: 550) was applied to the photosensitive layer in a dry coated amount of 2 g/m², and then dried at a temperature of 100° C. for 2minutes.

[Exposure of Negative-working Photosensitive Lithographic Printing Plate]

Using a Type FD-YAG (532 nm) laser exposing machine (plate setter produced by Heidelberg Inc.; Gutenberg), the negative-working photosensitive lithographic printing plate thus obtained was subjected to exposure to solid image and dot images having 2,540 dpi and 175 lines per inch with 1% to 99% dot density with the exposure power adjusted such that the exposure energy density on the surface of plate reached 200 µJ/cm².

[Development/plate Making]

A-Type FLP-813 automatic developing machine produced by Fuji Photo Film Co., Ltd. was loaded with the developer set forth in Table 8 and a Type FP-2w finisher produced by Fuji Photo Film Co., Ltd. Using this automatic developing machine, the exposed plate was subjected to development/plate making at a developer temperature of 30° C. for a development time of 18 seconds to obtain a lithographic printing plate.

[Image Area Printing Durability Test]

As a printing machine there was used a Type R201 printing machine produced by Roland Corporation. As an ink there was used Graph G(N) produced by DAINIPPON INK & CHEMICALS, INC. The printed matter was then observed at the solid image area. The number of the sheet which began to show blurred image was then counted to examine the image area printing durability. The greater the number is, the better is printing durability.

[Forced Test on Dot Area Printing Durability]

As a printing machine there was used a Type R201 printing machine produced by Roland Corporation. As an irk there was used Graph G(N) produced by DAINIPPON INK & CHEMICALS, INC. When 5,000 sheets were printed, the printing plate was then wiped off at the dot area with a printing sponge wet with a Type CL-2 plate cleaner produced by Fuji Photo Film Co., Ltd. to remove the ink from the surface of the plate. Thereafter, 10,000 sheets were printed. The printed matter was then visually observed to see if dots were lost on the plate.

Examples 71 to 80; Comparative Examples 13 to 15

Negative-working photosensitive lithographic printing plates set forth in Table 9 were prepared in the same manner as in Examples 51 to 70. These negative-working photosensitive lithographic printing plates were then evaluated for properties.

The various compounds set forth in Tables 8, 9 and 10 will be further described hereinafter.

[Addition-polymerizable Compounds]

M-1: Pentaerythritol tetraacrylate (NK71 ester A-TMMT, produced by Shinnakamura Chemical Co., Ltd.)
M-2: Glycerin dimethacrylate hexamethylene diisocyanate urethane polymer (US101H, produced by Kyoeisha Chemical Co., Ltd.)
M-3: Dipentaerythritol acrylate (NK ester A-9530, produced by Shinnakamura Chemical Co., Ltd.)

[Photopolymerization Initiator Material]

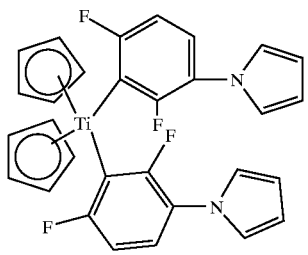
I-1

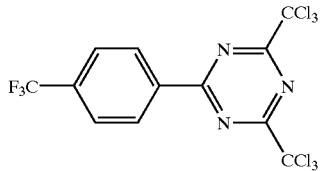
I-2

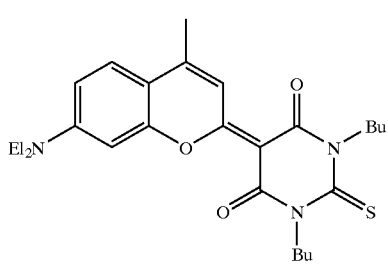
S-1

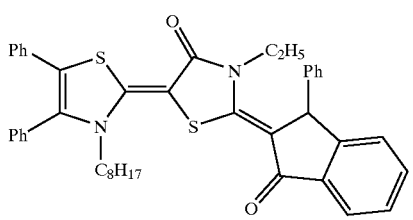
S-2

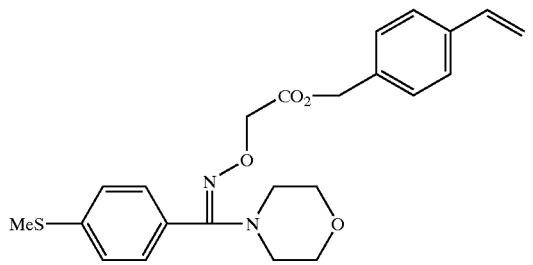
C-1

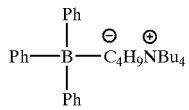
C-2

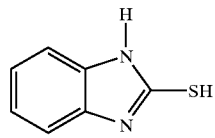
C-3

[Binder Polymer]
PA-1
Methacrylic acid allyl/methacrylic acid copolymer (copolymerization molar ratio: 80/20)
Acid value measured by titration with NaOH: 1.70 meq/g
Weight-average molecular weight determined by GPC process: 48,000
PA-2
Methacrylic Acid methyl/acrylonitrile/N-((4-sulfamoyl)phenyl] methacrylamide copolymer (copolymerization molar ratio: 37/30/33)

Weight-average molecular weight determined by GPC process: 49,000
PA-3
Polyurethane resin as a polycondensate of the following diisocyanate with the following diol
4,4'-Diphenylmethane diisocyanate (MDI)
Hexamethylene diisocyanate (HMDI)
Polypropylene glycol (weight-average molecular weight: 1,000 (PPG10000)
2,2-Bis(hydroxymethyl)propionic acid (DMPA)
Copolymerization molar ratio (MDI/HMDI/PPG1000/DMPA): 40/10/15/35
Acid value measured by titration with NaOH: 1.05 meq/g
Weight-average molecular weight determined by GPC process: 45,000

[Developer]
D-1
Aqueous solution with pH 10 having the following formulation

| | |
|---|---|
| Monoethanolamine | 0.1 parts by weight |
| Triethanolamine | 1.5 parts by weight |
| Compound of the following general formula (1) | 4.0 parts by weight |
| Compound of the following general formula (2) | 2.5 parts by weight |

-continued

| | |
|---|---|
| Compound of the following general formula (3) | 0.2 parts by weight |
| Water | 91.7 parts by weight |

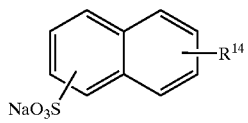 (1)

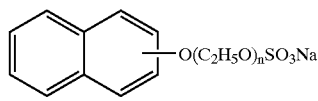 (2)

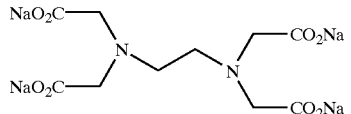 (3)

wherein $R^{14}$ represents a hydrogen atom or butyl group.

D-2

Aqueous solution having the following formulation

| | |
|---|---|
| 1K potassium silicate | 3.0 parts by weight |
| Potassium hydroxide | 1.5 parts by weight |
| Compound of the general formula (3) | 0.2 parts by weight |
| Water | 95.3 parts by weight |

TABLE 8

| | | Photosensitive layer | | | | | | | Printing durability | |
|---|---|---|---|---|---|---|---|---|---|---|
| Example No. | Support | Addition-polymer-izable compound | Binder polymer | Heat polymeriza-tion initiator | Sensitized dye | Co-sensi-tizer | Dry coated amount (g/m$^2$) | Developer | Image area (unit: 10,000 sheets) | Dot area |
| Example 51 | AS-7 | M-1 | P-31 | I-1 | S-1 | C-1 | 1.2 | D-2 | 27 | Extremely good |
| Example 52 | AS-5 | M-1 | P-32 | I-1 | S-2 | C-1 | 1.3 | D-2 | 24 | Good |
| Example 53 | AS-9 | M-2 | P-33 | I-2 | S-1 | C-3 | 1.4 | D-2 | 31 | Extremely good |
| Example 54 | AS-6 | M-3 | P-34 | I-1 | S-2 | C-1 | 1.4 | D-1 | 35 | Good |
| Example 55 | AS-7 | M-2 | P-35 | I-1 | S-2 | C-2 | 1.3 | D-2 | 35 | Good |
| Example 56 | AS-8 | M-3 | P-36 | I-2 | S-1 | C-3 | 1.6 | D-2 | 24 | Extremely good |
| Example 57 | AS-7 | M-1 | P-37 | I-1 | S-1 | C-2 | 1.2 | D-2 | 23 | Good |
| Example 58 | AS-7 | M-1 | P-38 | I-2 | S-2 | C-1 | 1.4 | D-2 | 42 | Extremely good |
| Example 59 | AS-5 | M-2 | P-39 | I-2 | S-1 | C-1 | 1.5 | D-2 | 31 | Extremely good |
| Example 60 | AS-9 | M-1 | P-40 | I-2 | S-2 | C-2 | 1.5 | D-1 | 39 | Extremely good |
| Example 61 | AS-7 | M-2 | P-41 | I-1 | S-2 | C-1 | 1.4 | D-2 | 25 | Good |
| Example 62 | AS-6 | M-2 | P-42 | I-1 | S-2 | C-1 | 1.3 | D-2 | 24 | Extremely good |
| Example 63 | AS-5 | M-3 | P-43 | I-2 | S-1 | C-1 | 1.4 | D-2 | 30 | Extremely good |
| Example 64 | AS-7 | M-3 | P-44 | I-1 | S-2 | C-3 | 1.7 | D-1 | 26 | Extremely good |
| Example 65 | AS-7 | M-1 | P-45 | I-2 | S-1 | C-1 | 1.4 | D-2 | 27 | Good |
| Example 66 | AS-8 | M-2 | P-46 | I-1 | S-2 | C-1 | 1.3 | D-1 | 24 | Extremely good |
| Example 67 | AS-5 | M-3 | P-47 | I-2 | S-1 | C-1 | 1.5 | D-2 | 25 | Good |
| Example 68 | AS-7 | M-3 | P-48 | I-1 | S-2 | C-3 | 1.7 | D-1 | 38 | Extremely good |
| Example 69 | AS-5 | M-3 | P-49 | I-1 | S-2 | C-3 | 1.5 | D-1 | 30 | Good |
| Example 70 | AS-9 | M-1 | P-50 | I-2 | S-1 | C-1 | 1.4 | D-2 | 27 | Good |
| Comparative Example 10 | AS-7 | M-1 | PR-4 | I-1 | S-1 | C-1 | 1.4 | D-2 | 5 | Extremely good |
| Comparative Example 11 | AS-7 | M-3 | PR-5 | I-2 | S-2 | C-1 | 1.4 | D-2 | 14 | Dots lost |
| Comparative Example 12 | AS-5 | M-2 | PR-6 | I-1 | S-1 | C-2 | 1.4 | D-2 | 4 | Dots lost |

TABLE 9

| | | Photosensitive layer | | | | | | | | Printing durability | |
| --- | --- | --- | --- | --- | --- | --- | --- | --- | --- | --- | --- |
| | | Addition-polymerizable | Binder polymer | | Weight ratio | Heat polymerization | Sensitized | Co-sensi- | Dry coated amount | Devel- | Image area (unit: 10,000 | |
| Example No. | Support | compound | 1 | 2 | (1:2) | initiator | dye | tizer | (g/m$^2$) | oper | sheets) | Dot area |
| Example 71 | AS-5 | M-1 | P-31 | P-36 | 5/5 | I-1 | S-2 | C-1 | 1.4 | D-2 | 30 | Good |
| Example 72 | AS-7 | M-3 | P-33 | P-39 | 6/4 | I-1 | S-1 | C-1 | 1.2 | D-2 | 28 | Good |
| Example 73 | AS-7 | M-2 | P-34 | P-40 | 7/3 | I-2 | S-1 | C-2 | 1.2 | D-2 | 34 | Good |
| Example 74 | AS-6 | M-2 | P-39 | P-48 | 8/2 | I-1 | S-2 | C-1 | 1.4 | D-1 | 33 | Good |
| Example 75 | AS-7 | M-1 | P-40 | P-41 | 9/1 | I-2 | S-2 | C-3 | 1.4 | D-1 | 21 | Extremely good |
| Example 76 | AS-7 | M-1 | P-47 | P-50 | 3/7 | I-2 | S-1 | C-1 | 1.6 | D-2 | 24 | Extremely good |
| Example 77 | AS-5 | M-2 | P-31 | PA-1 | 8/2 | I-1 | S-1 | C-1 | 1.4 | D-2 | 21 | Extremely good |
| Example 78 | AS-8 | M-3 | P-31 | PA-2 | 5/5 | I-1 | S-1 | C-1 | 1.4 | D-1 | 23 | Extremely good |
| Example 79 | AS-7 | M-2 | P-36 | PA-3 | 7/3 | I-2 | S-2 | C-3 | 1.7 | D-1 | 22 | Extremely good |
| Example 80 | AS-9 | M-1 | P-48 | PR-6 | 7/3 | I-2 | S-2 | C-1 | 1.2 | D-1 | 27 | Good |
| Comparative Example 13 | AS-7 | M-2 | PR-4 | PA-3 | 5/5 | I-2 | S-2 | C-1 | 1.3 | D-2 | 9 | Dots lost |
| Comparative Example 14 | AS-6 | M-2 | PR-5 | PA-2 | 8/2 | I-1 | S-1 | C-1 | 1.5 | D-1 | 7 | Dots lost |
| Comparative Example 15 | AS-9 | M-3 | PR-6 | PA-1 | 9/1 | I-1 | S-1 | C-3 | 1.5 | D-2 | 31 | Good |

Examples 81 to 100; Comparative Examples 16 to 18

[Coating of Photosensitive Layer]

The following photosensitive layer coating solution was prepared, applied to the aluminum support by means of a wire bar in a dry coated amount set forth in Table 10, and then dried at a temperature of 115° C. in a hot air dryer for 45 seconds to form a photosensitive layer thereon.

Photosensitive Layer Coating Solution

| | |
| --- | --- |
| Addition-polymerizable compound (compound set forth in Table 10) | 1.0 g |
| Binder polymer (compound set forth in Table 10) | 1.0 g |
| Infrared absorber (IR-1) | 0.08 g |
| Heat polymerization initiator (compound set forth in Table 10) | 0.3 g |
| fluorine-based nonionic surface active agent (Megafac F-177, produced by DAINIPPON INK & CHEMICALS, INC.) | 0.01 g |
| Naphthalenesulfonate of victoria pure blue | 0.04 g |
| Methyl ethyl ketone | 9.0 g |
| Propylene glycol monomethyl ether | 8.0 g |
| Methanol | 10.0 g |

[Coating of Protective Layer]

A 3 wt-% aqueous solution of a polyvinyl alcohol (saponification degree: 98 mol-%; polymerization degree: 550) was applied to the photosensitive layer in a dry coated amount of 2 g/m$^2$, and then dried at a temperature of 100° C. for 2 minutes as necessary.

[Exposure of Negative-working Photosensitive Lithographic Printing Plate]

The negative-working photosensitive lithographic printing plate thus obtained was then exposed under the conditions of output of 9W, external drum rotary speed of 210 rpm, plate surface energy of 100 mJ/cm$^2$ and resolution of 2,400 dpi using a Type Trendsetter 3244VFS (produced by Creo Co., Ltd.) equipped with a water-cooled 40W infrared semiconductor laser.

[Development/plate Making]

The printing plate thus exposed was then subjected to development/plate making at a temperature of 30° C. using a Type Stablon 900N automatic developing machine produced by Fuji Photo Film Co., Ltd. loaded with the developer set forth in Table 10 and a 1:1 water-diluted solution of a Type FN-6 finisher produced by Fuji Photo Film Co., Ltd. to obtain a lithographic printing plate.

[Image Area Printing Durability Test]

As a printing machine there was used Lithron produced by Komori Corporation. As an ink there was used Graph G(N) produced by DAINIPPON INK & CHEMICALS, INC. The printed matter was then observed at the solid image area. The number of the sheet which began to show blurred image was then counted to examine the image area printing durability. The greater the number is, the better is printing durability.

[Forced Zest on Dot Area Printing Durability]

As a printing machine there was used Lithron produced by Komori Corporation. As an ink there was used Graph G(N) produced by DAINIPPON INK & CHEMICALS, INC. When 5,000 sheets were printed, the printing plate was then wiped off at the dot area with a printing sponge wet with a Type CL-2 plate cleaner produced by Fuji Photo Film Co., Ltd. to remove the ink from the surface of the plate. Thereafter, 10,000 sheets were printed. The printed matter was then visually observed to see if dots were lost on the plate.

TABLE 10

| Example No. | Support | Photosensitive layer Addition-polymerizable compound | Binder polymer 1 | Binder polymer 2 | Weight ratio (1:2) | Heat polymerization initiator | Dry coated amount (g/m²) | Protective layer | Developer | Printing durability Image area (unit: 10,000 sheets) | Dot area |
|---|---|---|---|---|---|---|---|---|---|---|---|
| Example 81 | AS-8 | M-3 | P-31 | None | — | OI-1 | 1.4 | None | D-3 | 38 | Extremely good |
| Example 82 | AS-9 | M-3 | P-32 | None | — | OI-1 | 1.2 | Provided | D-3 | 40 | Good |
| Example 83 | AS-5 | M-2 | P-33 | None | — | OI-2 | 1.2 | None | D-1 | 25 | Good |
| Example 84 | AS-8 | M-1 | P-35 | None | — | OI-1 | 1.2 | Provided | D-1 | 33 | Extremely good |
| Example 85 | AS-6 | M-3 | P-36 | None | — | OI-2 | 1.3 | None | D-3 | 21 | Extremely good |
| Example 86 | AS-8 | M-3 | P-37 | None | — | OI-3 | 1.1 | None | D-3 | 28 | Extremely good |
| Example 87 | AS-7 | M-2 | P-39 | None | — | OI-1 | 1.3 | Provided | D-3 | 32 | Extremely good |
| Example 88 | AS-7 | M-2 | P-40 | None | — | OI-1 | 1.3 | None | D-2 | 23 | Extremely good |
| Example 89 | AS-8 | M-1 | P-41 | None | — | OI-2 | 1.3 | None | D-2 | 38 | Extremely good |
| Example 90 | AS-9 | M-1 | P-43 | None | — | OI-2 | 1.5 | Provided | D-1 | 27 | Good |
| Example 91 | AS-7 | M-3 | P-46 | None | — | OI-3 | 1.2 | provided | D-3 | 30 | Good |
| Example 92 | AS-5 | M-3 | P-48 | None | — | OI-1 | 1.3 | None | D-3 | 24 | Good |
| Example 93 | AS-8 | M-3 | P-50 | None | — | OI-2 | 1.4 | None | D-2 | 34 | Good |
| Example 94 | AS-8 | M-2 | P-31 | P-36 | 8/2 | OI-1 | 1.2 | Provided | D-3 | 33 | Good |
| Example 95 | AS-6 | M-1 | P-35 | P-46 | 9/1 | OI-3 | 1.2 | None | D-1 | 21 | Extremely good |
| Example 96 | AS-8 | M-3 | P-47 | P-50 | 8/2 | OI-2 | 1.3 | None | D-2 | 24 | Extremely good |
| Example 97 | AS-8 | M-2 | P-31 | PR-4 | 8/2 | OI-2 | 1.3 | None | D-1 | 36 | Extremely good |
| Example 98 | AS-7 | M-3 | P-31 | PA-1 | 5/5 | OI-1 | 1.4 | Provided | D-1 | 23 | Extremely good |
| Example 99 | AS-7 | M-2 | P-32 | PA-2 | 7/3 | OI-1 | 1.1 | None | D-3 | 22 | Extremely good |
| Example 100 | AS-5 | M-3 | P-35 | PR-6 | 7/3 | OI-2 | 1.3 | None | D-2 | 27 | Good |
| Comparative Example 16 | AS-7 | M-3 | PR-4 | None | — | OI-1 | 1.3 | None | D-1 | 3 | Dots lost |
| Comparative Example 17 | AS-8 | M-2 | PR-5 | None | — | OI-1 | 1.2 | None | D-3 | 5 | Good |
| Comparative Example 18 | AS-9 | M-3 | PR-6 | PA-1 | 9/1 | OI-3 | 1.2 | Provided | D-2 | 10 | Dots lost |

[Heat Polymerization Initiator in Table 10]

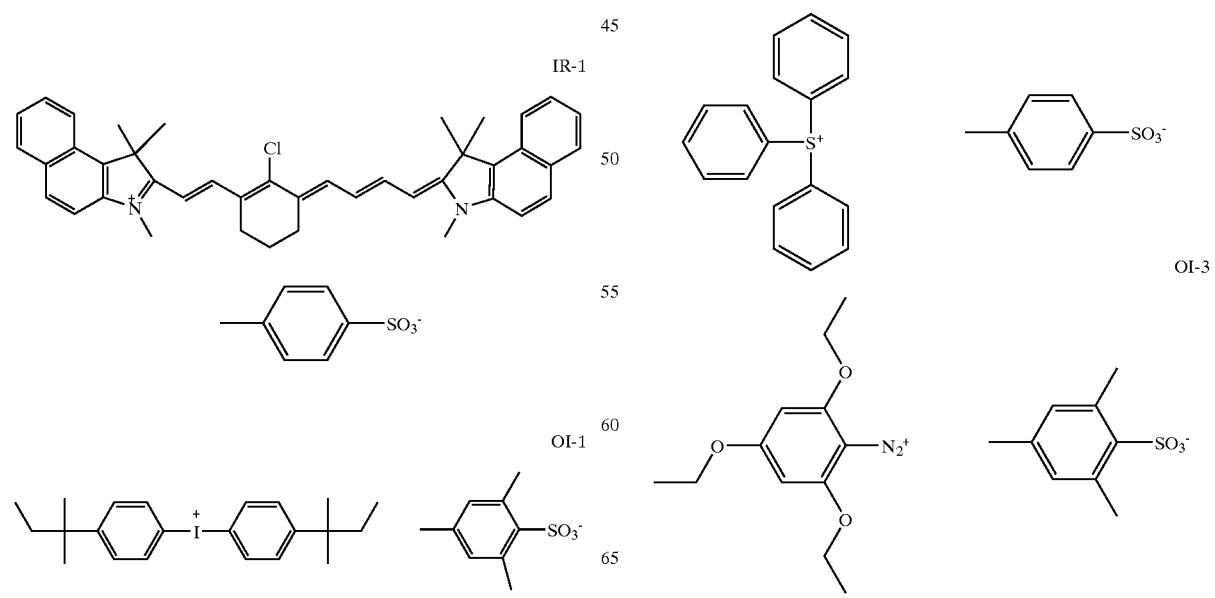

[Developer in Table 10]
D-3

| Monohydrate of sodium carbonate | 10 g |
|---|---|
| Potassium hydrogencarbonate | 10 g |
| Sodium isopropylnaphthalenesulfonate | 15 g |
| Sodium dibutylnapthalanesulfonate | 15 g |
| Sodium salt of ethylene glycol mononaphthylether monosulfate | 10 g |
| Sodium sulfite | 1 g |
| Tetrasodium ethylenediamineteteraacetate | 0.1 g |
| Ion-exchanged water | 938.9 g |

As can be seen in Tables 8 to 10, the photosensitive lithographic printing plates according to the invention comprising a photosensitive layer containing a polyvinyl alcohol resin binder modified with an acetal skeleton having an alicyclic structure provided printing plates having an extremely good printing durability.

The photosensitive lithographic printing plate of the invention comprises a photosensitive layer containing a polyvinyl alcohol resin binder modified with an acetal skeleton having an alicyclic structure, making it possible to provide a lithographic printing plate having an extremely good printing durability. The photosensitive lithographic printing plate of the invention is suitable for scanning exposure by laser beam and thus can perform high speed writing and is provided with a high productivity.

The entire disclosure of each and every foreign patent application from which the benefit of foreign priority has been claimed in the present application is incorporated herein by reference, as if fully set forth herein.

What is claimed is:

1. A photosensitive lithographic printing plate comprising:
    a support; and
    a photosensitive layer,
    wherein the photosensitive layer comprises a polyvinyl alcohol resin binder modified with an acetal skeleton comprising an aliphatic cyclic structure.

2. The photosensitive lithographic printing plate according to claim 1, wherein the polyvinyl alcohol resin binder comprises an acid radical.

3. The photosensitive lithographic printing plate according to claim 1, wherein the photosensitive layer further comprises:
    one of a photo-polymerization initiator and a heat-polymerization initiator; and
    a compound having at least one ethylenically unsaturated bond capable of addition polymerization.

4. The photosensitive lithographic printing plate according to claim 2, wherein the photosensitive layer further comprises:
    one of a photo-polymerization initiator and a heat-polymerization initiator; and
    a compound having at least one ethylenically unsaturated bond capable of addition polymerization.

5. The photosensitive lithographic printing plate according to claim 3, wherein the photosensitive layer comprises the compound having at least one ethylenically unsaturated bond in an amount of 5 to 80% by weight based on the total amount of non-volatile components comprised in the photosensitive layer.

6. The photosensitive lithographic printing plate according to claim 3, wherein the photo-polymerization initiator comprises a titanocene compound.

7. The photosensitive lithographic printing plate according to claim 1, which further comprises an IR absorbing agent comprising one of a dye and a pigment both having an absorption maximum in the range of from 760 to 1200 mm.

8. The photosensitive lithographic printing plate according to claim 1, wherein the polyvinyl alcohol resin binder comprises a constituent unit represented by the following formula (II):

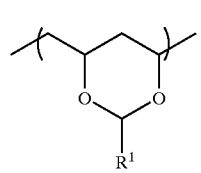

(II)

wherein $R^1$ represents a monovalent hydrocarbon group, having from 3 to 30 carbon atoms, which comprises an aliphatic cyclic structure optionally having at least one substituent.

9. The photosensitive lithographic printing plate according to claim 1, wherein the polyvinyl alcohol resin binder comprises a constituent unit represented by the following formula (III):

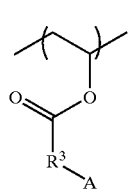

(III)

wherein $R^3$ represents a divalent hydrocarbon group having from 1 to 30 carbon atoms and optionally having at least one substituent, and A represents an acid radical.

10. The photosensitive lithographic printing plate according to claim 3, wherein A represents an acid radical having an acid dissociation constant of not greater than 7.

11. The photosensitive lithographic printing plate according to claim 1, wherein the polyvinyl alcohol resin binder comprises a constituent unit represented by the following formula (IV):

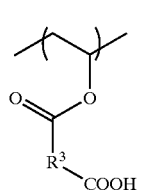

(IV)

wherein $R^3$ represents a divalent hydrocarbon group having from 1 to 30 carbon atoms and optionally having at least one substituent.

12. The photosensitive lithographic printing plate according to claim 1, wherein a molecular weight of the polyvinyl alcohol resin binder is from 2,000 to 1,000,000.

13. A photosensitive lithographic printing plate comprising:
    a support; and
    a photosensitive layer,
    wherein the photosensitive layer comprises a polyurethane resin binder which is a polyurethane resin obtained by a reaction of a compound comprising an aliphatic cyclic structure and two groups selected from carboxyl, hydroxyl and —NHR$^1$ groups, wherein R$^1$ represents one of a hydrogen atom and a substituted or unsubstituted monovalent hydrocarbon group having 1 to 20 carbon atoms, the compound being represented by the following formula (I) with a diisocyanate compound:

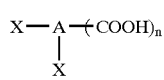
(I)

wherein A represents a (n+2) valent hydrocarbon group having 3 to 80 carbon atoms, the (n+2) valent hydrocarbon group having a substituted or unsubstituted aliphatic cyclic structure; each of X's represents independently one of a hydroxyl group and —NHR$^1$ wherein R$^1$ represents one of a hydrogen atom and a substituted or unsubstituted monovalent hydrocarbon group having 1 to 20 carbon atoms; and n represents an integer from 1 to 5.

14. The photosensitive lithographic printing plate according to claim 13, wherein the carboxyl group is directly attached to the aliphatic cyclic structure.

15. The photosensitive lithographic printing plate according to claim 13, wherein both of X's in the formula (I) represents a hydroxyl group.

16. The photosensitive lithographic printing plate according to claim 13, wherein n in the formula (I) represents 1.

17. The photosensitive lithographic printing plate according to claim 13, wherein A in formula (I) is a 5- to 8-membered monocyclic aliphatic hydrocarbon group, a condensed polycyclic aliphatic hydrocarbon group comprising up to 4 rings, a spiroaliphatic hydrocarbon group or an ensemble of aliphatic hydrocarbon rings.

18. The photosensitive lithographic printing plate according to claim 13, wherein the photosensitive layer further comprises:

a photo-polymerization initiator; and a compound having at least one ethylenically unsaturated bond capable of addition polymerization.

19. The photosensitive lithographic printing plate according to claim 18, wherein the photo-polymerization initiator comprises a titanocene compound.

20. The photosensitive lithographic printing plate according to claim 13, which further comprises an IR absorbing agent comprising one of a dye and a pigment both having an absorption maximum in the range of from 760 to 1200 mm.

21. The photosensitive lithographic printing plate according to claim 20, wherein the IR absorbing agent is a cyanine dye represented by the following formula (VIII):

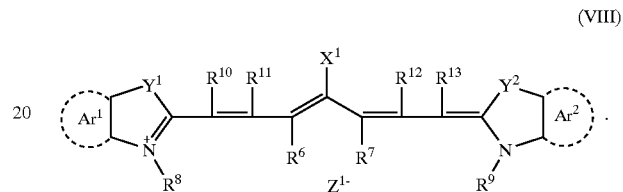
(VIII)

22. The photosensitive lithographic printing plate according to claim 20, wherein the photosensitive layer further comprises:

a heat-polymerization initiator; and a compound having at least one ethylenically unsaturated bond capable of addition polymerization.

23. The photosensitive lithographic printing plate according to claim 12, wherein the heat-polymerization initiator is onium salts selected from the group consisting of iodonium salts, diazonium salts and sulfonium salts.

* * * * *